United States Patent
Azuma et al.

(10) Patent No.: US 9,087,581 B2
(45) Date of Patent: Jul. 21, 2015

(54) CROSS POINT VARIABLE RESISTANCE NONVOLATILE MEMORY DEVICE AND METHOD OF WRITING THEREBY

(75) Inventors: Ryotaro Azuma, Osaka (JP); Kazuhiko Shimakawa, Osaka (JP); Yoshikazu Katoh, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 280 days.

(21) Appl. No.: 13/883,785

(22) PCT Filed: Sep. 6, 2012

(86) PCT No.: PCT/JP2012/005644
§ 371 (c)(1),
(2), (4) Date: May 7, 2013

(87) PCT Pub. No.: WO2013/035327
PCT Pub. Date: Mar. 14, 2013

(65) Prior Publication Data
US 2013/0223133 A1 Aug. 29, 2013

(30) Foreign Application Priority Data

Sep. 9, 2011 (JP) ................. 2011-197658
Sep. 9, 2011 (JP) ................. 2011-197659

(51) Int. Cl.
*G11C 11/00* (2006.01)
*G11C 13/00* (2006.01)
*G11C 11/56* (2006.01)

(52) U.S. Cl.
CPC ........ *G11C 13/0069* (2013.01); *G11C 11/5685* (2013.01); *G11C 13/0007* (2013.01); *G11C 13/0023* (2013.01); *G11C 2013/0073* (2013.01); *G11C 2013/0088* (2013.01)

(58) Field of Classification Search
CPC ...................................................... G11C 11/00
USPC ............. 365/46, 94, 100, 129, 148, 158, 163; 257/2–5, 9, 295, 310, E21.35; 438/2–5, 438/9, 295, 310, E21.35
See application file for complete search history.

(56) References Cited

U.S. PATENT DOCUMENTS 6,768,689 B2   7/2004  Origasa
6,972,985 B2  12/2005  Rinerson et al.
(Continued)

FOREIGN PATENT DOCUMENTS

CN      1467747    1/2004
CN    101548336    9/2009
(Continued)

OTHER PUBLICATIONS

International Search Report issued Oct. 2, 2012 in International (PCT) Application No. PCT/JP2012/005644.
(Continued)

*Primary Examiner* — Harry W Byrne
(74) *Attorney, Agent, or Firm* — Wenderoth, Lind & Ponack, L.L.P.

(57) ABSTRACT

A cross point variable nonvolatile memory device includes a memory cell array including: first memory cells (e.g., part of a memory cell array) having a common word line; and second memory cells (e.g., another part of the memory cell array or a compensation cell unit). When a predetermined memory cell among the first memory cells is written to by changing the predetermined memory cell to a first resistance state, a word line write circuit supplies a first voltage or a first current to a selected word line, a first bit line write circuit supplies a third voltage or a third current to one bit line of the first memory cells, and a second bit line write circuit supplies the third voltage or the third current to A bit line or lines of the second memory cells.

36 Claims, 39 Drawing Sheets

(56) References Cited

U.S. PATENT DOCUMENTS

| | | |
|---|---|---|
| 7,787,312 B2 | 8/2010 | Kawamata et al. |
| 7,920,408 B2 | 4/2011 | Azuma et al. |
| 7,990,754 B2 | 8/2011 | Azuma et al. |
| 8,040,709 B2 | 10/2011 | Maejima |
| 8,102,716 B2 | 1/2012 | Shiimoto et al. |
| 8,154,909 B2 | 4/2012 | Azuma et al. |
| 8,385,104 B2 | 2/2013 | Maejima |
| 8,392,770 B2 | 3/2013 | Toda |
| 2003/0223277 A1 | 12/2003 | Origasa |
| 2005/0243595 A1 | 11/2005 | Rinerson et al. |
| 2007/0171727 A1 | 7/2007 | Choi |
| 2009/0010076 A1 | 1/2009 | Kawamata et al. |
| 2009/0052225 A1 | 2/2009 | Morimoto |
| 2010/0046273 A1 | 2/2010 | Azuma et al. |
| 2010/0103714 A1 | 4/2010 | Maejima |
| 2010/0172171 A1 | 7/2010 | Azuma et al. |
| 2010/0195370 A1 | 8/2010 | Shiimoto et al. |
| 2010/0235714 A1 | 9/2010 | Toda |
| 2010/0321982 A1* | 12/2010 | Takagi et al. ............... 365/148 |
| 2011/0066878 A1 | 3/2011 | Hosono et al. |
| 2011/0249486 A1 | 10/2011 | Azuma et al. |
| 2012/0008371 A1 | 1/2012 | Maejima |

FOREIGN PATENT DOCUMENTS

| | | |
|---|---|---|
| JP | 2003-157679 | 5/2003 |
| JP | 2006-203098 | 8/2006 |
| JP | 2006-323924 | 11/2006 |
| JP | 2007-193936 | 8/2007 |
| JP | 2007-536680 | 12/2007 |
| JP | 2008-306008 | 12/2008 |
| JP | 4252624 | 4/2009 |
| JP | 2009-157995 | 7/2009 |
| JP | 2010-102776 | 5/2010 |
| JP | 2010-182373 | 8/2010 |
| JP | 2010-218599 | 9/2010 |
| JP | 2011-086365 | 4/2011 |
| WO | 2005/117021 | 12/2005 |
| WO | 2008/149493 | 12/2008 |

OTHER PUBLICATIONS

Chinese Office Action issued Oct. 10, 2014 for the corresponding Chinese Patent Application No. 201280003594.0 (with English translation).

* cited by examiner

FIG. 14
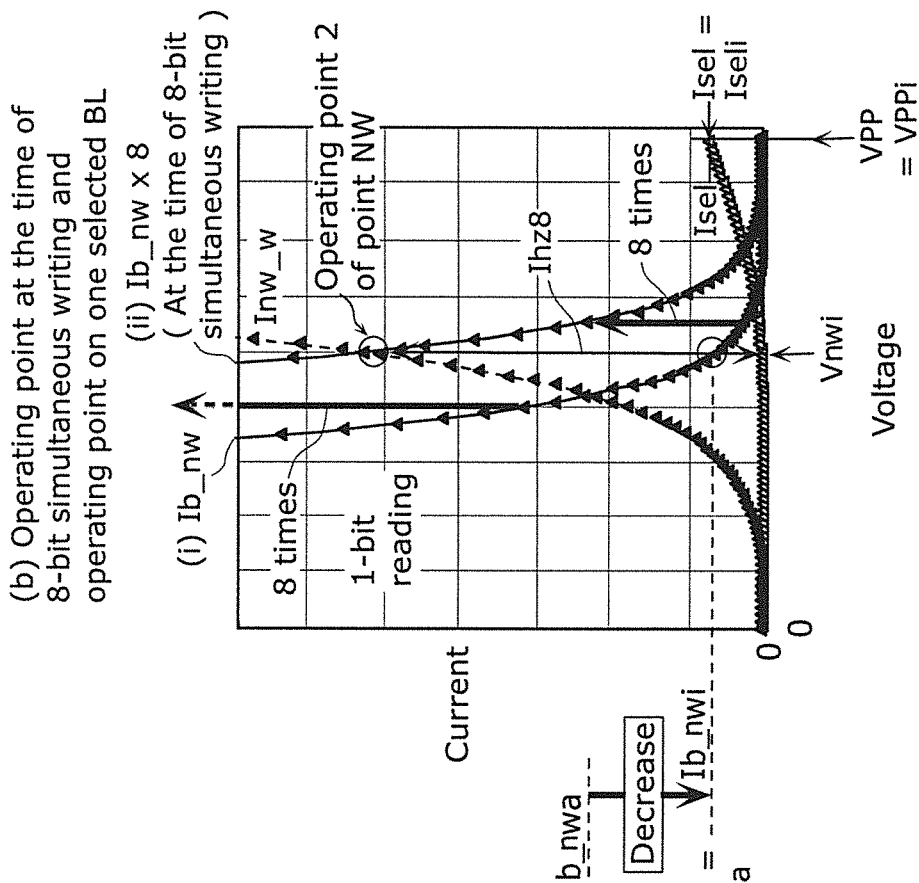
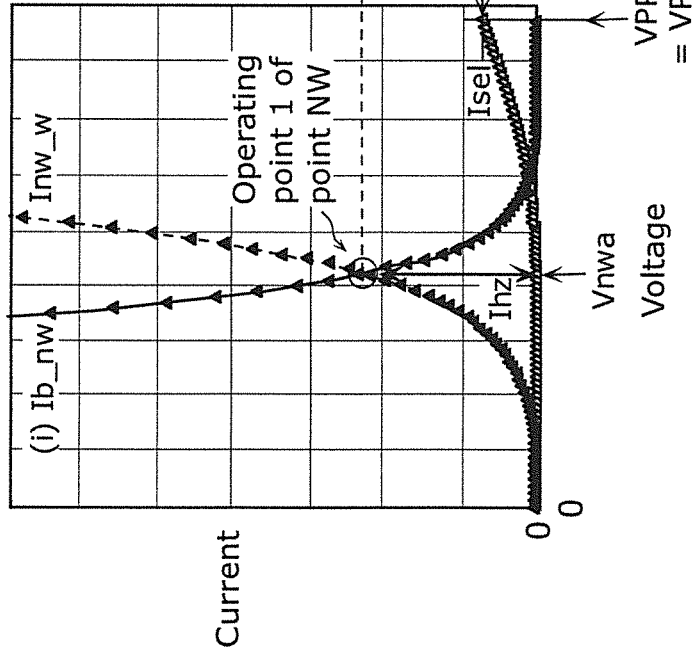

← Second electrode
← First electrode excluded">
CROSS POINT VARIABLE RESISTANCE NONVOLATILE MEMORY DEVICE AND METHOD OF WRITING THEREBY

TECHNICAL FIELD

The present invention relates to a nonvolatile memory device having a cross point memory cell array that includes so-called variable resistance elements, and a method of writing for use in a nonvolatile memory device.

BACKGROUND ART

In recent years, research and development are conducted on a nonvolatile memory device having memory cells that include variable resistance elements. A variable resistance element is an element that has a property that a resistance value changes (reversibly changes between a high resistance state and a low resistance state) according to an electrical signal and enables information to be written through this change in resistance value.

Exemplary structures for the memory cells using the variable resistance elements include a cross point structure as a structure suitable for high integration. In the cross point structure, each memory cell is placed at a different one of cross points of orthogonally arranged bit lines and word lines so as to be provided between a bit line and a word line. Various types of such cross point variable resistance nonvolatile memory devices are developed in recent years (see Patent Literatures (PTLs) 1 and 2, for instance).

PTL 1 discloses a nonvolatile memory device having memory cells that use bidirectional variable resistors in a cross point structure. With a view to reduce a so-called leakage current (leak current) flowing through unselected memory cells, PTL 1 discloses that, for example, a varistor is used as a bidirectional nonlinear element included in a memory cell, that writing to a selected memory cell is performed by applying a write voltage Vpp, Vss, and a voltage Vpp/2 to a selected bit line, a selected word line, and unselected word lines and unselected bit lines, respectively, at a time of writing, and that erasing of a selected memory cell is performed by applying a write voltage Vpp, Vss, and a voltage Vpp/2 to a selected word line, a selected bit line, and unselected word lines and unselected bit lines, respectively, at a time of erasing.

Similarly, PTL 2 discloses a nonvolatile memory device having a cross point memory cell array in which each memory cell including a bidirectional variable resistor and a bidirectional nonlinear element is placed at a different one of cross points of word lines arranged in parallel with each other and bit lines arranged orthogonal to the word lines, so as to form a matrix. PTL 2 discloses that the bidirectional nonlinear element is designed to reduce a leakage current that flows through unselected memory cells. Since, however, an amount of leakage current depends on an array size of a memory cell array, an increase in array size causes a significant increase in leakage current. In response to such a problem, PTL 2 discloses, as a method of reducing a leakage current, a means for applying a predetermined voltage to an unselected word line and an unselected bit line, thereby enabling more stable reading.

CITATION LIST

Patent Literature

[PTL 1]
Japanese Unexamined Patent Application Publication No. 2006-203098 (FIG. 6)
[PTL 2]
Japanese Patent No. 4252624 (FIG. 20)

SUMMARY OF INVENTION

Technical Problem

However, as will be described later, conventional techniques such as the ones above fail to sufficiently reduce a leakage current flowing through an unselected memory cell. Specifically, the leakage current flowing through the unselected memory cells is not sufficiently reduced at a time of writing, and thus power consumption at the time of writing is not sufficiently reduced. Moreover, the leakage current flowing through the unselected memory cells is not sufficiently reduced at a time of reading, and thus an SN ratio of a read current is not sufficiently satisfactory value, and read characteristics are unstable. Furthermore, it is not possible to allow a circuit to perform writing while reducing damage to memory cells.

An object of the present invention is to provide, for instance, a cross point variable resistance nonvolatile memory device that successfully reduces a leakage current flowing through unselected memory cells.

More specifically, the first object of the present invention is to provide, for example, a cross point variable resistance nonvolatile memory device that successfully reduces (i) a leakage current flowing through unselected memory cells at a time of writing and (ii) power consumption at the time of writing. The second object of the present invention is to reduce a leakage current flowing through unselected memory cells at a time of reading, increase a SN ratio of a read current, and stabilize read characteristics. The third object of the present invention is to provide, for instance, a cross point variable resistance nonvolatile memory device that successfully reduces a leakage current flowing through unselected memory cells and a consumption current for writing, and allows a simple circuit to perform writing while reducing damage to memory cells.

Solution to Problem

In order to achieve the first object, a cross point variable nonvolatile memory device according to an aspect of the present invention is a cross point variable nonvolatile memory device including a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction three-dimensionally crossing the Y direction, wherein the memory cell array includes first memory cells for data storage, and second memory cells that are connected to one of the N word lines that is connected to the first memory cells, the cross point variable resistance nonvolatile memory device further includes: a word line selection circuit that selects, for the memory cell array, one of the N word lines as a selected word line; a first bit line selection circuit that selects one of the M bit lines of the first memory cells as a first selected bit line; a second bit line selection circuit that selects, among the M bit lines, A (A is an integer larger than or equal to 1) bit line or lines connected to the second memory cells connected to the selected word line, as at least one second selected bit line; a word line write circuit that supplies, to a memory cell selected from among the first memory cells and the second memory cells through the selected word line, (i) a first voltage or a first current, to write to the memory cell by changing the memory cell to the first resistance state, and (ii) a second voltage or a second current, to write to the memory cell by changing the memory cell to the second resistance state; a first bit line write circuit that supplies, to a memory cell selected from among the first memory cells through the first selected bit line selected by the first bit line selection circuit, (i) a third voltage or a third current, to write to the memory cell by changing the memory cell to the first resistance state, and (ii) a fourth voltage or a fourth current, to write to the memory cell by changing the memory cell to the second resistance state; and a second bit line write circuit that supplies, to a memory cell selected from among the second memory cells through the at least one second selected bit line selected by the second bit line selection circuit, (i) the third voltage or the third current, to write to the memory cell by changing the memory cell to the first resistance state, and (ii) the fourth voltage or the fourth current, to write to the memory cell by changing the memory cell to the second resistance state, when the memory cell selected from among the first memory cells is written to by changing the memory cell to the first resistance state, the word line write circuit supplies the first voltage or the first current to the selected word line, the first bit line write circuit supplies the third voltage or the third current to the first selected bit line of the first memory cells, and the second bit line write circuit supplies the third voltage or the third current to the A second selected bit line or lines of the second memory cells, when the memory cell selected from among the first memory cells is written to by changing the memory cell to the second resistance state, the word line write circuit supplies the second voltage or the second current to the selected word line, the first bit line write circuit supplies the fourth voltage or the fourth current to the first selected bit line of the first memory cells, and the second bit line write circuit supplies the fourth voltage or the fourth current to the A second selected bit lines of the second memory cells, and when writing to the memory cell array, the cross point variable resistance nonvolatile memory device always simultaneously writes to (1+A) memory cells connected to the same word line.

Moreover, in order to achieve the second object, a cross point variable nonvolatile memory device according to another aspect of the present invention is a cross point variable nonvolatile memory device including a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction three-dimensionally crossing the Y direction, wherein the memory cell array includes first memory cells for data storage, and second memory cells that are connected to one of the N word lines that is connected to the first memory cells, the cross point variable resistance nonvolatile memory device further includes: a word line selection circuit that selects, for the memory cell array, one of the N word lines as a selected word line; a first bit line selection circuit that selects one of the M bit lines of the first memory cells as a first selected bit line; a second bit line selection circuit that selects, among the M bit lines, A (A is an integer larger than or equal to 1) bit line or lines connected to the second memory cells connected to the selected word line, as at least one second selected bit line; a word line read voltage generation circuit that supplies a fifth voltage to a memory cell selected from among the first memory cells and the second memory cells through the selected word line, to read stored data from the memory cell; a first read circuit that supplies a sixth voltage or a sixth current to a memory cell selected from among the first memory cells through the first selected bit line selected by the first bit line selection circuit, to read stored data from the memory cell; and a second read circuit that supplies the sixth voltage or the sixth current to a memory cell selected from among the second memory cells through the A second selected bit line or lines selected by the second bit line selection circuit, to read stored data from the memory cell, when the memory cell selected from among the first memory cells and the second memory cells is read, the word line read voltage generation circuit supplies the fifth voltage to the selected word line, the first read circuit supplies the sixth voltage or the sixth current to the first selected bit line of the first memory cells, and the second read circuit supplies the sixth voltage or the sixth current to the A second selected bit line or lines of the second memory cells, and when reading from the memory cell array, the cross point variable resistance nonvolatile memory device always simultaneously reads from (1+A) memory cells connected to the same word line.

Furthermore, in order to achieve the third object, a cross point variable nonvolatile memory device according to still another aspect of the present invention is a cross point variable nonvolatile memory device including: a plurality of divided memory cell arrays each including: a data memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics; and a compensation memory cell array including dummy cells each at least including the bidirectional current steering element having the nonlinear current-voltage characteristics, the memory cells being placed at respective cross points of M (M is an integer) bit lines extending in a Y direction and N (N is an integer) word lines extending in an X direction three-dimensionally crossing the Y direction, and the dummy cells being placed at respective cross points of the N (N is an integer) word lines and at least one bit line extending in the Y direction; a first bit line selection circuit that selects one of the M bit lines of the data memory cell array included in each of the divided memory cell arrays; a second bit line selection circuit that selects one of the at least one bit line of the compensation memory cell array included in each of the divided memory cell arrays; and a write circuit that performs writing on the data memory cell array included in each of the divided memory cell arrays, by changing the data memory cell array to the first resistance state or the second resistance, according to write data of a plurality of bits inputted from the outside, wherein the write circuit includes: a write register that outputs a data input signal instructing writing by changing to the first resistance state or writing by changing to the second resistance state, to each of the divided memory cell arrays, according to the write data; a write data flag generating circuit that generates a write data flag instructing which of the writing by changing to the first resistance state and the writing by changing to the second resistance state is to be simultaneously performed on the divided memory cell arrays; and a data/compensation selection circuit that performs writing on each of the divided memory cell arrays based on the data input signal and the write data flag, by selecting the first bit line selection circuit or the second bit line selection circuit to operate, the data/compensation selection circuit performs, for each of the divided memory cell arrays: writing on the data memory cell array of the divided memory cell array by selecting the first bit line selection circuit to operate, when the data input signal for the divided memory cell array instructs the writing by changing to the first resistance state and the write data flag instructs the writing by changing to the first resistance state; writing on the data memory cell array of the divided memory cell array by selecting the first bit line selection circuit to operate, when the data input signal for the divided memory cell array instructs the writing by changing to the second resistance state and the write data flag instructs the writing by changing to the second resistance state; writing on the compensation memory cell array of the divided memory cell array by selecting the second bit line selection circuit to operate, when the data input signal for the divided memory cell array instructs the writing by changing to the first resistance state and the write data flag instructs the writing by changing to the second resistance state; and writing on the compensation memory cell array of the divided memory cell array by selecting the second bit line selection circuit to operate, when the data input signal for the divided memory cell array instructs the writing by changing to the second resistance state and the write data flag instructs the writing by changing to the first resistance state, and when writing the write data of the bits, the write circuit always performs simultaneous writing on the divided memory cell arrays.

It is to be noted that the present invention is realized not only as such cross point variable resistance nonvolatile memory devices, but also as a method of writing (a multi-bit simultaneous writing method) for use in a cross point variable resistance nonvolatile memory device.

Advantageous Effects of Invention

The present invention provides a cross point variable resistance nonvolatile memory device and so on that successfully reduce a leakage current flowing through unselected memory cells.

More specifically, the cross point variable resistance nonvolatile memory device in the present invention reduces the leakage current flowing through the unselected memory cells and increases efficiency of a current contributing to writing, thereby producing an advantageous effect of achieving both superior write characteristics and low power consumption.

Moreover, the cross point variable resistance nonvolatile memory device in the present invention produces an advantageous effect of increasing stability of read characteristics in reading.

Furthermore, the present invention achieves a cross point variable resistance nonvolatile memory device that successfully reduces a leakage current flowing through unselected memory cells and a consumption current for writing, and allows a simple circuit to perform writing while reducing damage to memory cells.

Therefore, the present invention (i) achieves a cross point variable resistance nonvolatile memory device that has stable write and read characteristics and is suitable for high integration, and (ii) has a significantly high practical value in today's world where various types of electronic devices including nonvolatile memory devices have become widespread.

(a) in FIG. 14 is an I-V characteristic graph for a memory cell array at a time of 1-bit writing, and (b) in FIG. 14 is an I-V characteristic graph for a memory cell array at a time of multi-bit simultaneous writing in the present invention.

Figure 15:
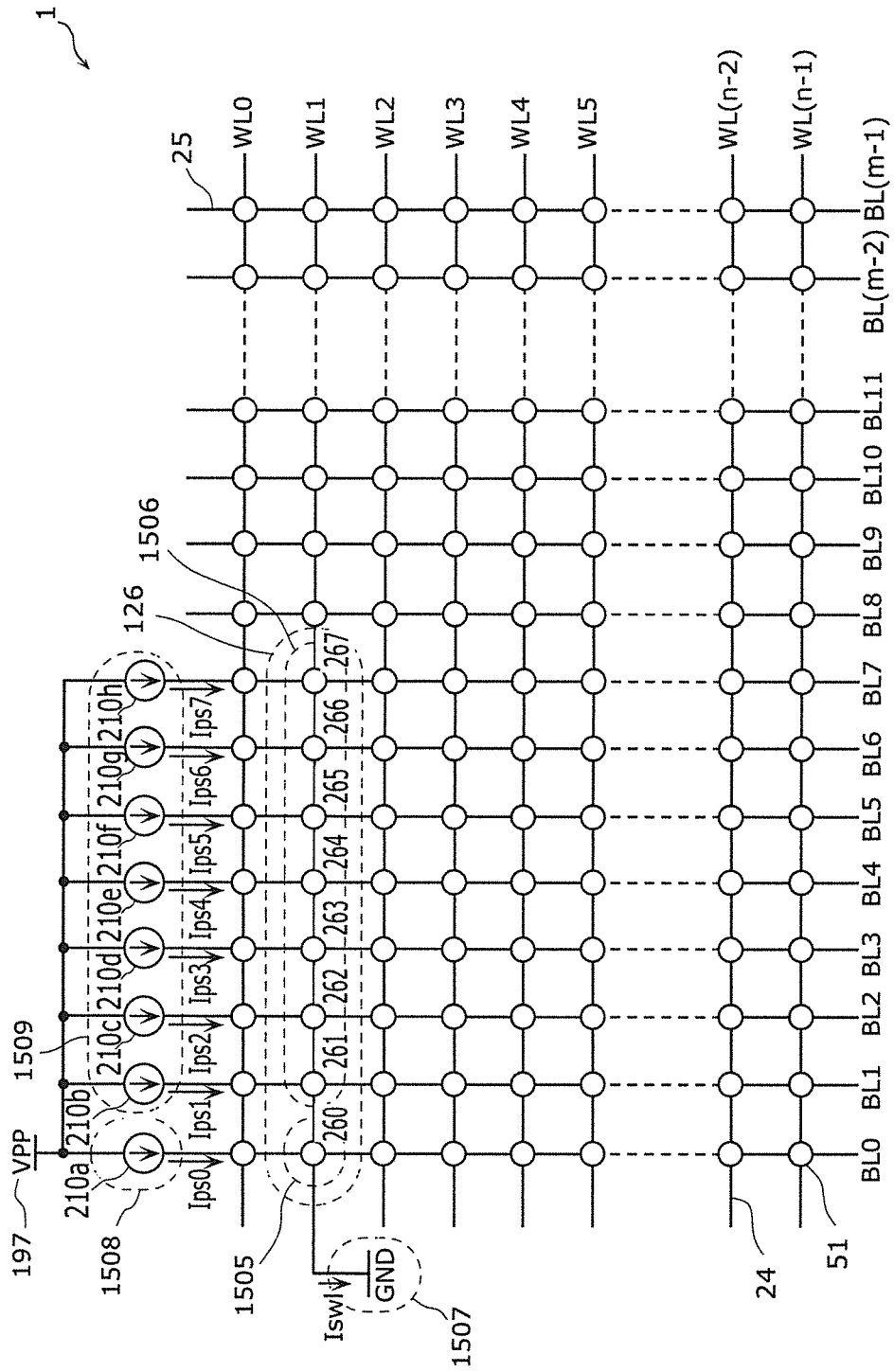

FIG. 15 is a conceptual diagram showing selection of memory cells at a time of multi-bit simultaneous writing by application of a constant current in the present invention.

Figure 16:
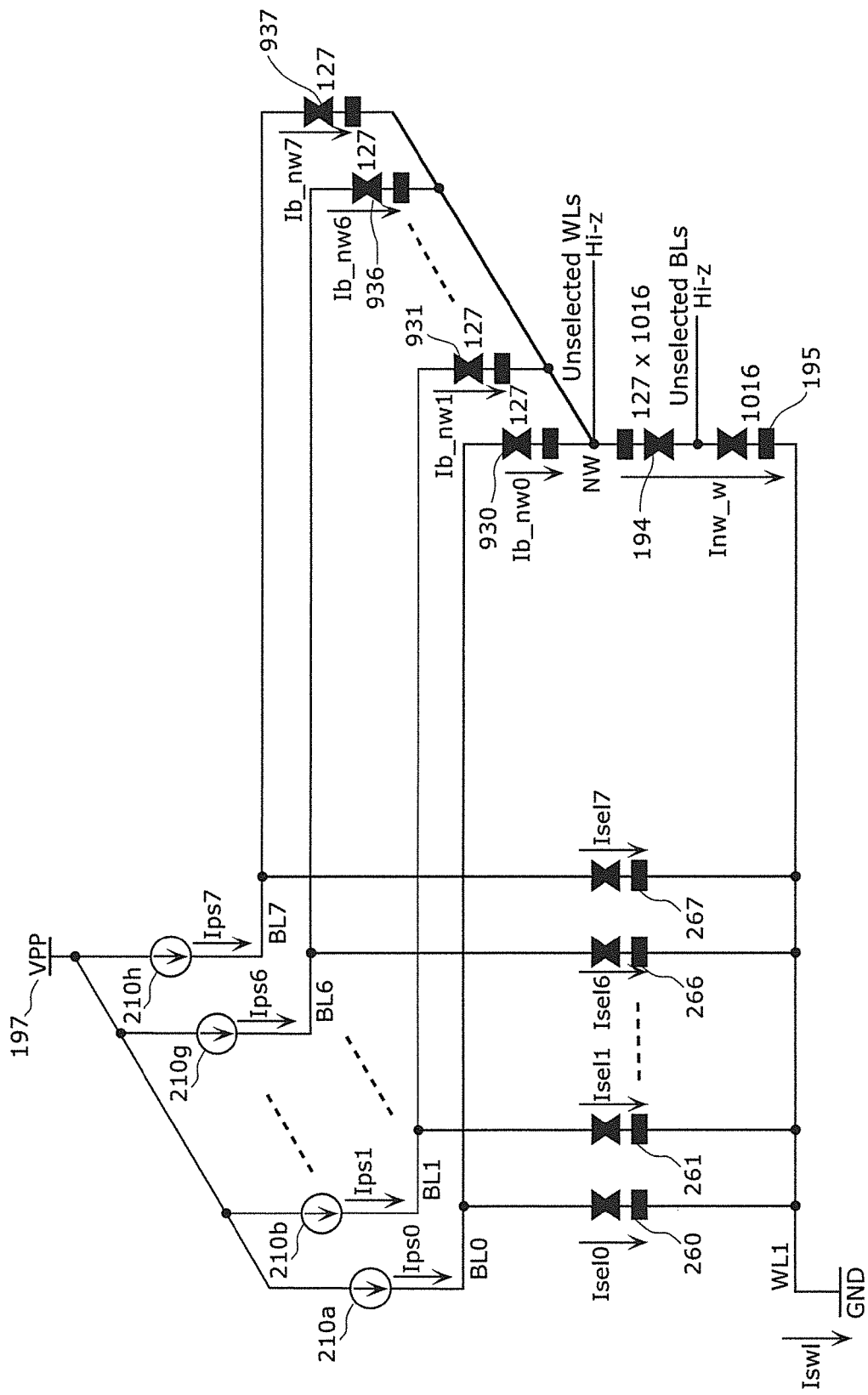

FIG. 16 is an equivalent circuit diagram illustrating a state of multi-bit simultaneous writing by application of a constant current in the present invention.

Figure 17A:
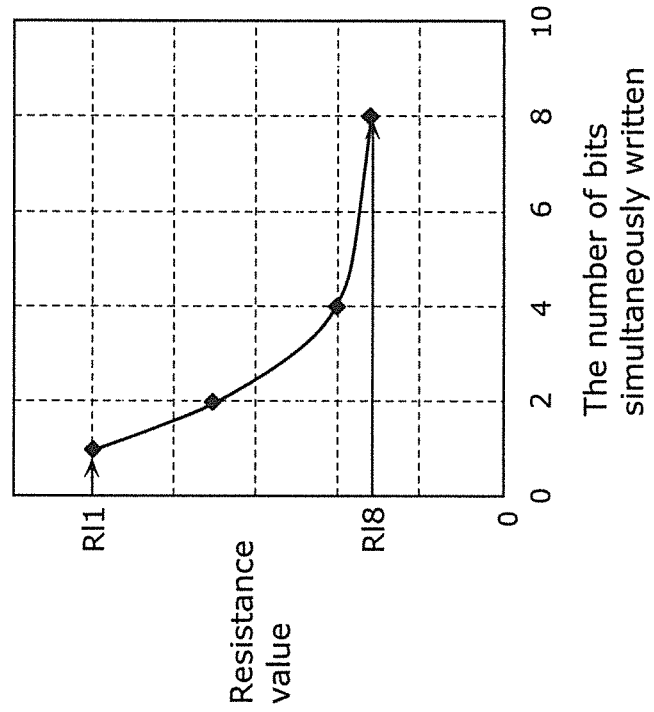

FIG. 17A is a graph showing dependency of a selected memory cell current on the number of bits simultaneously written by application of a constant current in the present invention.

Figure 17B:
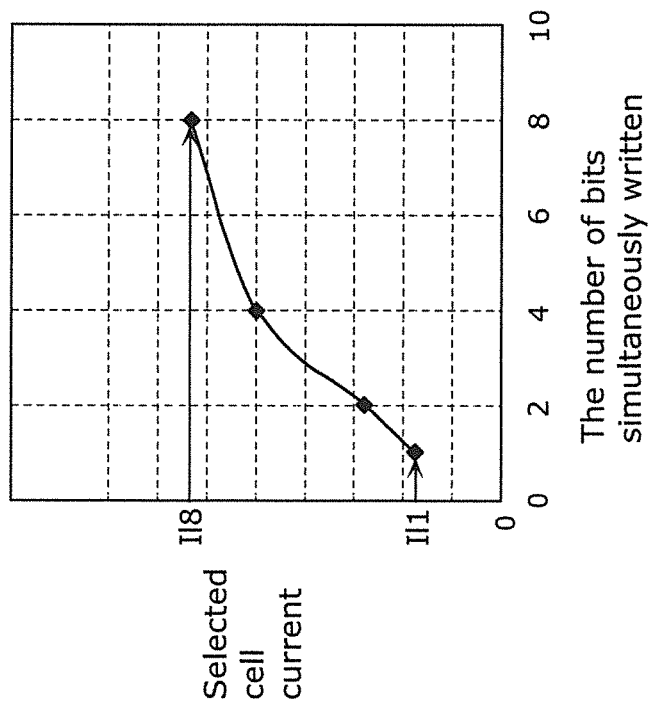

FIG. 17B is a graph showing dependency of a set resistance value of a selected memory cell on the number of bits simultaneously written by application of a constant current in the present invention.

Figure 18:
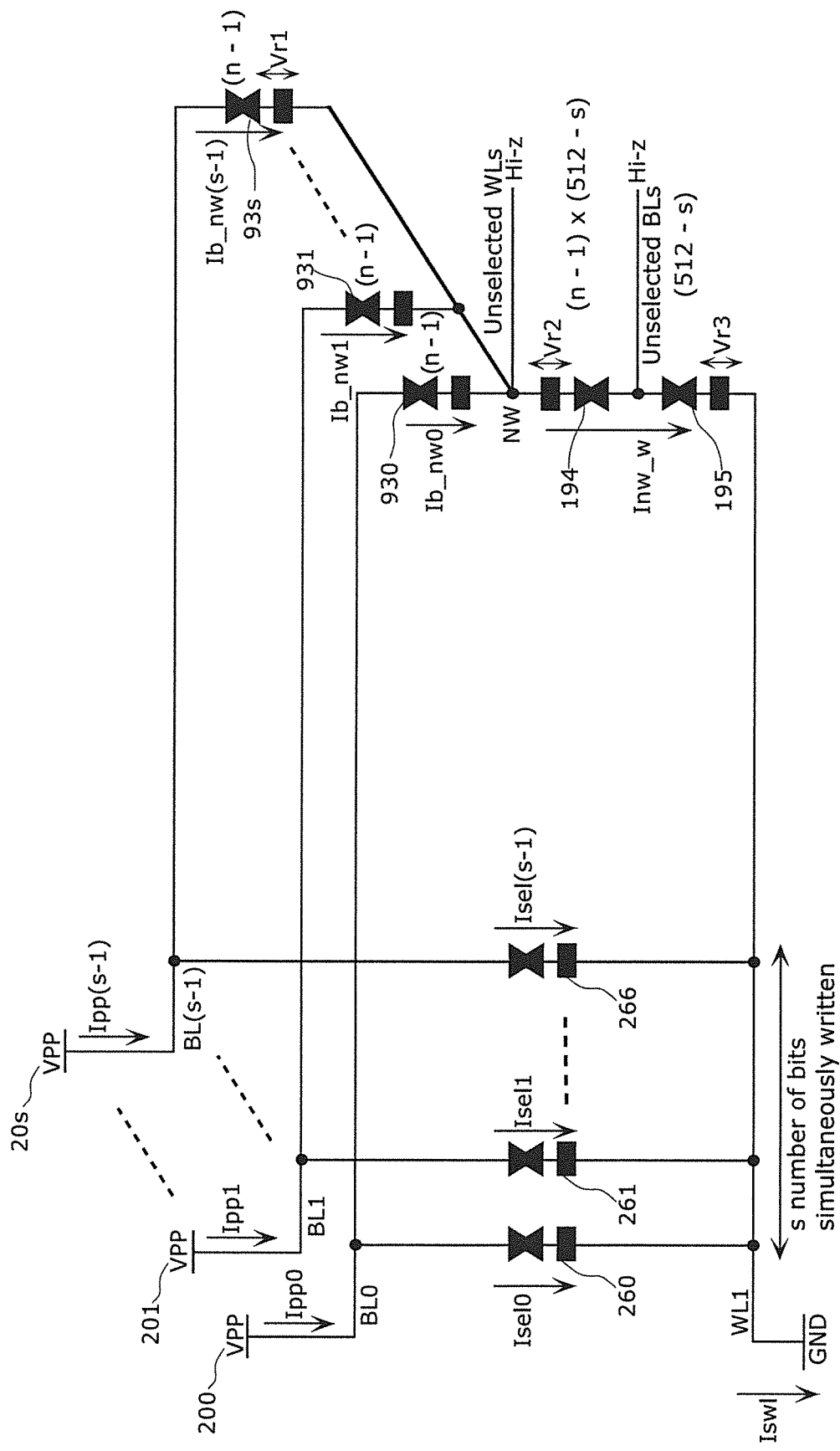

FIG. 18 is an equivalent circuit illustrating disturbing characteristics of unselected memory cells in the present invention.

Figure 19:
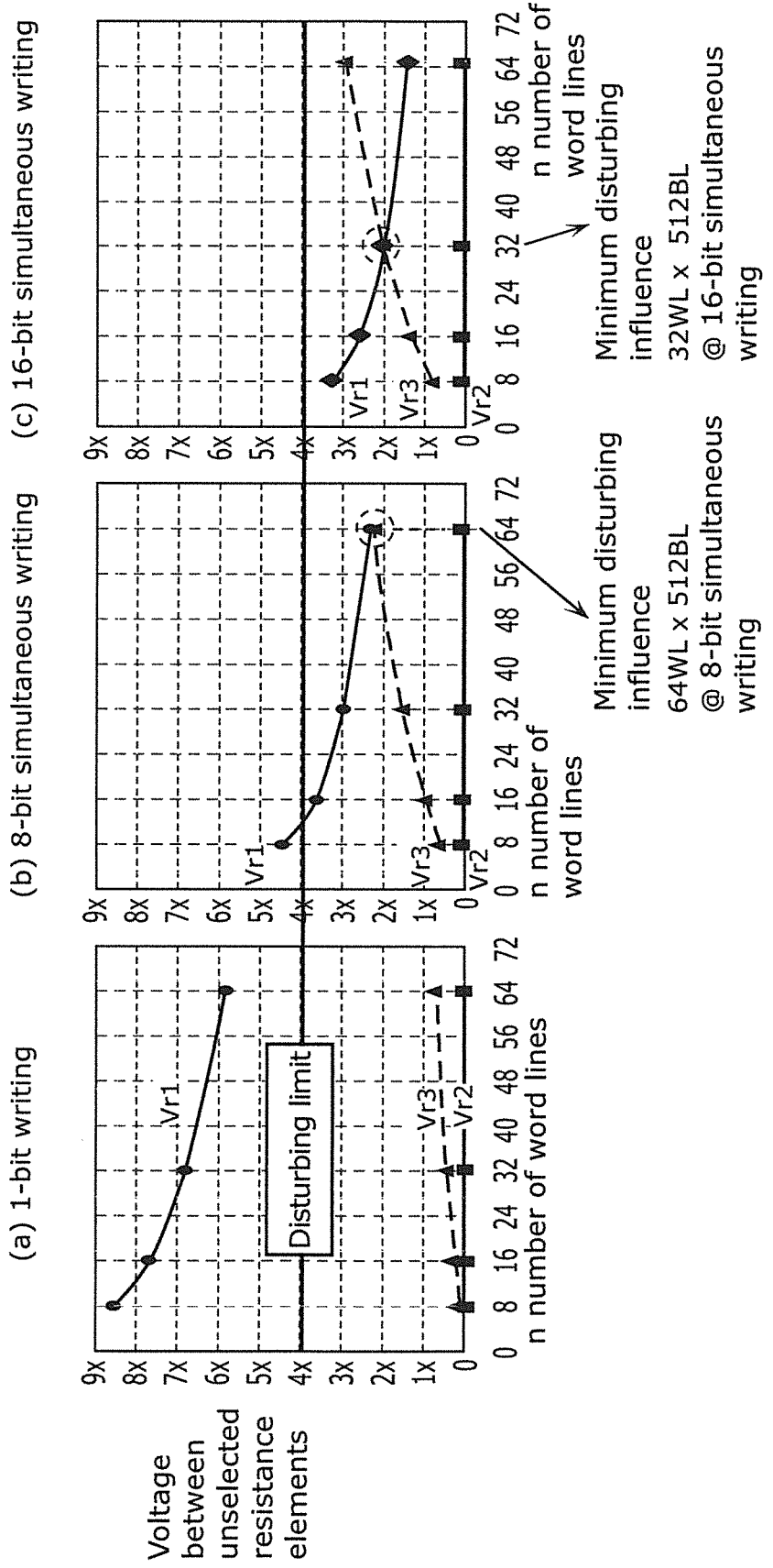

FIG. 19 is a diagram illustrating disturbing characteristics of unselected memory cells in the present invention. (a) in FIG. 19 is a graph showing characteristics at a time of 1-bit writing, (b) in FIG. 19 is a graph showing characteristics at a time of 8-bit simultaneous writing, and (c) in FIG. 19 is a graph showing characteristics at a time of 16-bit simultaneous writing.

Figure 20:
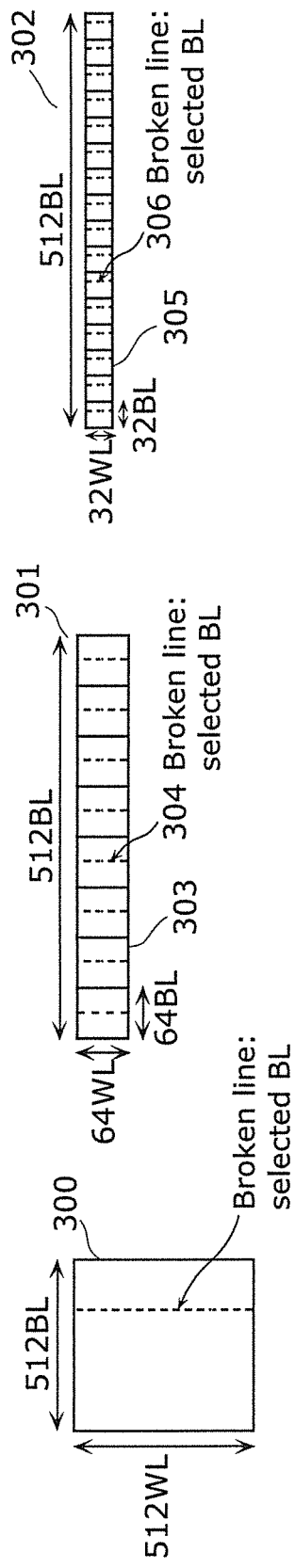

FIG. 20A is a diagram illustrating optimum conditions for minimizing disturbing.

FIG. 20B is a diagram illustrating optimum conditions for minimizing disturbing (in the case of 8-bit simultaneous writing).

FIG. 20C is a diagram illustrating optimum conditions for minimizing disturbing (in the case of 16-bit simultaneous writing).

Figure 21:
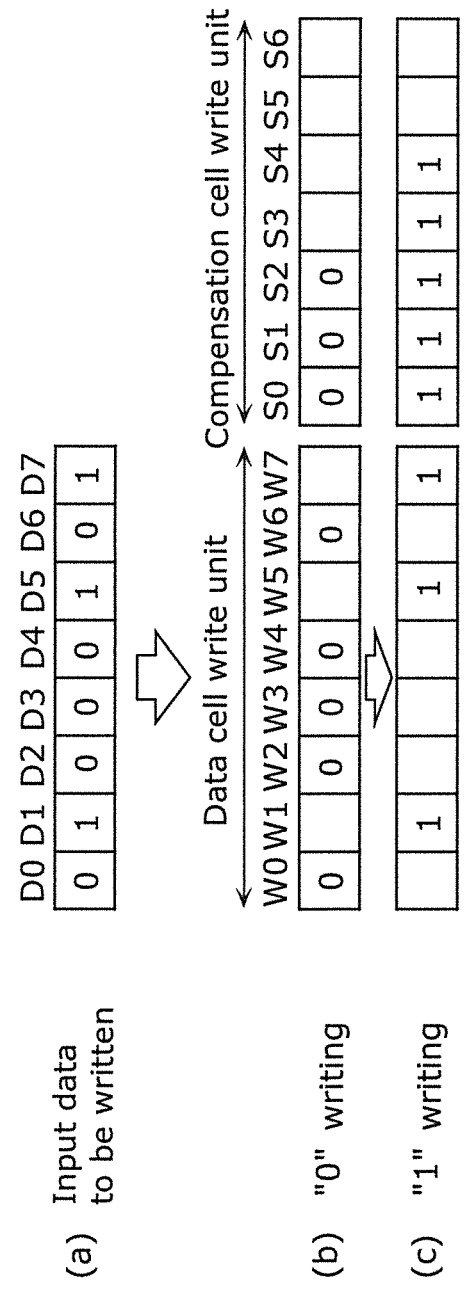

FIG. 21 is a diagram illustrating a data writing method for multi-bit simultaneous writing according to Embodiment 2 of the present invention. (a) in FIG. 21 is a diagram showing input data to be written, (b) in FIG. 21 is a diagram showing data at a time of "0" writing, and (c) in FIG. 21 is a diagram showing data at a time of "1" writing.

Figure 22A:
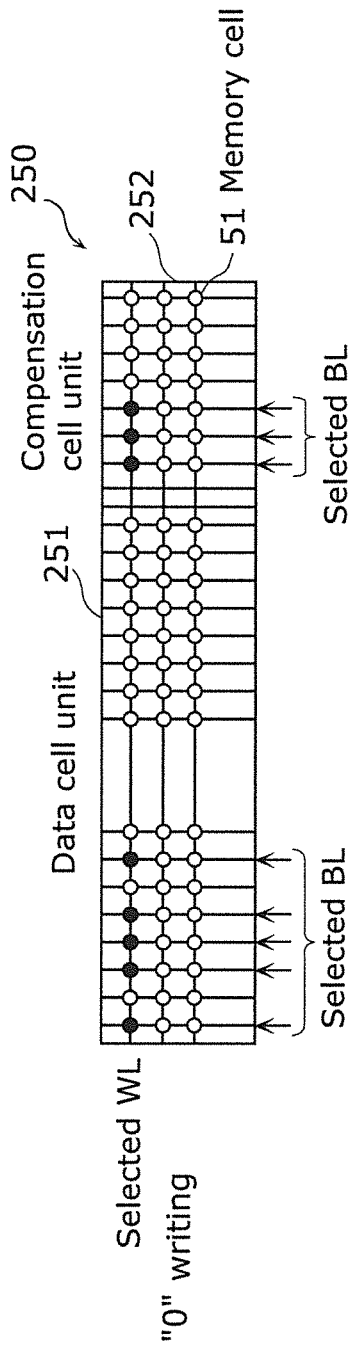

FIG. 22A is a diagram illustrating a "0" writing method by a compensation cell scheme for multi-bit simultaneous writing in the present invention.

Figure 22B:
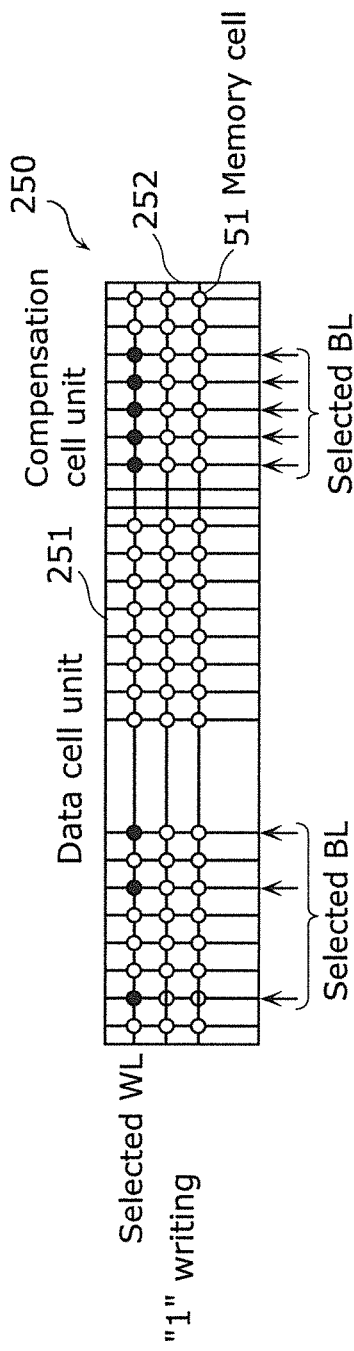

FIG. 22B is a diagram illustrating a "1" writing method by a compensation cell scheme for multi-bit simultaneous writing in the present invention.

Figure 23:
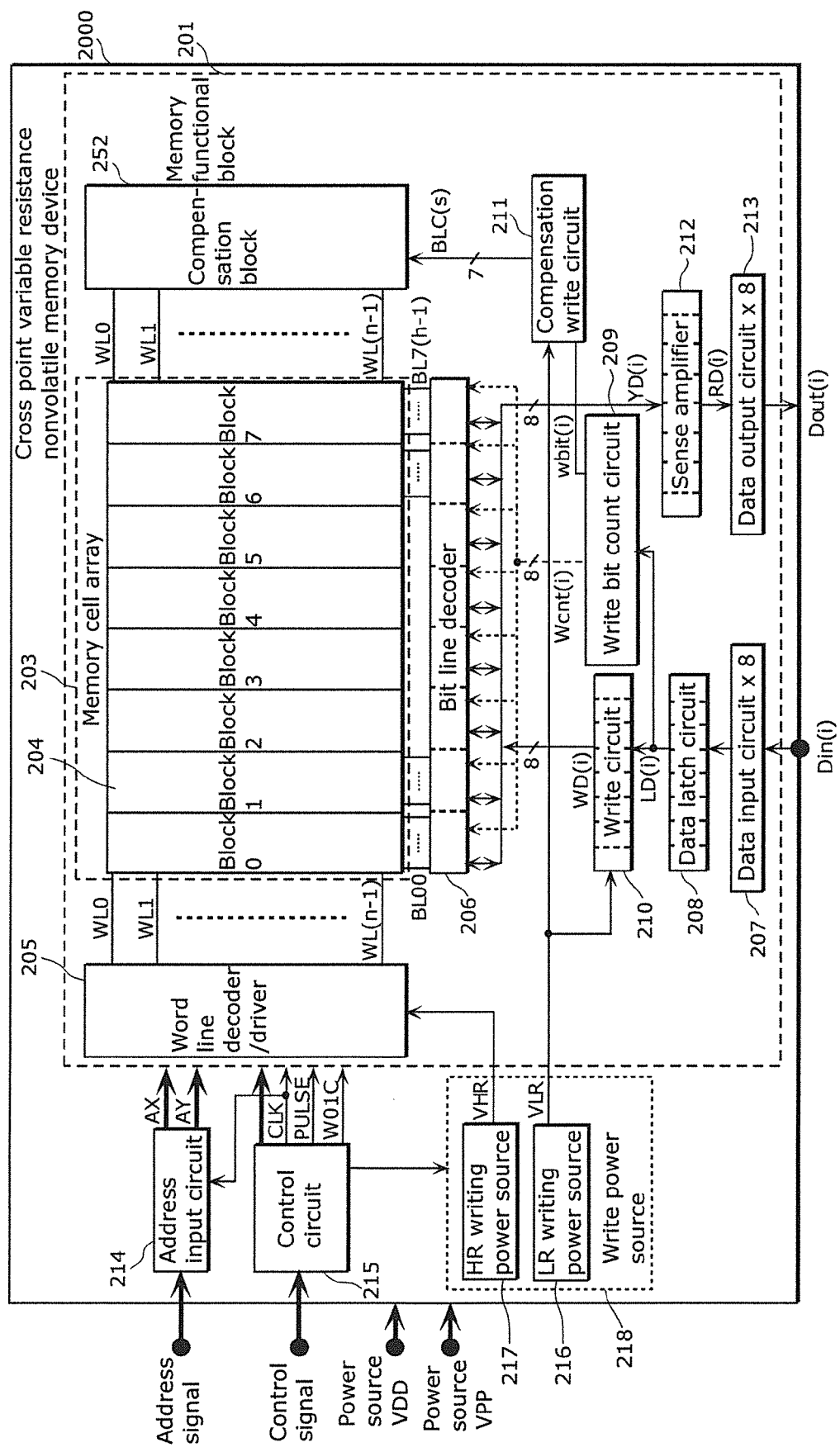

FIG. 23 is a block diagram showing a memory that achieves multi-bit simultaneous writing in the present invention.

Figure 24:
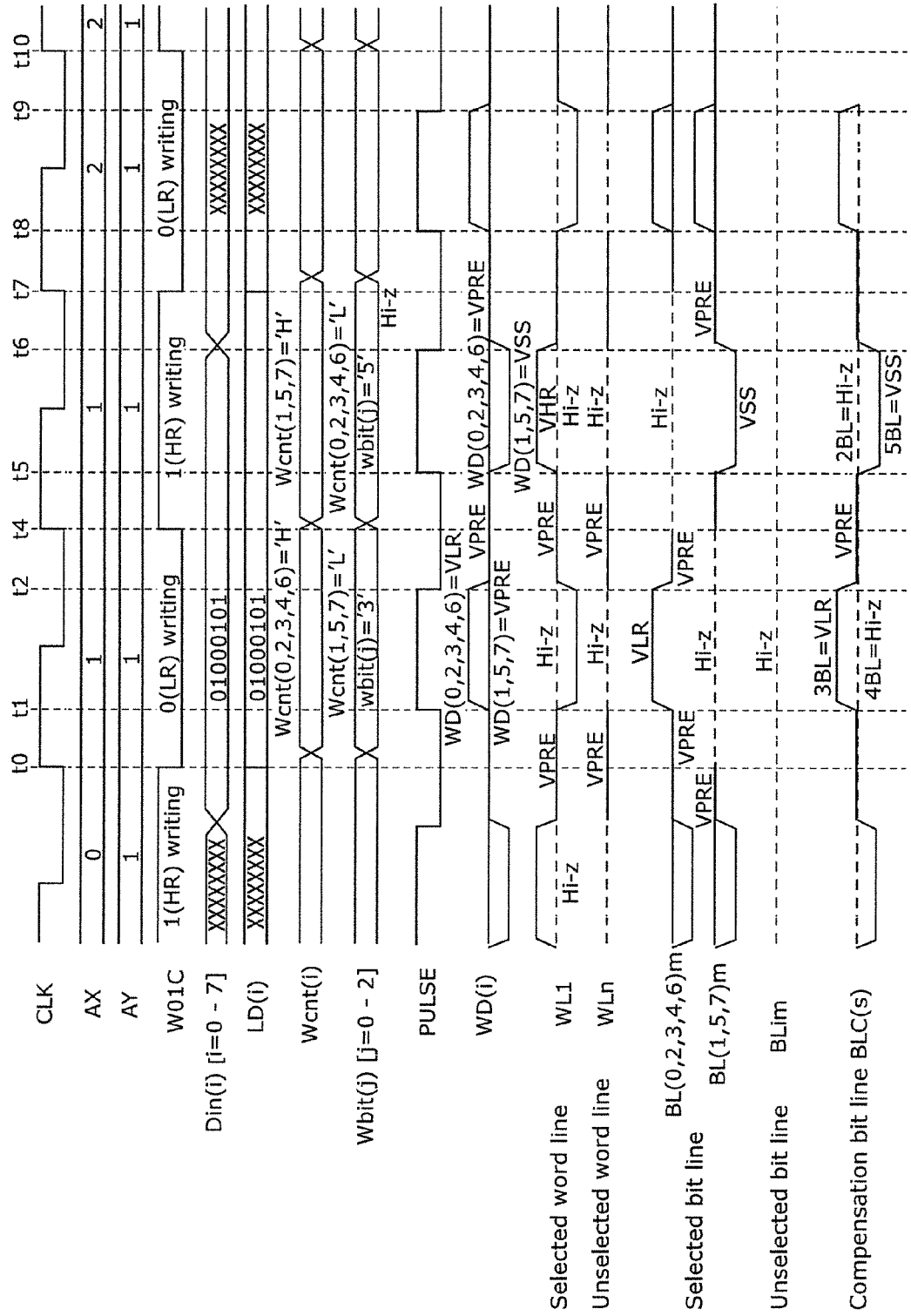

FIG. 24 is a sequence diagram for multi-bit simultaneous writing in the present invention.

Figure 25:
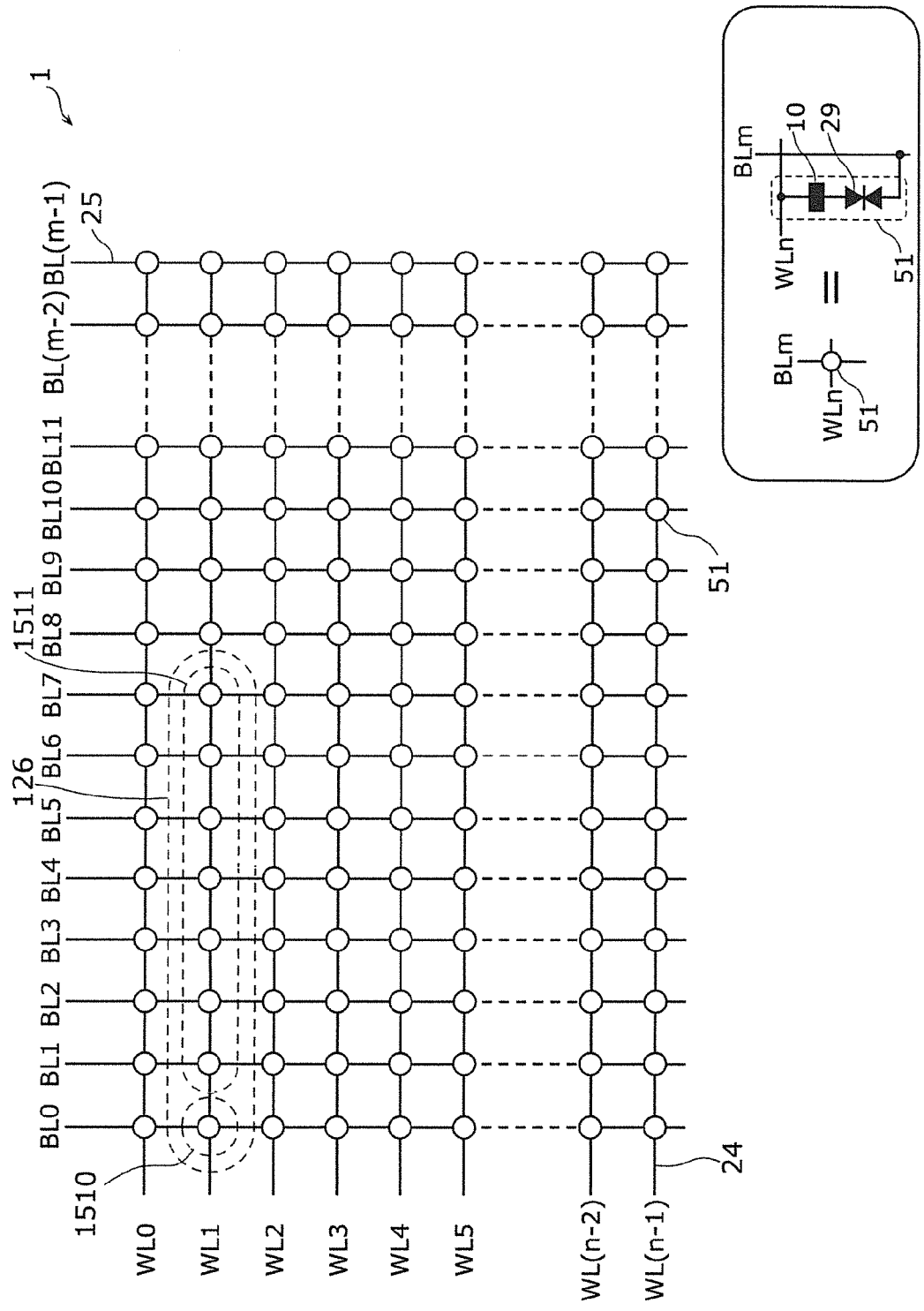

FIG. 25 is a conceptual diagram showing selection of memory cells at a time of multi-bit simultaneous reading according to Embodiment 3 of the present invention.

Figure 26:
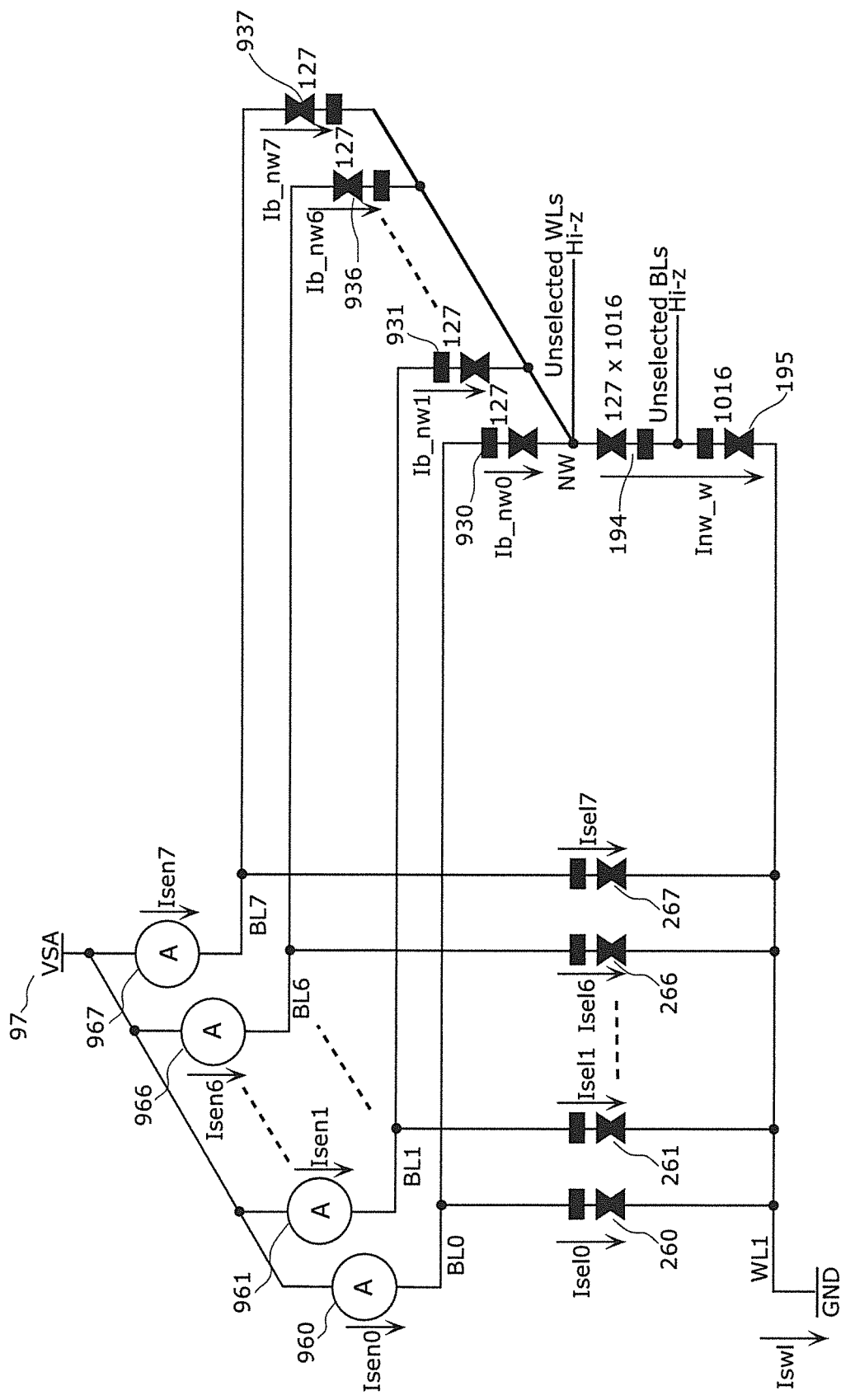

FIG. 26 is an equivalent circuit diagram illustrating a state of multi-bit simultaneous reading in the present invention.

Figure 27:
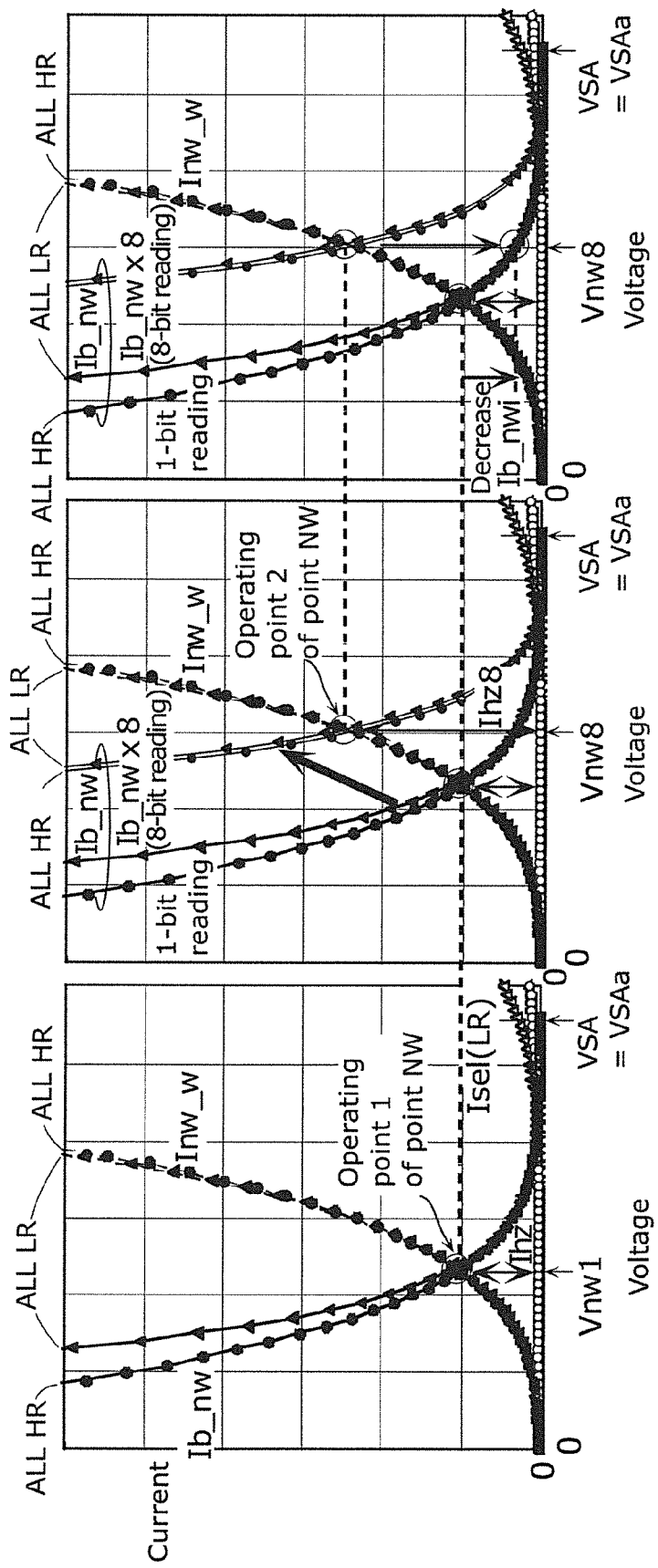

(a) in FIG. 27 is an I-V characteristic graph for a memory cell array at a time of 1-bit reading, (b) in FIG. 27 is an I-V characteristic graph for a memory cell array at a time of 8-bit simultaneous reading, and (c) in FIG. 27 is an I-V characteristic graph for a memory cell array at a time of 8-bit simultaneous reading.

Figure 28:
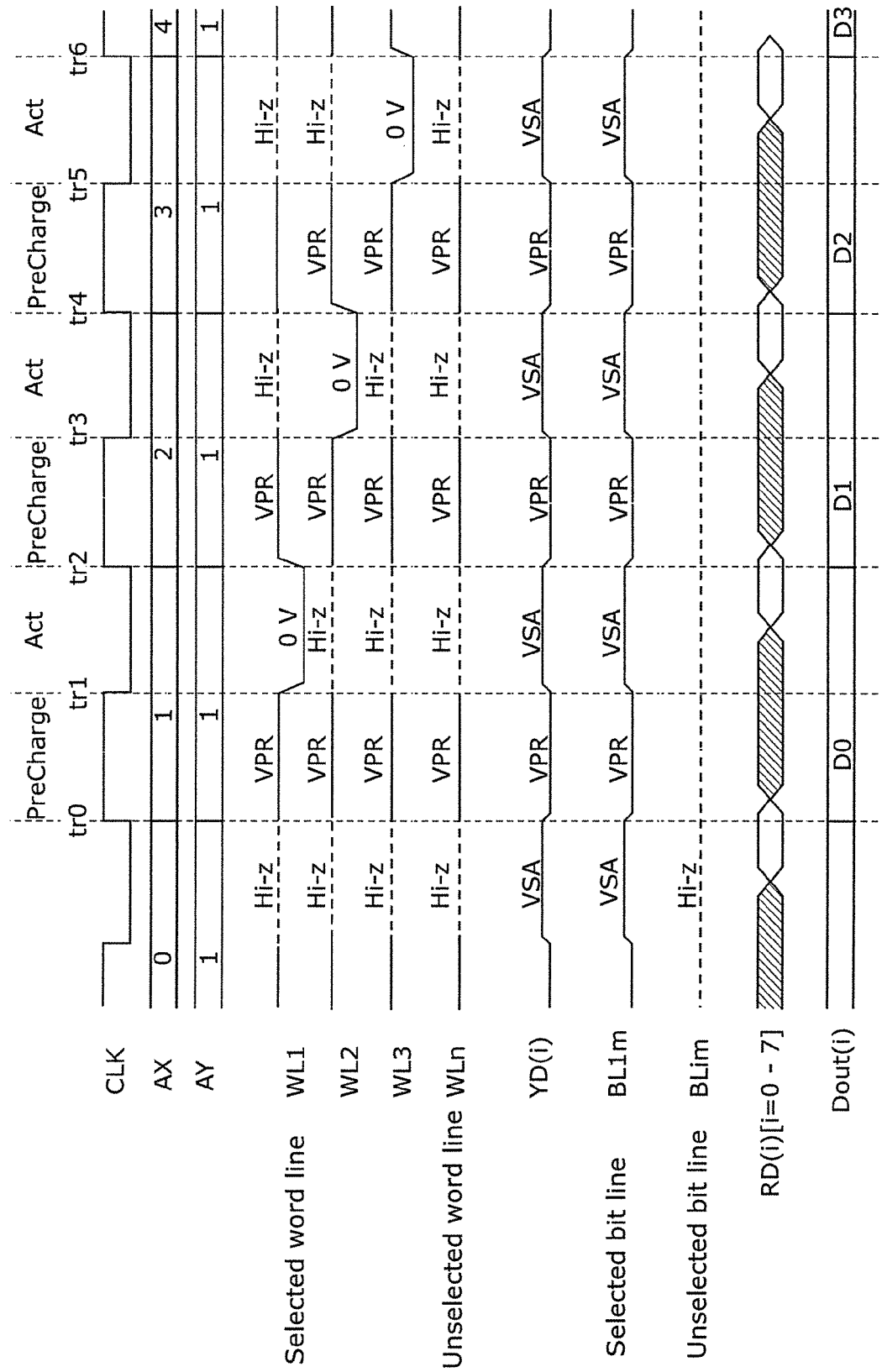

FIG. 28 is a sequence diagram for multi-bit simultaneous reading in the present invention.

Figure 29:
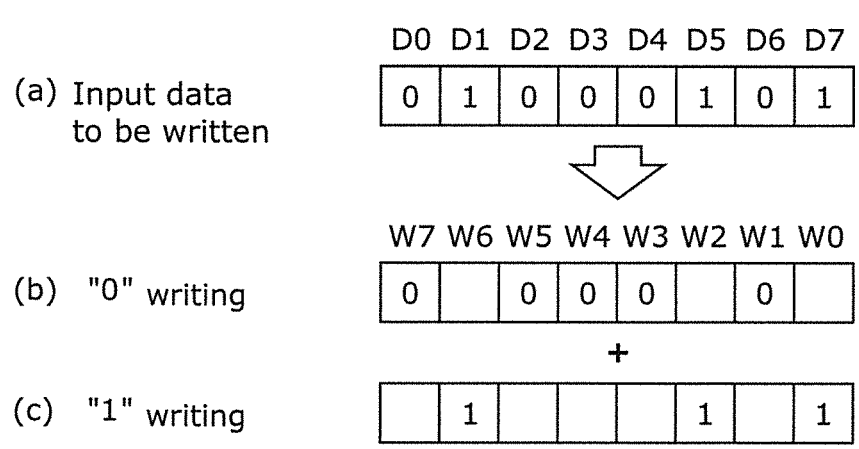

FIG. 29 is a diagram illustrating division of data to be written for multi-bit simultaneous writing in the present invention.

Figure 30A:
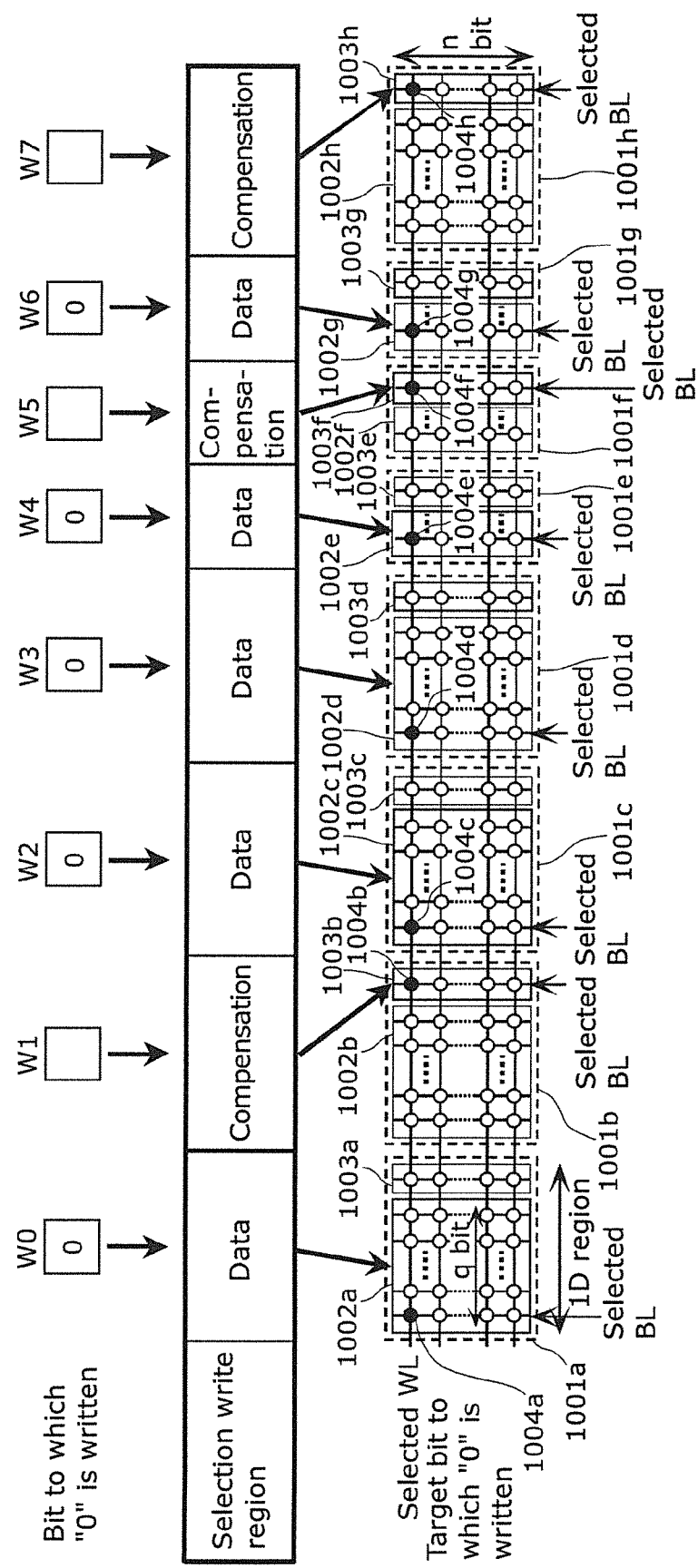

FIG. 30A is a diagram illustrating an access method at a time of "0" writing in multi-bit simultaneous writing in the present invention.

Figure 30B:
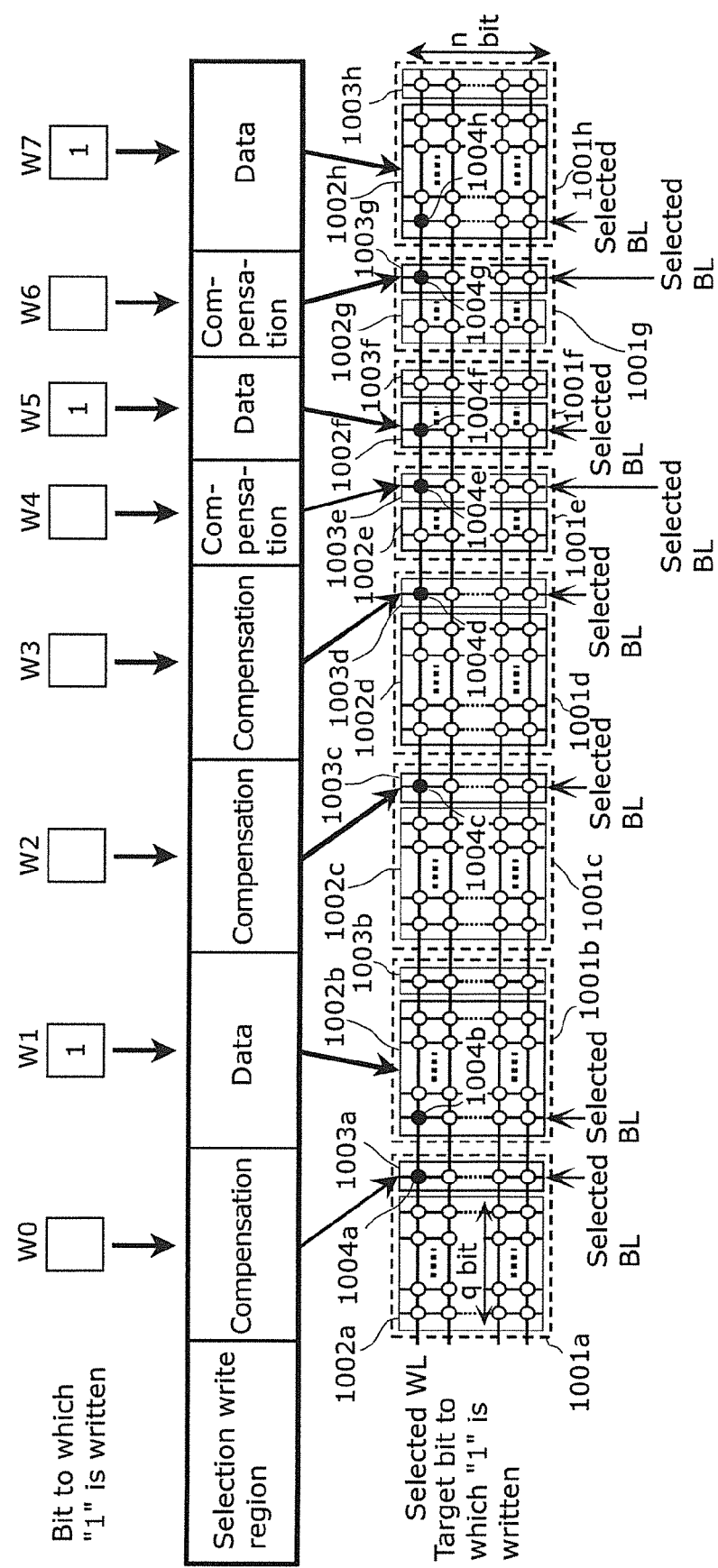

FIG. 30B is a diagram illustrating an access method at a time of "1" writing in multi-bit simultaneous writing in the present invention.

Figure 31:
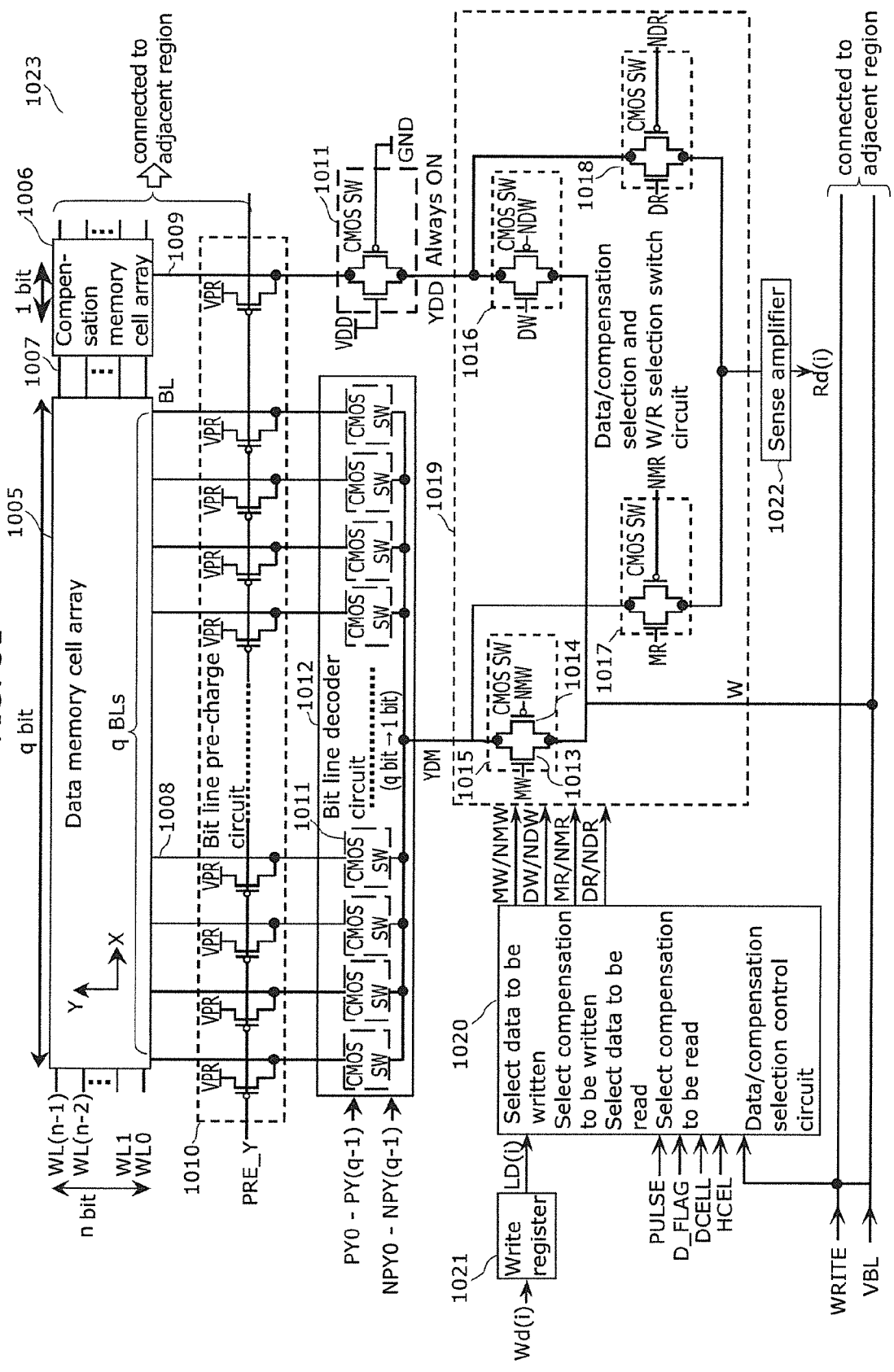

FIG. 31 is a block diagram showing a 1D memory access circuit for multi-bit simultaneous writing in the present invention.

Figure 32:
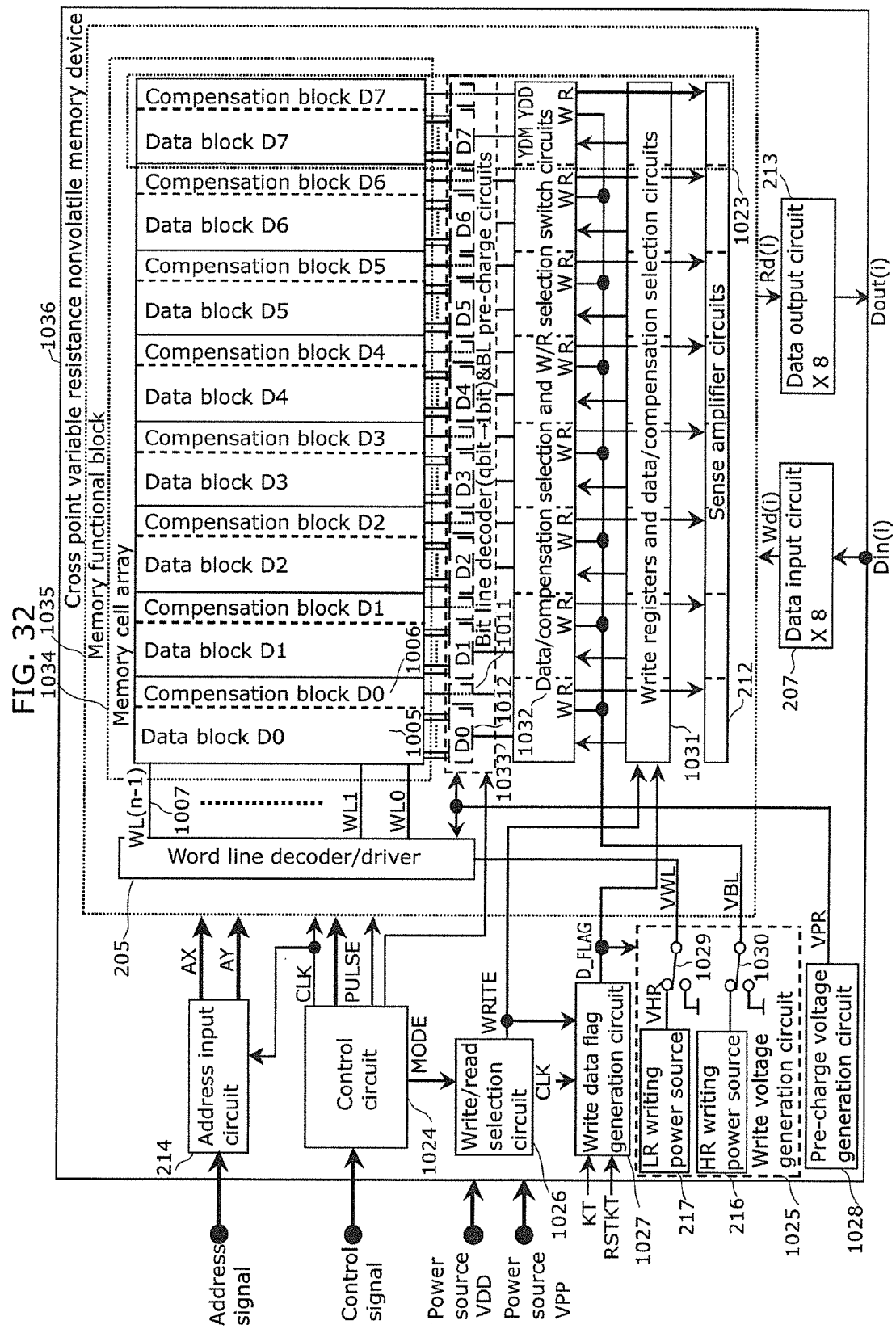

FIG. 32 is a block diagram showing a cross point variable resistance nonvolatile memory device in the present invention that achieves multi-bit simultaneous writing using the circuit shown in FIG. 31.

Figure 33A:
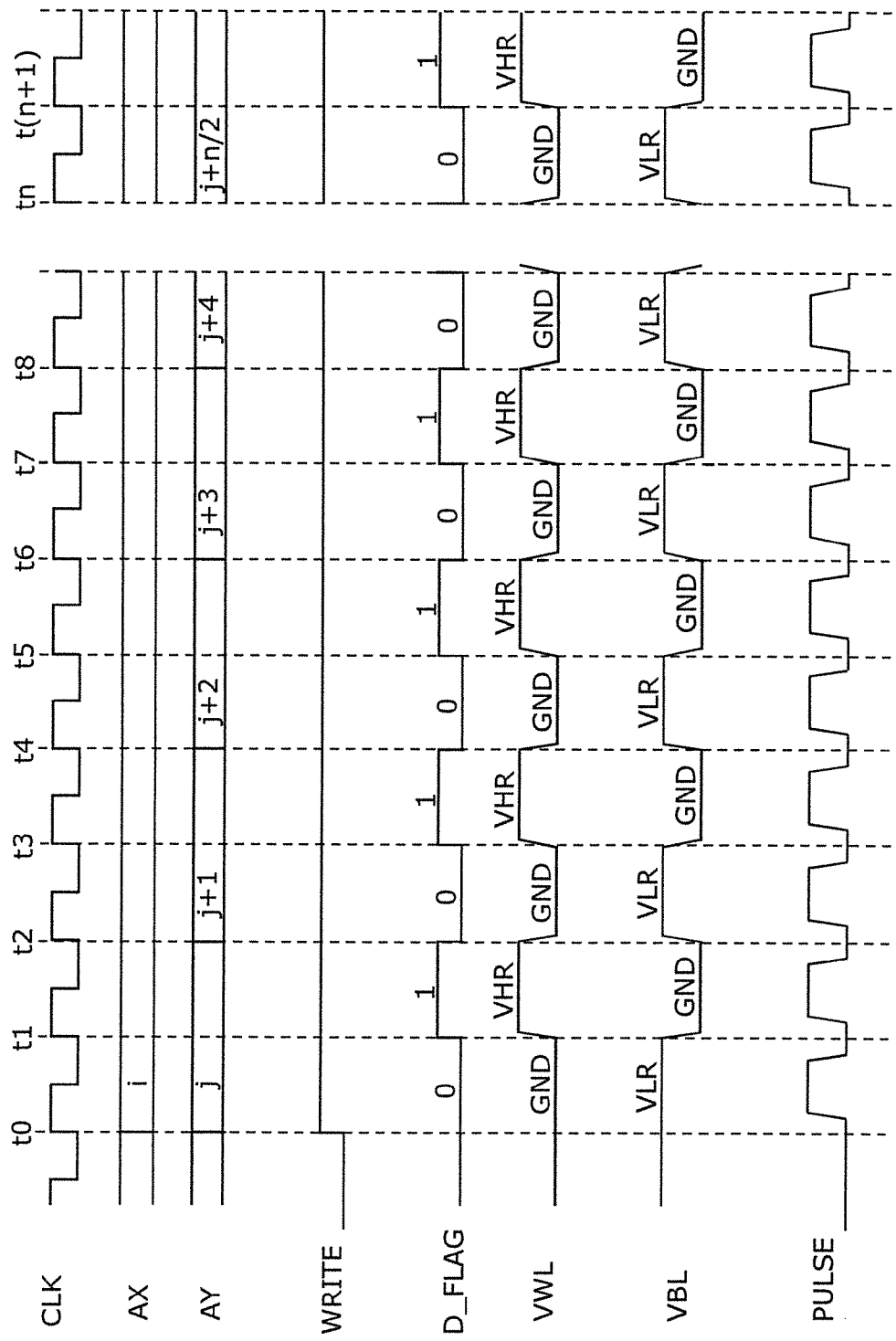

FIG. 33A is a sequence diagram (single cycle) for showing generation of D_FLAG for achieving multi-bit simultaneous writing in the present invention.

Figure 33B:
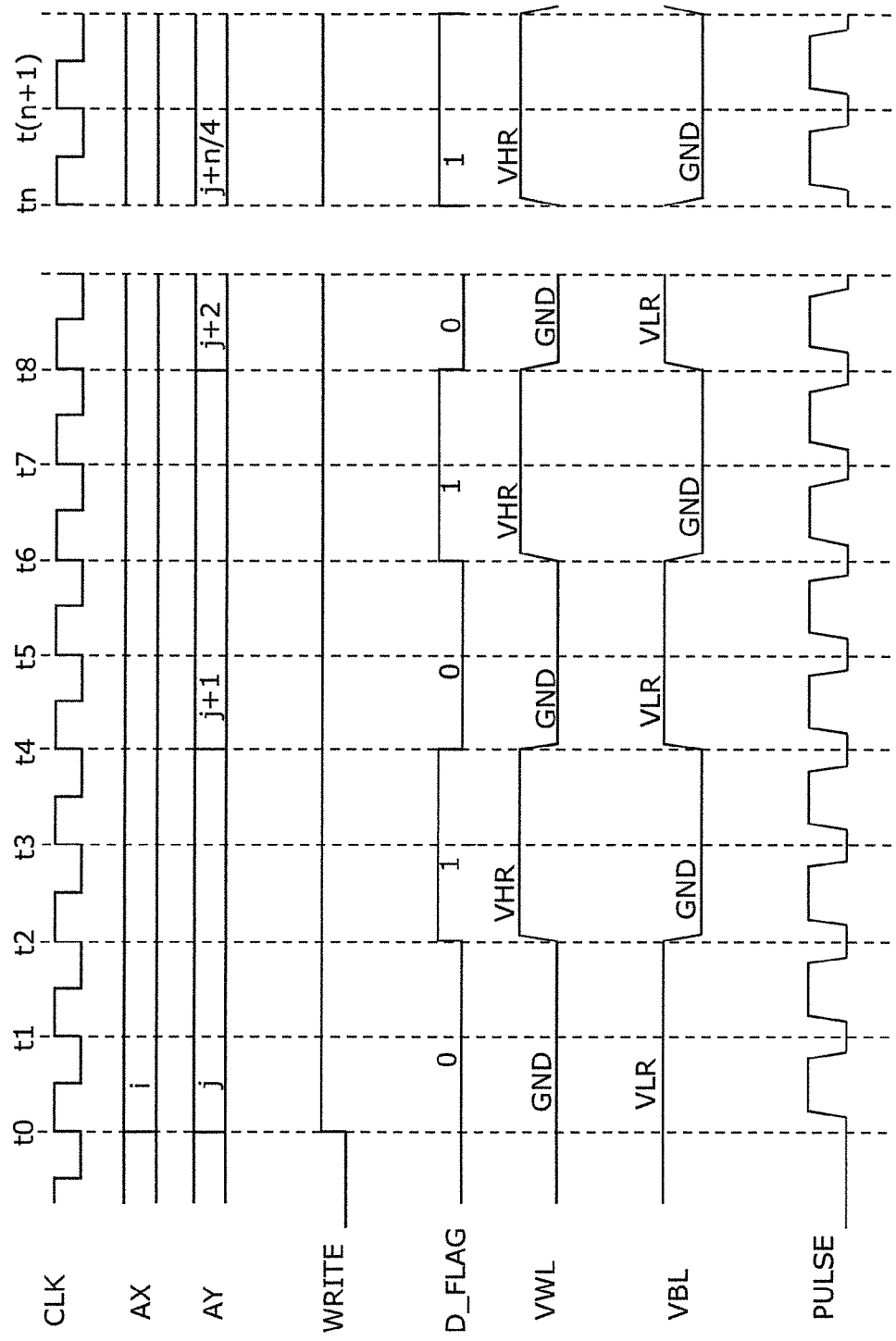

FIG. 33B is a sequence diagram (double cycle) for showing generation of D_FLAG for achieving multi-bit simultaneous writing in the present invention.

Figure 33C:
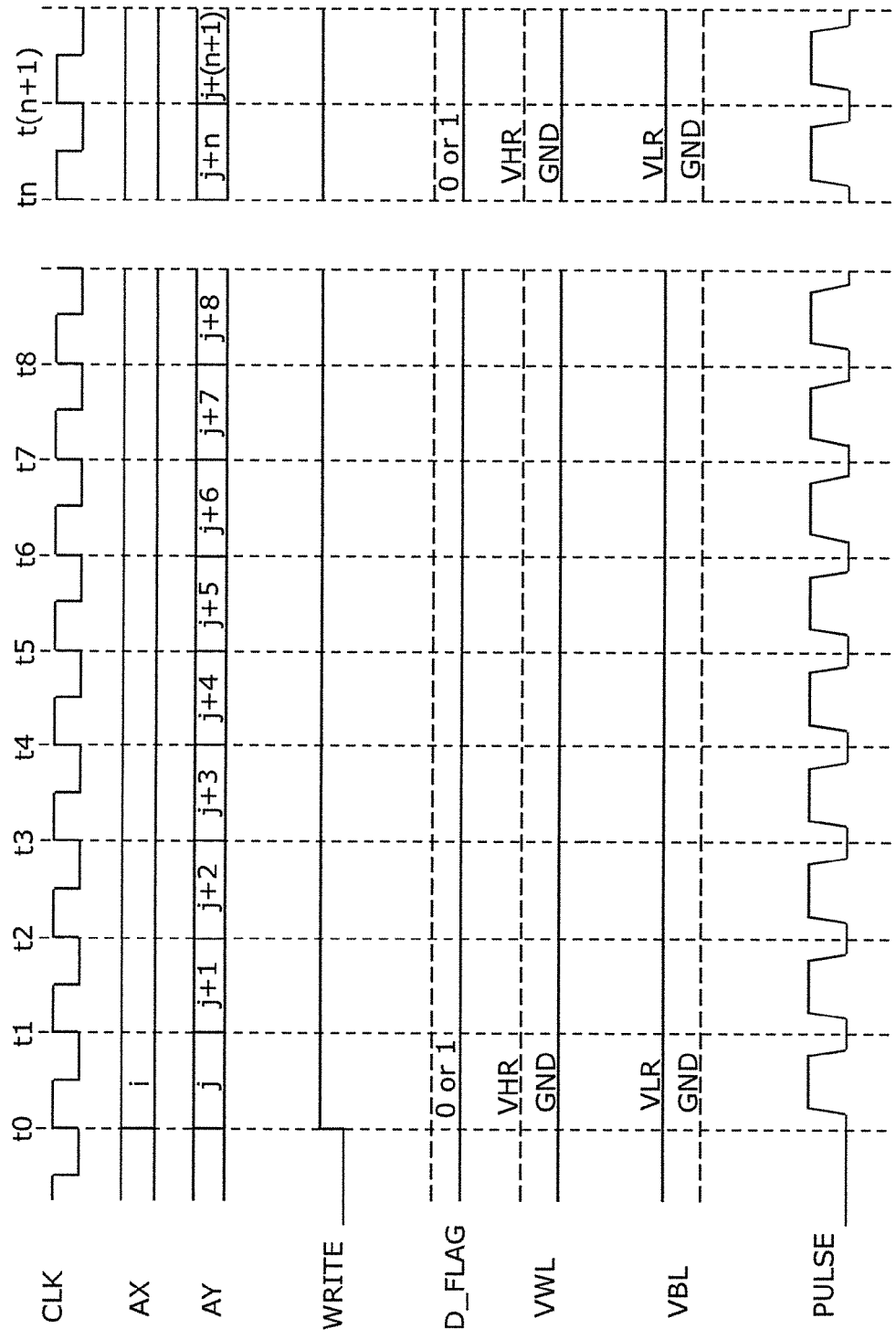

FIG. 33C is a sequence diagram (triple cycle) for showing generation of D_FLAG for achieving multi-bit simultaneous writing in the present invention.

Figure 34:
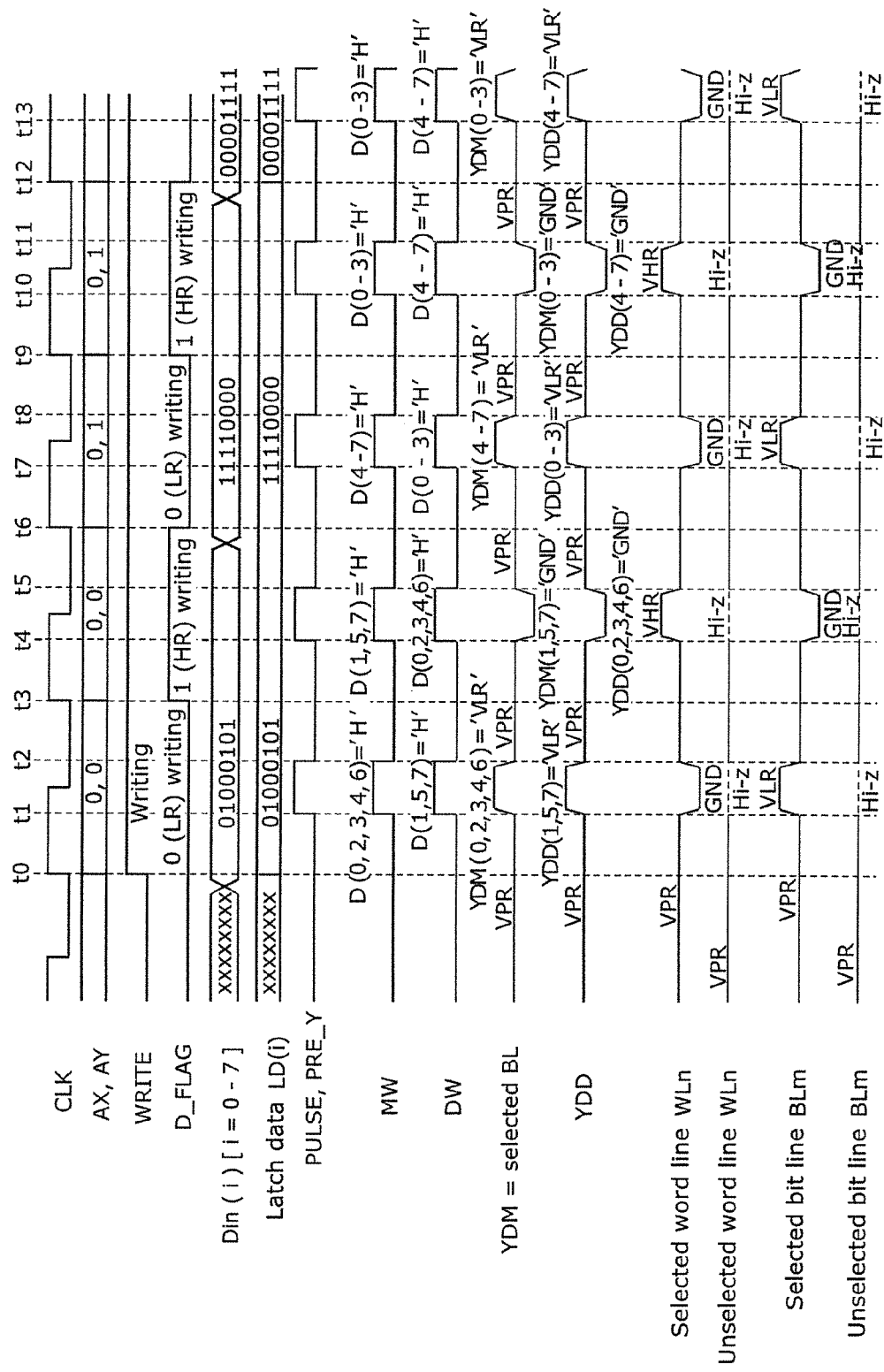

FIG. 34 is a sequence diagram for multi-bit simultaneous writing ("0" writing and "1" writing) in the present invention.

Figure 35:
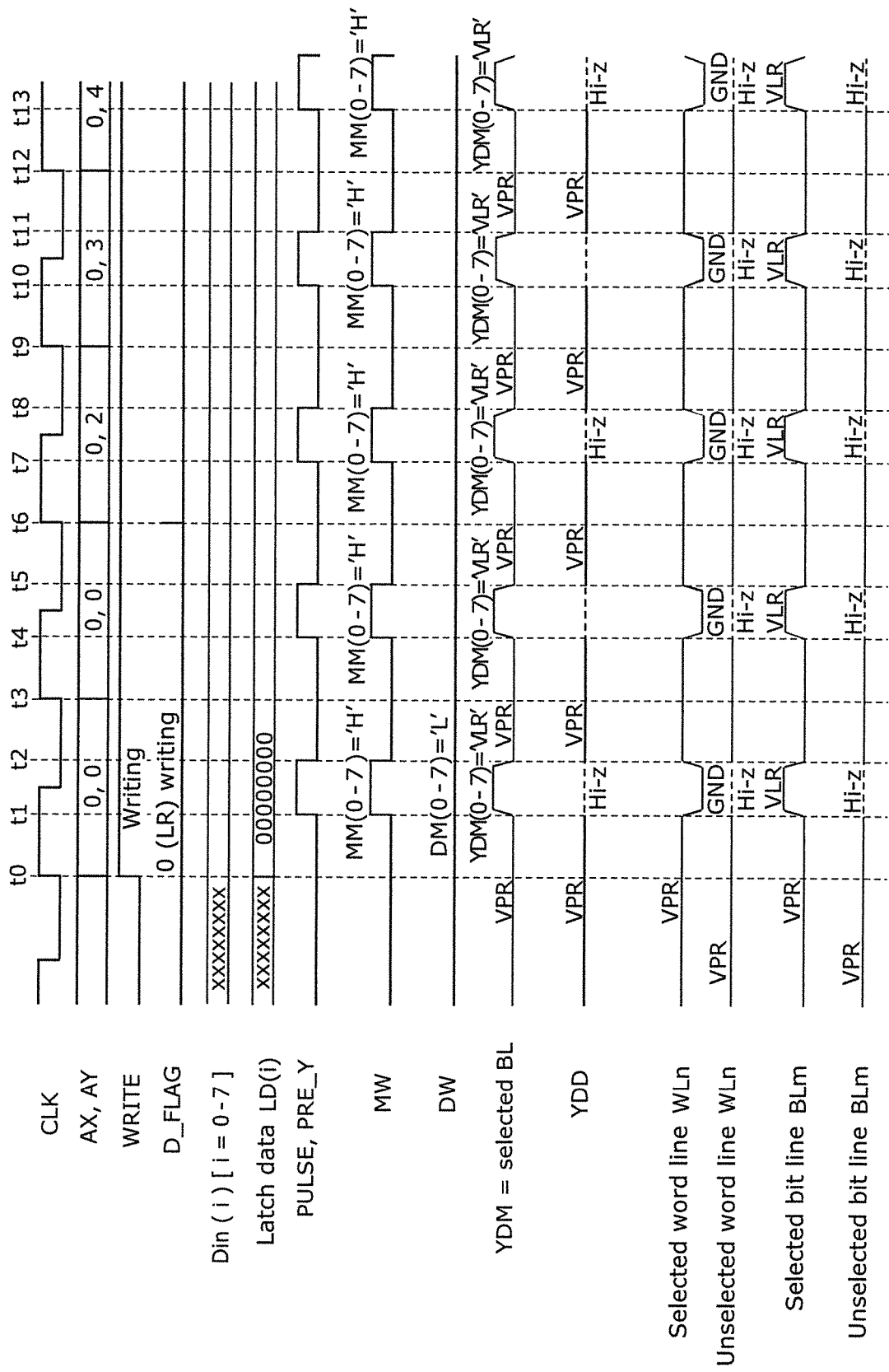

FIG. 35 is a sequence diagram for multi-bit simultaneous writing (LR writing of all bits) in the present invention.

Figure 36:
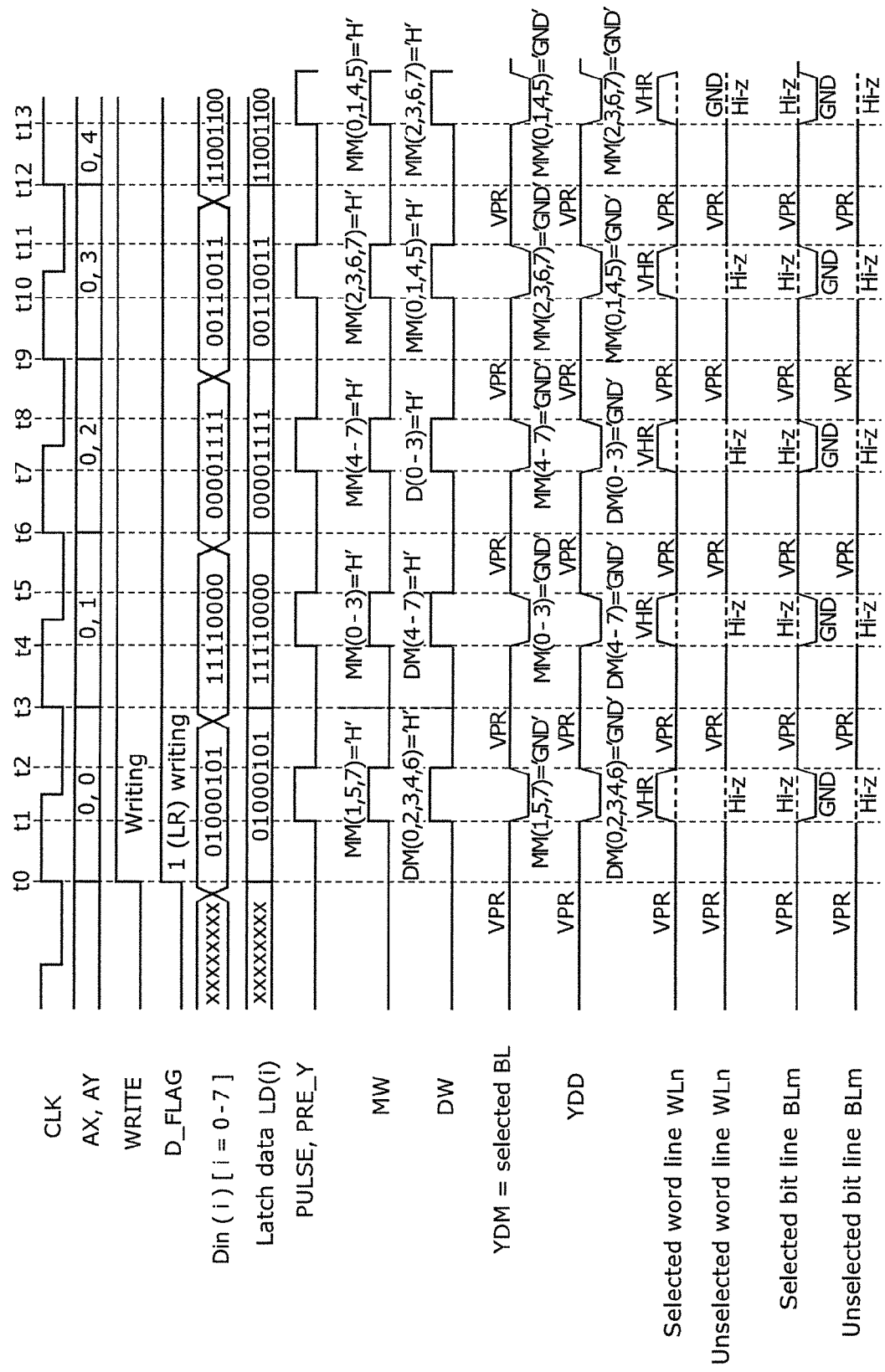

FIG. 36 is a sequence diagram for multi-bit simultaneous writing (only the one piece of data) in the present invention.

Figure 37:
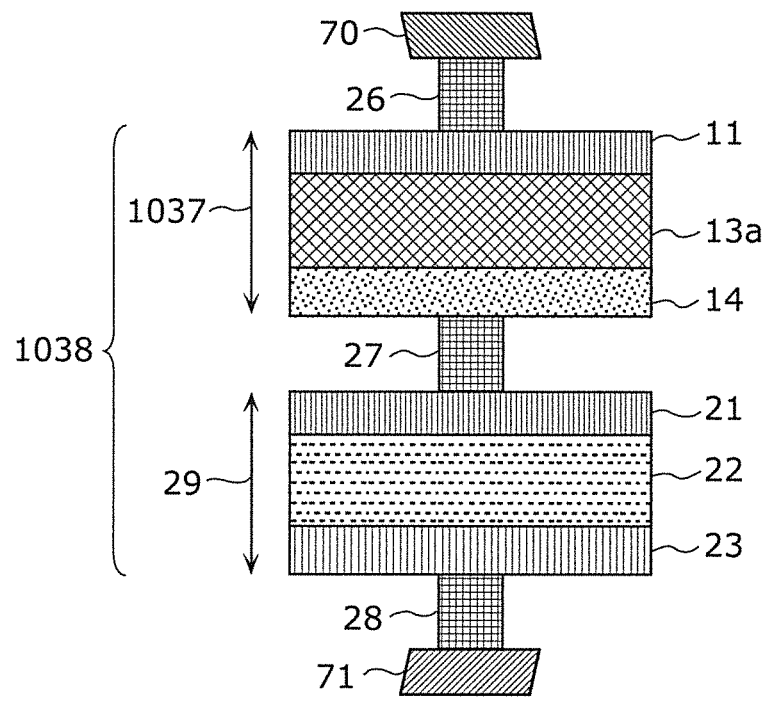

FIG. 37 is a cross-section diagram showing a pseudo memory cell having a fixed resistance element.

Figure 38:
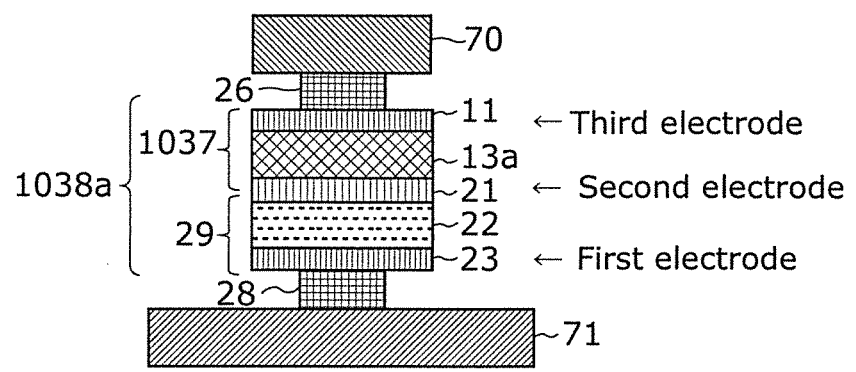

FIG. 38 is a cross-section diagram showing another pseudo memory cell having a fixed resistance element.

Figure 39:
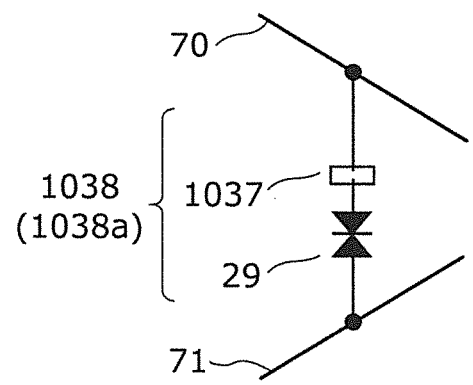

FIG. 39 is an equivalent circuit diagram showing a pseudo memory cell having a fixed resistance element.

Figure 40:
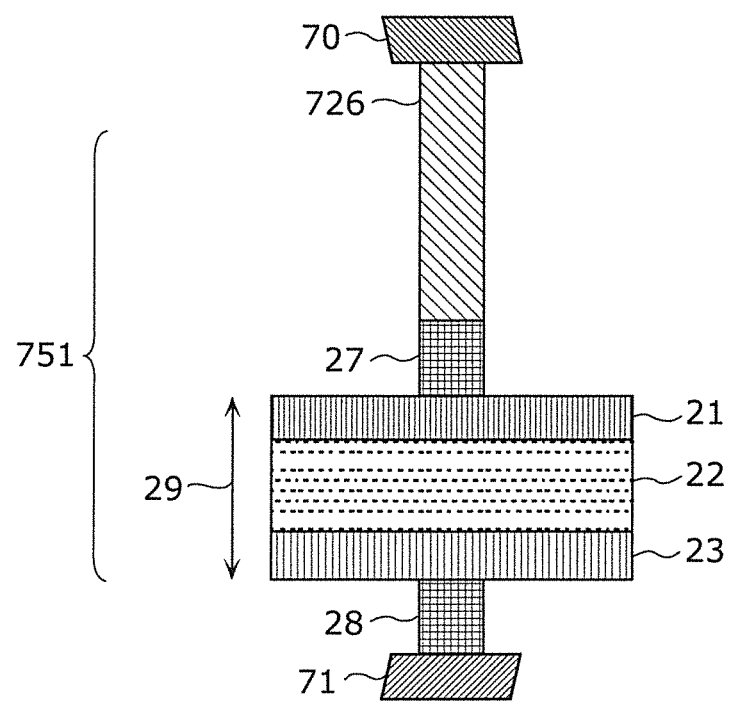

FIG. 40 is a cross-section diagram showing a pseudo memory cell having no resistance element.

Figure 41:
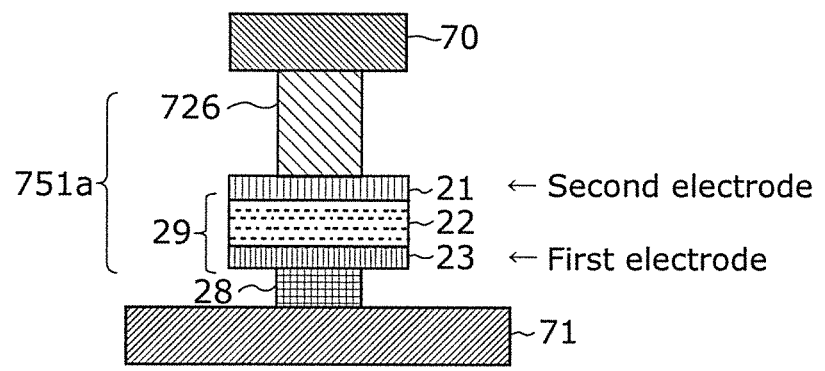

FIG. 41 is a cross-section diagram showing another pseudo memory cell having no resistance element.

Figure 42:
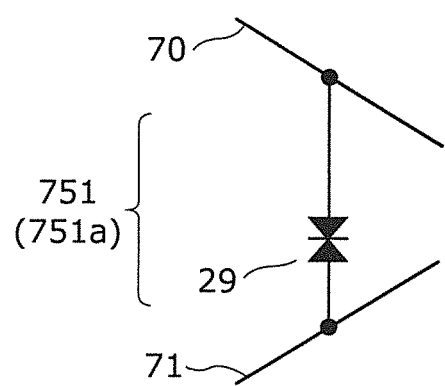

FIG. 42 is an equivalent circuit diagram showing a pseudo memory cell having no resistance element.

DESCRIPTION OF EMBODIMENTS

Summary of the Present Invention

In order to achieve the first object, a cross point variable nonvolatile memory device according to an aspect of the present invention is a cross point variable nonvolatile memory device including a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction three-dimensionally crossing the Y direction, wherein the memory cell array includes first memory cells for data storage, and second memory cells that are connected to one of the N word lines that is connected to the first memory cells, the cross point variable resistance nonvolatile memory device further includes: a word line selection circuit that selects, for the memory cell array, one of the N word lines as a selected word line; a first bit line selection circuit that selects one of the M bit lines of the first memory cells as a first selected bit line; a second bit line selection circuit that selects, among the M bit lines, A (A is an integer larger than or equal to 1) bit line or lines connected to the second memory cells connected to the selected word line, as at least one second selected bit line; a word line write circuit that supplies, to a memory cell selected from among the first memory cells and the second memory cells through the selected word line, (i) a first voltage or a first current, to write to the memory cell by changing the memory cell to the first resistance state, and (ii) a second voltage or a second current, to write to the memory cell by changing the memory cell to the second resistance state; a first bit line write circuit that supplies, to a memory cell selected from among the first memory cells through the first selected bit line selected by the first bit line selection circuit, (i) a third voltage or a third current, to write to the memory cell by changing the memory cell to the first resistance state, and (ii) a fourth voltage or a fourth current, to write to the memory cell by changing the memory cell to the second resistance state; and a second bit line write circuit that supplies, to a memory cell selected from among the second memory cells through the at least one second selected bit line selected by the second bit line selection circuit, (i) the third voltage or the third current, to write to the memory cell by changing the memory cell to the first resistance state, and (ii) the fourth voltage or the fourth current, to write to the memory cell by changing the memory cell to the second resistance state, when the memory cell selected from among the first memory cells is written to by changing the memory cell to the first resistance state, the word line write circuit supplies the first voltage or the first current to the selected word line, the first bit line write circuit supplies the third voltage or the third current to the first selected bit line of the first memory cells, and the second bit line write circuit supplies the third voltage or the third current to the A second selected bit line or lines of the second memory cells, when the memory cell selected from among the first memory cells is written to by changing the memory cell to the second resistance state, the word line write circuit supplies the second voltage or the second current to the selected word line, the first bit line write circuit supplies the fourth voltage or the fourth current to the first selected bit line of the first memory cells, and the second bit line write circuit supplies the fourth voltage or the fourth current to the A second selected bit lines of the second memory cells.

With this, the simultaneous writing is performed on the memory cells at the respective cross points of the one selected word line and the ((A+1)) selected bit lines selected by the first bit line selection circuit and the second bit line selection circuit. Thus, it is possible to reduce a leakage current flowing through unselected memory cells, and achieve high writing efficiency (i.e., reduce a consumption current).

Here, A is a predetermined value. More specifically, A is a value determined depending on M and N, and is equal to M/N−1. In a more limited way, in the memory cell array, when the number of bit lines to be simultaneously selected is B or larger so as to cause a voltage applied to first unselected memory cells to be less than or equal to a predetermined disturbing voltage, the first unselected memory cells being memory cells connected to an unselected word line other than the selected word line and to selected bit lines selected by the first bit line selection circuit and the second bit line selection circuit, and the number of bit lines to be simultaneously selected is C (C is an integer) or less so as to cause a voltage which is applied to second unselected memory cells to be less than or equal to the predetermined disturbing voltage, the second unselected memory cells being memory cells connected to the selected word line and unselected bit lines other than the selected bit lines, the number of bit lines (A+1) to be selected by the first bit line selection circuit and the second bit line selection circuit satisfies B≤(A+1)≤C.

With this, the number of the memory cells simultaneously written is optimized, and thus it is possible to minimize a disturbing influence on the unselected memory cells (an influence of a voltage or the like leading to the possibility of resistance change in variable resistance elements including the unselected memory cells).

It is to be noted that in the memory cell array, the second memory cells selectable by the second bit line selection circuit may include a first memory cell for data storage, that in the memory cell array, the second memory cells selectable by the second bit line selection circuit may include a second memory cell not for data storage, and that the memory cell array may include a first memory cell array including a plurality of first memory cells for data storage, and a second memory cell array including a plurality of second memory cells not for data storage. In either configuration, when attention is focused on the memory cell that is a target of writing and connected to the one bit line selected by the first bit line selection circuit, the disturbing influence on the memory cell at the time of writing is reduced.

Here, as a programming method at the time of writing, selected memory cells may be written to by changing the selected memory cells to the first resistance state, by the word line write circuit supplying the first voltage to the one selected word line, and the first bit line write circuit and the second bit line write circuit supplying the third voltage to the respective selected bit lines, the selected memory cells being at respective cross points of the selected bit lines and the one selected word line; selected memory cells may be written to by changing the selected memory cells to the second resistance state, by the word line write circuit supplying the second voltage to the one selected word line, and the first bit line write circuit and the second bit line write circuit supplying the fourth voltage to the respective selected bit lines, the selected memory cells being at respective cross points of the selected bit lines and the one selected word line; selected memory cells may be written to by changing the selected memory cells to the first resistance state, by the word line write circuit supplying the first voltage to the one selected word line, and the first bit line write circuit and the second bit line write circuit supplying the third current to the respective selected bit lines, the selected memory cells being at respective cross points of the selected bit lines and the one selected word line; and selected memory cells may be written to by changing the selected memory cells to the second resistance state, by the word line write circuit supplying the second voltage to the one selected word line, and the first bit line write circuit and the second bit line write circuit supplying the fourth current to the respective selected bit lines, the selected memory cells being at respective cross points of the selected bit lines and the one selected word line.

It is to be noted that when a variable resistance element including a memory cell changes from the high resistance state to the low resistance state, a resistance value of the variable resistance element in the low resistance state is determined depending on magnitude of a current flowing through the variable resistance element. Thus, in particular, by writing to the memory cell by applying a constant current to the memory cell, it is possible to set the resistance value of the variable resistance element in the low resistance state to be a desired value.

Moreover, the memory cell array may be a multilayer cross point memory cell array including layers stacked in a Z direction orthogonal to the X direction and the Y direction, the layers each including memory cells placed at respective cross points of bit lines and word lines, and the first bit line selection circuit and the second bit line selection circuit may select bit lines belonging to a same layer as selected bit lines, and the word line selection circuit selects, as a selected word line, one word line belonging to a layer adjacent in the Z direction to the layer to which the selected bit lines belong.

With this, writing having the high writing efficiency (the low consumption current) is performed on the cross point variable nonvolatile memory device including the large-scale memory cell array, and a nonvolatile memory device having large storage capacity is achieved.

It is to be noted that, preferably, the word line selection circuit puts, among the N word lines, unselected word lines into a high impedance state, and the first bit line selection circuit and the second bit line selection circuit put unselected bit lines into the high impedance state.

Moreover, in order to achieve the second object, a cross point variable nonvolatile memory device according to another aspect of the present invention is a cross point variable nonvolatile memory device including a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction three-dimensionally crossing the Y direction, wherein the memory cell array includes first memory cells for data storage, and second memory cells that are connected to one of the N word lines that is connected to the first memory cells, the cross point variable resistance nonvolatile memory device further includes: a word line selection circuit that selects, for the memory cell array, one of the N word lines as a selected word line; a first bit line selection circuit that selects one of the M bit lines of the first memory cells as a first selected bit line; a second bit line selection circuit that selects, among the M bit lines, A (A is an integer larger than or equal to 1) bit line or lines connected to the second memory cells connected to the selected word line, as at least one second selected bit line; a word line read voltage generation circuit that supplies a fifth voltage to a memory cell selected from among the first memory cells and the second memory cells through the selected word line, to read stored data from the memory cell; a first read circuit that supplies a sixth voltage or a sixth current to a memory cell selected from among the first memory cells through the first selected bit line selected by the first bit line selection circuit, to read stored data from the memory cell; and a second read circuit that supplies the sixth voltage or the sixth current to a memory cell selected from among the second memory cells through the A second selected bit line or lines selected by the second bit line selection circuit, to read stored data from the memory cell, when the memory cell selected from among the first memory cells and the second memory cells is read, the word line read voltage generation circuit supplies the fifth voltage to the selected word line, the first read circuit supplies the sixth voltage or the sixth current to the first selected bit line of the first memory cells, and the second read circuit supplies the sixth voltage or the sixth current to the A second selected bit line or lines of the second memory cells.

With this, simultaneous reading is performed on the memory cells at the respective cross points of the one selected word line and the selected bit lines selected by the first bit line selection circuit and the second bit line selection circuit, thereby enabling stable reading in which a leakage current flowing through unselected memory cells is reduced.

Here, as a programming method at the time of reading, the first read circuit and the second read circuit may simultaneously read from selected memory cells at respective cross points of the one selected word line and the first selected bit line and the at least one second selected bit line, by supplying the sixth voltage to the first selected bit line and the at least one second selected bit line, and the first read circuit and the second read circuit may simultaneously read from selected memory cells at respective cross points of the one selected word line and the first selected bit line and the at least one second selected bit line, by supplying the sixth current to the first selected bit line and the at least one second selected bit line.

It is to be noted that the present invention is realized not only as such cross point variable resistance nonvolatile memory devices, but also as a method of writing (a multi-bit simultaneous writing method) for a cross point variable resistance nonvolatile memory device or a method of reading (a multi-bit simultaneous reading method) for a cross point variable nonvolatile memory device.

Furthermore, in order to achieve the third object, a cross point variable nonvolatile memory device according to still another aspect of the present invention is a cross point variable nonvolatile memory device including: a plurality of divided memory cell arrays each including: a data memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics; and a compensation memory cell array including dummy cells each at least including the bidirectional current steering element having the nonlinear current-voltage characteristics, the memory cells being placed at respective cross points of M (M is an integer) bit lines extending in a Y direction and N (N is an integer) word lines extending in an X direction three-dimensionally crossing the Y direction, and the dummy cells being placed at respective cross points of the N (N is an integer) word lines and at least one bit line extending in the Y direction; a first bit line selection circuit that selects one of the M bit lines of the data memory cell array included in each of the divided memory cell arrays; a second bit line selection circuit that selects one of the at least one bit line of the compensation memory cell array included in each of the divided memory cell arrays; and a write circuit that performs writing on the data memory cell array included in each of the divided memory cell arrays, by changing the data memory cell array to the first resistance state or the second resistance, according to write data of a plurality of bits inputted from the outside, wherein the write circuit includes: a write register that outputs a data input signal instructing writing by changing to the first resistance state or writing by changing to the second resistance state, to each of the divided memory cell arrays, according to the write data; a write data flag generating circuit that generates a write data flag instructing which of the writing by changing to the first resistance state and the writing by changing to the second resistance state is to be simultaneously performed on the divided memory cell arrays; and a data/compensation selection circuit that performs writing on each of the divided memory cell arrays based on the data input signal and the write data flag, by selecting the first bit line selection circuit or the second bit line selection circuit to operate, the data/compensation selection circuit performs, for each of the divided memory cell arrays: writing on the data memory cell array of the divided memory cell array by selecting the first bit line selection circuit to operate, when the data input signal for the divided memory cell array instructs the writing by changing to the first resistance state and the write data flag instructs the writing by changing to the first resistance state; writing on the data memory cell array of the divided memory cell array by selecting the first bit line selection circuit to operate, when the data input signal for the divided memory cell array instructs the writing by changing to the second resistance state and the write data flag instructs the writing by changing to the second resistance state; writing on the compensation memory cell array of the divided memory cell array by selecting the second bit line selection circuit to operate, when the data input signal for the divided memory cell array instructs the writing by changing to the first resistance state and the write data flag instructs the writing by changing to the second resistance state; and writing on the compensation memory cell array of the divided memory cell array by selecting the second bit line selection circuit to operate, when the data input signal for the divided memory cell array instructs the writing by changing to the second resistance state and the write data flag instructs the writing by changing to the first resistance state.

With this, one of the memory cell in the data memory cell array and the memory cell in the compensation memory cell array is selected and written to for each divided memory cell array, thereby performing the simultaneous writing on as many memory cells as the number of the divided memory cell arrays and reducing a leakage current flowing through unselected memory cells.

Moreover, since each of bits included in write data is associated with a corresponding one of the divided memory cell arrays, and a write destination (the data memory cell array/compensation memory cell array) in each divided memory cell array is selected and written to according to a value of each write bit by a decoding scheme on a column basis, damage to a memory cell caused by frequently writing to a specific compensation memory cell is avoided, and the need for a complex circuit is eliminated which calculates the number of bits written in the compensation memory cell array depending on the number of the bits having "1 (or 0)" included in the write data. Thus, this also provides an advantageous effect of performing writing with a simple circuit while the damage to the memory cell is reduced.

Here, the dummy cells each may not only include the memory cell including (i) the variable resistance element that reversibly changes at least between the first resistance state and the second resistance state when the voltages having the different polarities are applied to the variable resistance element and (ii) the bidirectional current steering element that is connected in series with the variable resistance element and has the nonlinear current-voltage characteristics, but also may include a fixed resistance element and the current steering element connected in series with the fixed resistance element. With this, the need for forming of the dummy cells included in the compensation memory cell array is eliminated, and a concern that repetition of a writing operation decreases reliability is removed.

Furthermore, as a shape of the data memory cell array, in the data memory cell array included in each of the divided memory cell arrays, M is preferably equal to N. With this, an applied voltage to the unselected memory cells connected to the selected word line in the divided memory cell array and an applied voltage to the unselected memory cells connected to the selected bit lines are made substantially equally uniform, and thus the disturbing influence at the time of writing is minimized.

Moreover, as a method for generating a write data flag, the write data flag generating circuit may generate the write data flag by dividing a basic clock that is inputted from the outside and controls writing. Specifically, the cross point variable resistance nonvolatile memory further includes a write/read selection circuit that outputs a write signal instructing a write mode or a read mode for the divided memory cell arrays, wherein the write data flag generating circuit may start to generate the write data flag when the write signal instructs the write mode, the write data flag generating circuit may stop generating the write data flag when an instruction of the write signal changes from the write mode to the read mode, when not performing writing on, among the divided memory cell arrays, a predetermined divided memory cell array by changing the predetermined divided memory cell array to the first resistance state and the second resistance state, the write circuit may perform writing on the compensation memory cell array included in the predetermined divided memory cell array, by changing the compensation memory cell array to the first resistance state and the second resistance state, and when performing writing on, among the divided memory cell arrays, a predetermined divided memory cell array by changing the predetermined divided memory cell array to the first resistance state and the second resistance state, the write circuit may perform writing on the data memory cell array included in the predetermined divided memory cell array, by changing the data memory cell array to the first resistance state and the second resistance state. With this, it is possible to surely perform two-stage writing including "0" writing and "1" writing, when the data including the bits is written.

Furthermore, as for the compensation memory cell array, the second bit line selection circuit may always select the at least one bit line of the compensation memory cell array. For instance, when the number of the bit lines of the compensation memory cell array is one, the one bit line may be always selected. With this, the second bit line selection circuit is simplified.

Moreover, as for the selection of the data memory cell array or the compensation memory cell array, the write circuit further includes a data/compensation selection control circuit that outputs, to the data/compensation selection circuit, a data memory cell array selection signal instructing to select a data memory cell array, and the data/compensation selection control circuit may select the data memory cell array while the data/compensation selection control circuit is outputting the data memory cell array selection signal, or the write circuit further includes a data/compensation selection control circuit that outputs, to the data/compensation selection circuit, a compensation memory cell array selection signal instructing to select a compensation memory cell array, and the data/compensation selection control circuit may select the compensation memory cell array while the data/compensation selection control circuit is outputting the compensation memory cell array selection signal. With this, it is possible to forcibly access the data memory cell array or the compensation memory cell array regardless of the write data and the write data flag, and perform forming, various tests, or the like on the memory cell.

Furthermore, as for application of a voltage/current to a word line and a bit line, the cross point variable resistance nonvolatile memory device further includes: a word line selection circuit that selects, for the divided memory cell arrays, one of the N word lines; and a write voltage generation circuit that supplies, to the divided memory cell arrays through the word line selected by the word line selection circuit, (i) a first voltage or a first current when writing is performed on the divided memory cell arrays by changing the divided memory cell arrays to the first resistance state, and (ii) a second voltage or a second current when writing is performed on the divided memory cell arrays by changing the divided memory cell arrays to the second resistance state is performed, wherein the write voltage generation circuit may supply: the first voltage or the first current to the selected word line through the word line selection circuit when the write data flag instructs the writing by changing to the first resistance state; and the second voltage or the second current to the selected word line through the word line selection circuit when the write data flag instructs the writing by changing to the second resistance state, or the cross point variable resistance nonvolatile memory device further includes a write voltage generation circuit that supplies a voltage or a current for writing, to the divided memory cell arrays through the first bit line selection circuit and the second bit line selection circuit, wherein the write voltage generation circuit may supply: a third voltage or a third current to the one selected bit line through the first bit line selection circuit and the second bit line selection circuit when the write data flag instructs the writing by changing to the first resistance state; and a fourth voltage or a fourth current to the one selected bit line through the first bit line selection circuit and the second bit line selection circuit when the write data flag instructs the writing by changing to the second resistance state. With this, the memory cell at the cross point of the word line and the bit line is written to by changing the memory cell to the first/second resistance state when the voltage or the current is applied to the memory cell.

Moreover, as another example of a write sequence, the cross point variable resistance nonvolatile memory device may write to all the memory cells of the data memory cell array through a two-staged write operation in which: to write to all the memory cells of the data memory cell array by changing the memory cells to the first resistance state, the write register sets and outputs a signal instructing the writing by changing to the first resistance state as the data input signal, the write data flag generating circuit sets and outputs a signal instructing the writing by changing to the first resistance state as the write data flag, the data/compensation selection circuit selects the data memory cell array based on the data input signal and the write data flag, and sequentially writes to all the memory cells of the data memory cell array by changing the memory cells to the first resistance state; and subsequently, to write to a predetermined memory cell of the data memory cell array by changing the predetermined memory cell to the second resistance state, the write register sets and outputs, for the predetermined memory cell, a signal instructing the writing by changing to the second resistance state as the data input signal, the write data flag generating circuit sets and outputs a signal instructing the writing by changing to the second resistance state as the data write flag, and the data/compensation selection circuit selects the data memory cell array for the predetermined memory cell, based on the data input signal and the write data flag, and sequentially writes to only the predetermined memory cell of the data memory cell array by changing the predetermined memory cell to change to the second resistance state. With this, it is possible to follow a write procedure such as writing "1" according to given input data after "0" is written to all memory regions, and to perform efficient writing on a block basis.

It is to be noted that, preferably, the first bit line selection circuit puts, among the M bit lines, unselected bit lines into a high impedance state, and the second bit line selection circuit puts, among the at least one bit line, unselected bit lines into the high impedance state.

As described above, with the simple configurations of the cross point variable resistance nonvolatile memory devices in the present invention, it is possible to easily realize a multi-bit simultaneous writing method that achieves high writing efficiency resulting from reduction in leakage current flowing through unselected memory cells.

It is to be noted that the present invention is realized not only as such cross point variable resistance nonvolatile memory devices, but also as a method of writing (the multi-bit simultaneous writing method) for use in a cross point variable resistance nonvolatile memory device.

(Underlying Knowledge Forming Basis of the Present Invention)

Before describing embodiments of the present invention, the following describes underlying technology and knowledge forming the basis of the present invention.

First, a structure and characteristics of memory cells included in a cross point memory cell array are described.

Figure 1B:
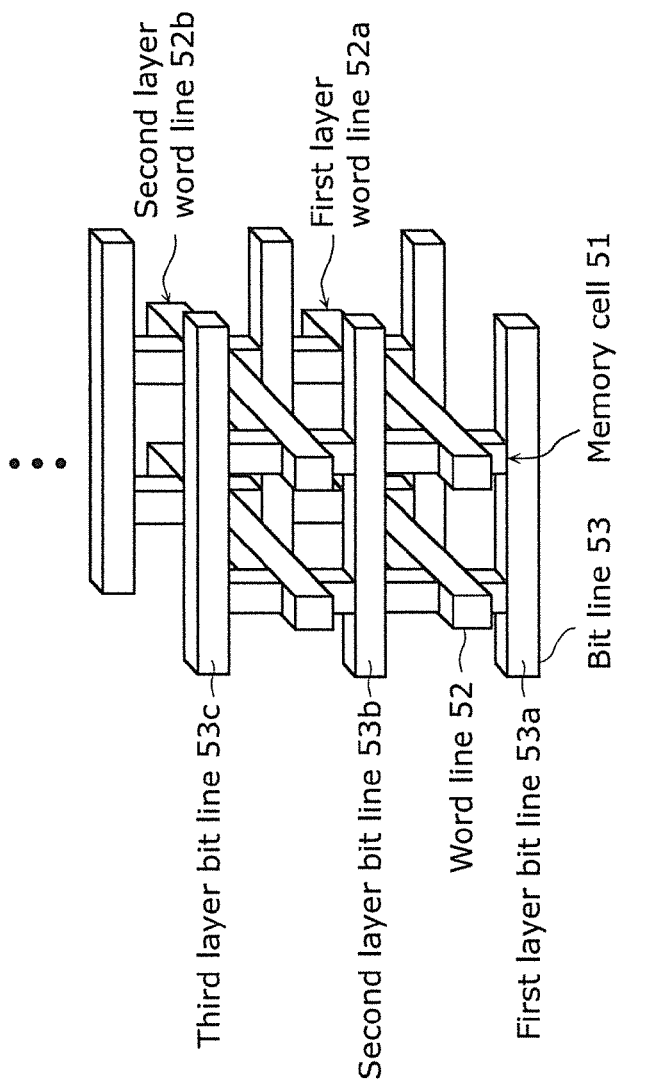
FIG. 1B is a diagram showing a three-dimensional structure of a multilayer cross point memory cell array.
Figure 1A:
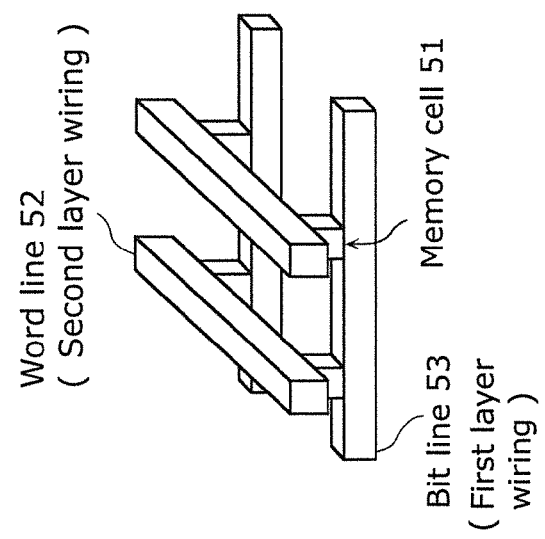
FIG. 1A is a diagram showing a three-dimensional structure of a single-layer cross point memory cell array.

FIG. 1A is a diagram showing a three-dimensional structure of a single-layer cross point memory cell array. Specifically, FIG. 1A shows: memory cells 51; word lines 52 (e.g., second layer wirings) that are arranged in a direction (e.g., X direction) and in parallel with each other; and bit lines 53 (e.g., first layer wirings) that are arranged in a direction (e.g., Y direction) and in parallel with each other so as to be orthogonal to the word lines 52. Each of the memory cells 51 is placed at a different one of cross points of the word lines 52 and the bit lines 53 so as to be provided between a corresponding one of the word lines 52 and a corresponding one of the bit lines 53.

FIG. 1B is a diagram showing a three-dimensional structure of a multilayer cross point memory cell array. Specifically, FIG. 1B shows a multilayer structure including stacked layers in which: bit lines 53 (first layer bit lines 53a) are placed in a first wiring layer; word lines 52 (first layer word lines 52a) are placed in a second wiring layer above the first wiring layer so as to be orthogonal to the bit lines 53; bit lines 53 (second layer bit lines 53b) are placed in a third wiring layer above the second wiring layer so as to be orthogonal to the word lines 52; word lines 52 (second layer word lines 52b) are placed in a fourth wiring layer above the third wiring layer so as to be orthogonal to the bit lines 53; and bit lines 53 (third layer bit lines 53c) are placed in a fifth wiring layer above the fourth wiring layer so as to be orthogonal to the word lines 52. Each memory cell 51 is placed at a different one of cross points of the word lines 52 and the bit lines 53 so as to be provided between a corresponding one of the word lines 52 and a corresponding one of the bit lines 53.

Thus, a cross point memory cell array achieves a reduction in memory cell area per unit area without relying on a miniaturization process, by vertically (in Z direction) stacking simple structures in each of which memory cells are formed at cross points of wires. Hence the cross point memory cell array is known as a structure suitable for high integration.

The following describes problems newly found when structuring a cross point memory cell array.

[Structure of Memory Cell]

Figure 2:
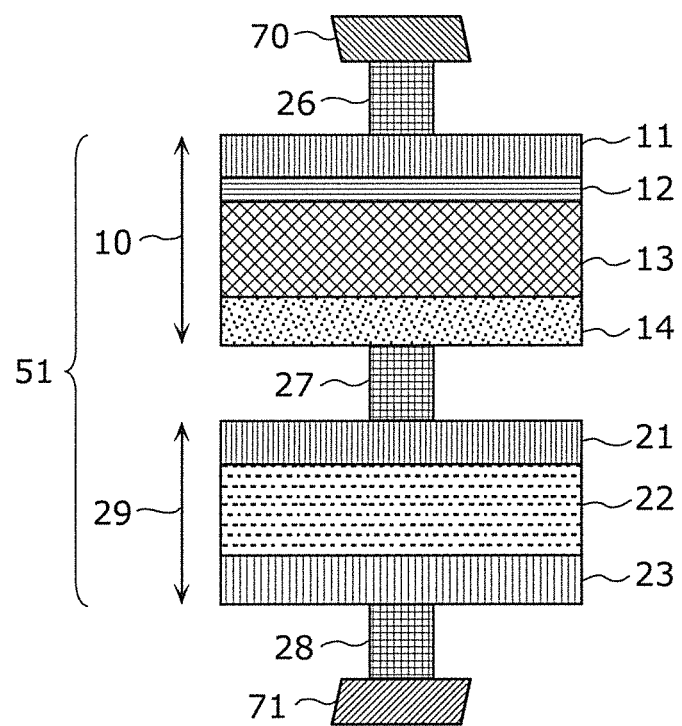
FIG. 2 is a diagram showing a cross-section of a memory cell.

FIG. 2 is a diagram showing a cross-section of a memory cell 51 used for a cross point memory cell array.

The memory cell 51 is a 1-bit memory cell including a variable resistance element 10 and a current steering element 29 that are connected in series with each other.

The variable resistance element 10 has the following structure. Oxygen-deficient first tantalum oxide ($TaO_x$, $0<x<2.5$) is formed on a lower electrode 14 comprising, for instance, tantalum nitride (TaN), as a first variable resistance layer 13 (a first metal oxide layer). An upper interface of the first variable resistance layer 13 is irradiated with oxygen plasma at 300° C. and 200 W for 20 seconds, thereby forming a thin second variable resistance layer 12 (a second metal oxide layer) comprising $TaO_y$ ($x<y$) having an oxygen concentration higher than that of $TaO_x$ of the first variable resistance layer 13. An upper electrode 11 comprising platinum (Pt) is formed on the second variable resistance layer 12. The term "oxygen-deficient" means a composition state of a metal oxide that is lower in oxygen content than a metal oxide having a stoichiometric composition typically exhibiting an insulating property, and exhibits a semiconducting electric property. The upper electrode 11 that is an electrode in contact with the second variable resistance layer 12 comprises platinum (Pt). The upper electrode 11 that is the electrode in contact with the second variable resistance layer 12 comprises a material having a standard electrode potential higher than those of tantalum (Ta) comprised in the second variable resistance layer 12

(here, a tantalum oxide) and of tantalum nitride (TaN) comprised in the lower electrode 14.

In such a structure, a resistance change occurs in the second variable resistance layer 12 that is in contact with the upper electrode 11 comprising platinum (Pt) and comprises $TaO_y$, having a higher oxygen concentration, the variable resistance element 10 is changed into a high resistance state when a voltage of the upper electrode 11 that is increased to a predetermined voltage or more relative to a voltage of the lower electrode 14 is applied to the variable resistance element 10, and conversely the variable resistance element 10 is changed into a low resistance state when a voltage of the lower electrode 14 that is increased to a predetermined voltage or more relative to a voltage of the upper electrode 11 is applied to the variable resistance element 10. In the second variable resistance layer of the variable resistance element, a tiny localized region of which degree of oxygen deficiency reversibly changes due to application of electrical pulse. The localized region is thought to contain a filament including an oxygen-deficient site.

The term "degree of oxygen deficiency" refers to a proportion of deficient oxygen to an amount of oxygen of an oxide having a stoichiometric composition (a stoichiometric composition having the highest resistance value when stoichiometric compositions are present) of a metal oxide. A metal oxide having a stoichiometric composition has a resistance value that is more stable and higher than those of metal oxides having other compositions.

For example, when a metal is tantalum (Ta), an oxide having a stoichiometric composition according to the above definition is $Ta_2O_5$, which can be expressed as $TaO_{2.5}$. A degree of oxygen deficiency of $TaO_{2.5}$ is 0%, and a degree of oxygen deficiency of $TaO_{1.5}$ is calculated as a degree of oxygen deficiency=$(2.5-1.5)/2.5$=40%. Moreover, an oxygen-excess metal oxide has a negative value of a degree of oxygen deficiency. It is to be noted that in the Description, unless otherwise specifically noted, the degree of oxygen deficiency includes a positive value, 0, and a negative value.

An oxide having a low degree of oxygen deficiency has a high resistance value because such an oxide is more similar to an oxide having a stoichiometric composition, and an oxide having a high degree of oxygen deficiency has a low resistance value because such an oxide is more similar to a metal included in an oxide.

The term "oxygen content atomic percentage" refers to a ratio of oxygen atoms to a total number of atoms. For instance, an oxygen content atomic percentage of $Ta_2O_5$ is calculated according to a ratio of oxygen atoms to a total number of atoms (O/(Ta+O)), that is, 71.4 atm %. Thus, an oxygen-deficient tantalum oxide has an oxygen content atomic percentage greater than 0 and less than 71.4 atm %. For example, when a metal comprised in the first metal oxide layer and a metal comprised in the second metal oxide layer are of the same type, an oxygen content atomic percentage has a correspondence relationship with a degree of oxygen deficiency. In other words, when the second metal oxide has an oxygen content atomic percentage smaller than that of the first metal oxide, the second metal oxide has a degree of oxygen deficiency lower than that of the first metal oxide.

A variable resistance layer may comprise a metal other than tantalum. A transition metal or aluminum (Al) may be used as the metal comprised in the variable resistance layer. Tantalum (Ta), titanium (Ti), hafnium (Hf), zirconium (Zr), niobium (Nb), tungsten (W), nickel (Ni), or the like may be used as the variable resistance layer. Since the transition metal can take a plurality of oxidation states, this can provide different resistance states by an oxidation-reduction reaction.

For instance, a resistance value of the variable resistance layer can be stably changed at high speed in the case where a hafnium oxide is used so that the first metal oxide has a composition expressed as $HfO_x$ and the second metal oxide has a composition expressed as $HfO_y$, where x is between 0.9 and 1.6 inclusive and y is larger than x in value. In this case, the second metal oxide may have a film thickness from 3 nm to 4 nm.

Moreover, a resistance value of the variable resistance layer can be stably changed at high speed in the case where a zirconium oxide is used so that the first metal oxide has a composition expressed as $ZrO_x$ and the second metal oxide has a composition expressed as $ZrO_y$, where x is between 0.9 and 1.4 inclusive and y is larger than x in value. In this case, the second metal oxide may have a film thickness from 1 nm to 5 nm.

A first metal comprised in the first metal oxide and a second metal comprised in the second metal oxide may be different in material from each other. In this case, the second metal oxide has a degree of oxygen deficiency lower than that of the first metal oxide, that is, may have a high resistance. With this configuration, a voltage applied between a first electrode and a second electrode when a resistance change occurs is divided more to the second metal oxide, which causes the oxidation-reduction reaction to easily occur in the second metal oxide.

Moreover, when the first metal comprised in the first metal oxide that is to be the first variable resistance layer and the second metal comprised in the second metal oxide that is to be the second variable resistance layer are different in material from each other, the second metal may have a standard electrode potential lower than that of the first metal. The standard electrode potential having a larger value represents a property of being more difficult to oxidize. Accordingly, the oxidation-reduction reaction is prone to occur in the second metal oxide having a relatively low standard electrode potential. Here, it is considered that in a resistance change phenomenon, the oxidation-reduction reaction in the tiny localized region formed in the second metal oxide having a high resistance changes the filament (conductive path), thereby changing a resistance value (a degree of oxygen deficiency) of the second metal oxide layer.

For instance, a stable resistance change operation is achieved by using an oxygen-deficient tantalum oxide ($TaO_x$) for the first metal oxide and a titanium oxide ($TiO_2$) for the second metal oxide. Titanium (with the standard electrode potential=−1.63 eV) is a material having a standard electrode potential lower than that of tantalum (with the standard electrode potential=−0.6 eV). As above, the oxidation-reduction reaction is more prone to occur in the second metal oxide when a metal oxide having a standard electrode potential lower than that of the first metal oxide is used for the second metal oxide. As another combination, an aluminum oxide ($Al_2O_3$) may be used for the second metal oxide layer that is to be a high resistance layer. For example, the oxygen-deficient tantalum oxide ($TaO_x$) may be used for the first metal oxide layer, and the aluminum oxide ($Al_2O_3$) may be used for the second metal oxide layer.

It is considered that in the resistance change phenomenon in a variable resistance layer having a stack structure, the oxidation-reduction reaction in the tiny localized region formed in the second metal oxide having a high resistance changes the filament (conductive path) in the localized region, thereby changing a resistance value of the second metal oxide.

To put it another way, when a positive voltage is applied to the second electrode connected to the second metal oxide with reference to the first electrode, oxygen ions in the variable resistance layer are attracted toward the second metal oxide. With this, oxidation reaction occurs in the tiny localized region formed in the second metal oxide, and the degree of oxygen deficiency is reduced. As a result, it is considered that it becomes more difficult to maintain a connection to the filament in the localized region, and the resistance value increases.

In contrast, when a negative voltage is applied to the second electrode connected to the second metal oxide with reference to the first electrode, the oxygen ions in the second metal oxide are thrust towards the first metal oxide. With this, reduction reaction occurs in the tiny localized region formed in the second metal oxide, and the degree of oxygen deficiency is increased. As a result, it is considered that it becomes easier to get a connection to the filament in the localized region, and the resistance value decreases.

The current steering element 29 is a diode element having nonlinear current-voltage characteristics in both positive and negative directions of an applied voltage, and is formed by, for instance, providing a current steering layer 22 comprising nitrogen-deficient silicon nitride between a lower electrode 23 and an upper electrode 21 comprising tantalum nitride (TaN) or the like. The bidirectional nonlinear current-voltage characteristics are such characteristics of the current steering element 29 that is in a high resistance (OFF) state in a predetermined voltage range where an applied voltage is a predetermined voltage and that is in a low resistance (ON) state in a range outside the predetermined voltage range (i.e., a voltage range higher or lower than the predetermined voltage range). That is, the current steering element 29 is in the high resistance (OFF) state when the applied voltage has an absolute value less than or equal to a predetermined value, and is in the low resistance (ON) state when the applied voltage has an absolute value greater than the predetermined value.

The memory cell 51 is a memory cell formed by connecting the variable resistance element 10 and the current steering element 29 in series by a via 27. The upper electrode 11 of the variable resistance element 10 is connected to an upper wire 70 (corresponding to one of a bit line 53 and a word line 52 and made of aluminum (Al) here) by a via 26. Moreover, the lower electrode 23 of the current steering element 29 is connected to a lower wire 71 (corresponding to the other of the bit line 53 and the word line 52 and made of aluminum (Al) here) by a via 28. The lower wire 71 and the upper wire 70 are arranged so as to be orthogonal to each other.

It is to be noted that, in FIG. 2, the current steering element 29 and the variable resistance element 10 may be vertically reversed with each other.

Figure 3:
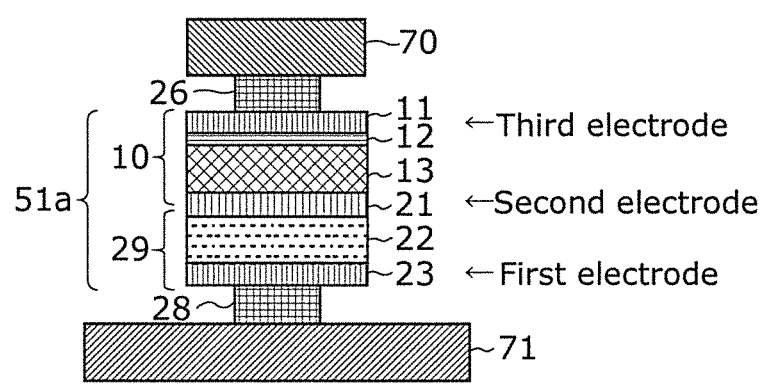
FIG. 3 is a diagram showing a cross-section of a memory cell.

FIG. 3 is a diagram showing a cross section structure of a variable resistance nonvolatile memory device having a cross point memory cell array including memory cells 51a that have a configuration different from that of the memory cell shown in FIG. 2. Each of the memory cells 51a shown in FIG. 3 is a memory cell having a structure simplified by omitting the via 27 in FIG. 2 and sharing the lower electrode 14 of the variable resistance element 10 with the upper electrode 21 of the current steering element 29. The respective configurations of the variable resistance element 10 and the current steering element 29, the upper wire 70, the lower wire 71, and the vias 26 and 28 are the same as those described in FIG. 2, and thus description thereof is omitted.

When a voltage higher than or equal to a predetermined voltage is applied to the upper wire 70 with respect to the lower wire 71, the variable resistance element 10 changes to the high resistance state. When a voltage higher than or equal to a predetermined voltage is applied to the lower wire 71 with respect to the upper wire 70, the variable resistance element 10 changes to the low resistance state. That is, the variable resistance element 10 includes the second electrode 21, the first variable resistance layer 13, the second variable resistance layer 12, and the third electrode 11 that are stacked in the Z direction (stacking direction) so that the first variable resistance layer 13 and the second variable resistance layer 12 are provided between the second electrode 21 and the third electrode 11; is asymmetrical in that the variable resistance element 10 differs in structure between when viewed in a direction from the second electrode 21 to the third electrode 11 and when viewed in a direction from the third electrode 11 to the second electrode 21; and has characteristics of changing to the high resistance state when a voltage higher than or equal to a predetermined voltage is applied to the third electrode 11 with respect to the second electrode 21 and changing to the low resistance state when a voltage higher than or equal to a predetermined voltage is applied to the second electrode 21 with respect to the third electrode 11.

It is to be noted that a memory cell may have a structure formed by omitting one or both of the vias 26 and 28 from the configuration shown in FIG. 2 or FIG. 3.

Moreover, the variable resistance element 10 included in the memory cell of the cross point variable resistance nonvolatile memory device in the present invention is not limited to the variable resistance element having the above configuration, and may be a variable resistance element having a configuration including at least a lower electrode, a variable resistance layer, and an upper electrode.

Here, the variable resistance layer may comprise a transition metal oxide and further have a stack structure including the first variable resistance layer 13 having a low oxygen content atomic percentage and the second variable resistance layer 12 having a high oxygen content atomic percentage.

Figure 4:
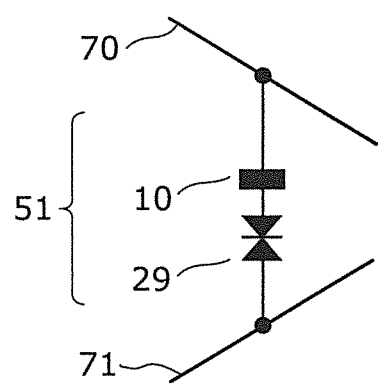
FIG. 4 is an equivalent circuit diagram of a memory cell.

FIG. 4 is a circuit diagram showing a connection relationship corresponding to the structure of the variable resistance element 10, i.e., an equivalent circuit diagram corresponding to the memory cell 51.

[Memory Cell Characteristics]

Figure 5:
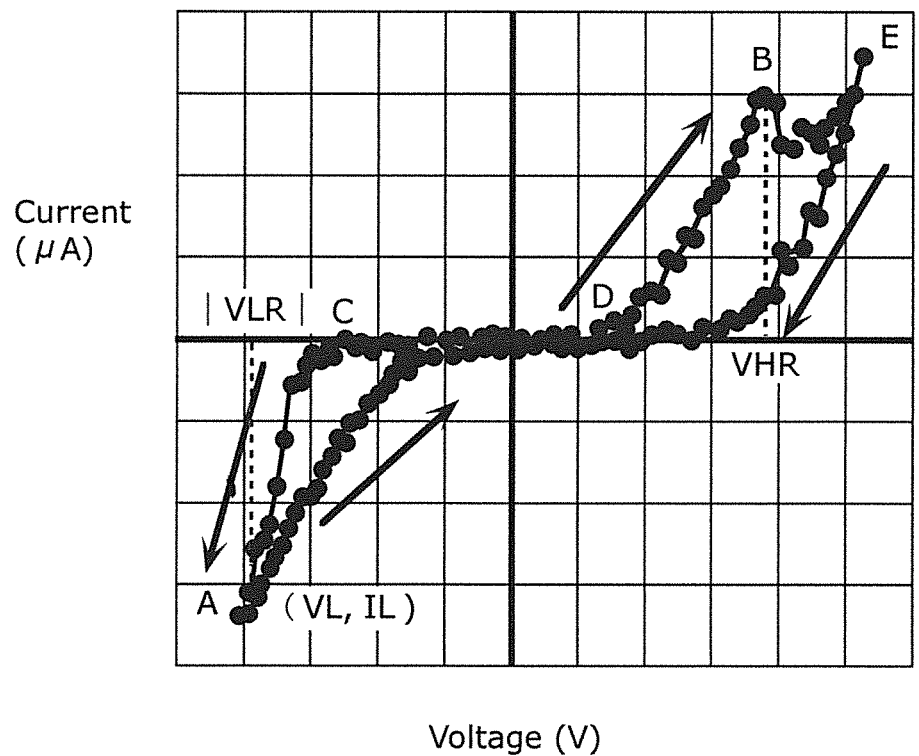
FIG. 5 is an I-V characteristic graph for a memory cell.

The following describes an operation of the memory cell 51, with reference to FIG. 5. FIG. 5 is a characteristic graph obtained by actually measuring a current-voltage relationship in the case of applying, to the memory cell 51 having the structure shown in FIG. 2, a positive-polarity voltage when the upper wire 70 has a voltage higher than that of the lower wire 71.

Suppose the memory cell 51 is initially in the high resistance state. When a negative-polarity voltage that causes the lower wire 71 to be higher in potential than the upper wire 70 is gradually increased and applied to the memory cell 51, starting from an applied voltage of 0 V, a current begins to flow at point C, and the variable resistance element starts to change from the high resistance state to the low resistance state. When the voltage is further applied up to point A in a negative direction, the variable resistance element is rapidly changing to the low resistance state according to the applied voltage. Subsequently, the voltage is gradually decreased and applied until it reaches 0 V, while the variable resistance element is in the low resistance state. Point A is determined according to a value (here IL) of a current that flows through the variable resistance element when the variable resistance element changes to the low resistance state.

After this, when the positive-polarity voltage that causes the upper wire 70 to be higher in potential than the lower wire 71 is gradually increased and applied to the memory cell 51, a current begins to flow at point D, and the variable resistance element 10 starts to change from the low resistance state to the high resistance state at point B where the voltage is substantially point-symmetrical to a voltage (point A) at which the low resistance state is reached. When the voltage is further applied up to point E, a current increases. Subsequently, the current is lower when the applied voltage is decreased than when the applied voltage is increased, which indicates that the variable resistance element has changed to the high resistance state.

That is, the actual measurement data shown by FIG. 5 indicates, for the memory cell 51 having the structure shown by FIG. 2, (i) bidirectional resistance change characteristics of changing to the low resistance state when the voltage of the lower wire 71 is higher than or equal to a predetermined voltage VLth (point C) with respect to the voltage of the upper wire 70 and changing to the high resistance state when the voltage of the upper wire 70 is higher than or equal to a predetermined voltage VHth (point B) with respect to the voltage of the lower wire 71, and (ii) a current-voltage relationship in which the applied voltage in the low resistance state (point A) and the voltage at which the change to the high resistance state starts (point. B) are substantially symmetrical. Thus, it is required that the variable resistance element 10 be driven with a current greater than or substantially equal to a high resistance writing voltage or a low resistance writing voltage. In practice, for example, an absolute value of the high resistance writing voltage is greater than an absolute value of the low resistance writing voltage.

Moreover, when the variable resistance element 10 of the memory cell 51 is changed from the high resistance state to the low resistance state, a resistance value of the low resistance state changes to a low resistance value (point A) corresponding to a value of a current flowing through the variable resistance element 10, by applying, to the memory cell 51, a predetermined voltage (an absolute value being a voltage higher than or equal to VLth) that causes a resistance change in the variable resistance element 10.

Figure 6:
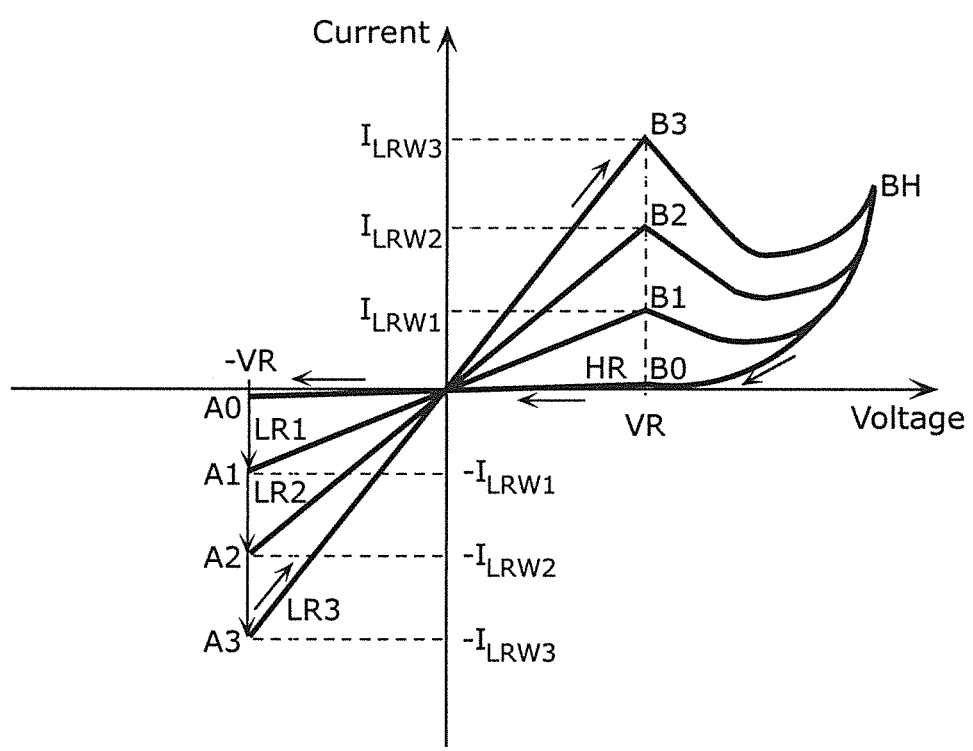
FIG. 6 is a diagram schematically showing a characteristic graph for a variable resistance element and a resistance value set at a time of low resistance writing.

The following describes in detail setting of a low resistance value with reference to FIG. 6.

FIG. 6 is a diagram showing resistance change characteristics of the variable resistance element 10. The horizontal axis represents a voltage applied across the variable resistance element 10, and the vertical axis represents a current that flows through the variable resistance element 10 when a voltage is applied across the variable resistance element 10.

Assuming that the variable resistance element 10 is initially in the high resistance state, its characteristics are represented by a characteristic line BH-B0-A0 when an applied voltage is greater than −VR with reference to the lower electrode 14. When a voltage applied to the variable resistance element 10 with reference to the lower electrode 14 becomes −VR, low resistance writing is started, and a current flowing through the variable resistance element 10 increases. A resistance value of the variable resistance element 10 varies according to an amount of current flowing through the variable resistance element 10 so that a magnitude of voltage between terminals of the variable resistance element 10 is constantly |VR|. In other words, when the maximum current $-I_{LRW1}$ indicated by point A1 flows through the variable resistance element 10 while −VR is being applied to the variable resistance element 10, the variable resistance element 10 is set to a low resistance value having a characteristic slope LR1; when the maximum current $-I_{LRW2}$ indicated by point A2 flows through the variable resistance element 10 while −VR is being applied to the variable resistance element 10, the variable resistance element 10 is set to a low resistance value having a characteristic slope LR2; and when the maximum current $-I_{LRW3}$ indicated by point A3 flows through the variable resistance element 10 while −VR is being applied to the variable resistance element 10, the variable resistance element 10 is set to a low resistance value having a characteristic slope LR3.

In this regard, a resistance change starting point from the low resistance state (LR1, LR2, LR3) to the high resistance state is one of the following: point B1 that is origin symmetrical to the voltage and the current of point A1 at which the variable resistance element 10 is set to the low resistance value in the LR1 state; point B2 that is origin symmetrical to the voltage and the current of point A2 at which the variable resistance element 10 is set to the low resistance value in the LR2 state; and point B3 that is origin symmetrical to the voltage and the current of point A3 at which the variable resistance element 10 is set to the low resistance value in the LR3 state. In this phenomenon, it is possible to confirm that the same characteristics are also present in the memory cell 51 connected in series with the current steering element 29 that shows point-symmetrical characteristics in application of positive and negative voltages (refer to a symmetry between points A and B in FIG. 5).

From the above, to perform stable resistance change operation, it is required that, in the low resistance writing, a predetermined low resistance state be achieved by performing current control (current limit) to a predetermined current value, whereas, in the high resistance writing, a voltage be applied in a direction opposite to a direction in the low resistance writing, and higher-voltage and higher-current operation than that of the low resistance writing be performed.

It is to be noted that a voltage section between 0V and point C at a time of the low resistance writing (high resistance state) and a voltage section between 0V and point D at a time of the high resistance writing (low resistance state) are a voltage zone in which a current does not clearly flow even when a voltage is applied to the memory cell 51 in FIG. 5.

Points C and D in FIG. 5 correspond to a summed voltage of a threshold voltage (hereinafter, referred to as VF) of the current steering element 29 and a resistance change voltage of the variable resistance element 10. In the cross point memory cell array, for example, a voltage greater than or equal to the summed voltage is applied to a selected memory cell, a leak current to unselected memory cells is reduced by performing control so that an operating point is between points C and D, thereby performing an operation of reading from or writing to the cross point memory cell array.

[Cross Point Memory Cell Array and Array Equivalent Circuit]

The following describes an array equivalent circuit of a cross point memory cell array.

Figure 7:
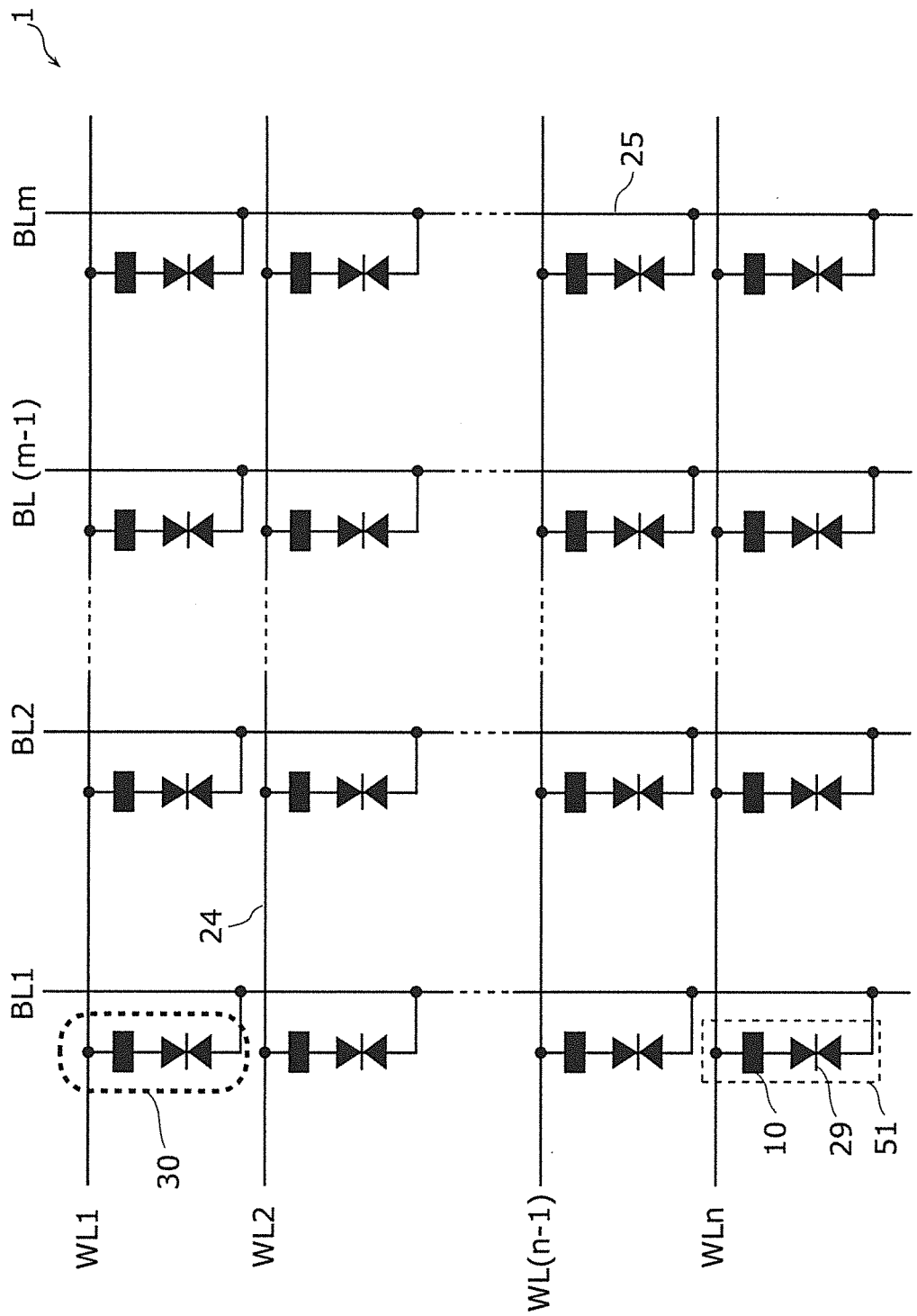
FIG. 7 is a diagram showing a memory cell array in which memory cells are arranged in a matrix.

FIG. 7 is an exemplary diagram showing a memory cell array in which memory cells 51 are arranged in a matrix in the same manner as in FIG. 1A.

In FIG. 7, each reference sign 24 indicates a line formed by placing an n number of wires in parallel with each other, and each reference sign 25 indicates a bit line that is formed by placing a m number of wires in parallel with each other and is orthogonal to the word line in a non-contact manner (three-dimensionally). Each memory cell 51 in which the variable resistance element 10 and the current steering element 29 are connected in series is placed at a different one of cross points of the word lines 24 and the bit lines 25. The variable resistance element 10 has one end connected to a corresponding one of the word lines 24, and the current steering element 29 has one end connected to a corresponding one of the bit lines 25. To put it another way, a memory cell array 1 shown in FIG. 7 includes n memory cells 51 arranged in a direction of each bit line 25 and m memory cells 51 arranged in a direction of each word line 24, that is, n×m memory cells 51.

In the case of a cross point memory cell array, a shape of a memory cell array which minimizes disturbing influence on unselected memory cells when writing to a selected memory cell of 1 bit in the memory cell array is square (m=n in FIG. 7).

On the other hand, in the 1-bit writing, the leakage current flowing through the unselected memory cells is reduced in proportion as the size of the memory cell array becomes smaller.

For this reason, although, for instance, the memory cell array needs to be square in shape and reduced in size in order to minimize the disturbing influence and reduce the leakage current, when the memory cell array having such a small size and a squire bit shape is mounted on each of mats, and 1-bit by 1-bit writing is performed on a mat basis, decoder circuits and driver circuits for rows and columns are required for each of the memory cell array, which results in increase of a peripheral circuitry area accounting for a total area of a semiconductor chip on which such a cross point variable resistance nonvolatile memory device is mounted.

In view of this, for example, memory cell arrays are arranged each of which has a rectangular shape (e.g., m>n in FIG. 7) as an array shape for preventing the area from increasing by reducing overhead of the peripheral circuitry and reducing the increase in the size of the memory cell array. However, the disturbing influence on the unselected memory cells remains unsolved. A solution to this problem is described later.

Figure 8:
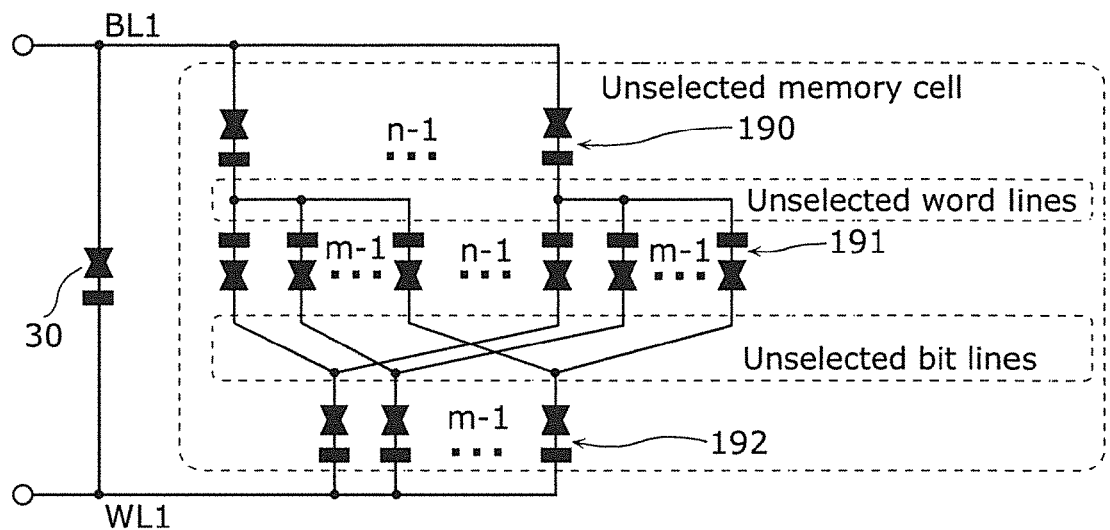
FIG. 8 is a diagram showing development of a memory cell array into an array equivalent circuit.

FIG. 8 is a diagram schematically showing a connection relationship between a selected memory cell and unselected memory cells that are included between a selected bit line and a selected word line, with reference to the selected bit line and the selected word line, in order to describe the development of the memory cell array 1 shown in FIG. 7 into the array equivalent circuit. Stated differently, FIG. 8 is a diagram showing the equivalent circuit of FIG. 7 which illustrates the configuration of FIG. 7 in terms of a selected memory cell 30 and unselected memory cells.

The selected memory cell 30 shown in FIG. 7 is connected to a selected bit line BL1 and a selected word line WL1. In FIG. 8, the selected memory cell 30 has one end connected to the selected bit line BL1, and the other end connected to the selected word line WL1. The other unselected memory cells include (1) first unselected memory cells 190 including (n−1) memory cells 51 each having one end connected to the selected bit line BL1, (2) third unselected memory cells 192 including (m−1) memory cells 51 each having one end connected to the selected word line WL1, and (3) second unselected memory cells 191 including (n−1)×(m−1) memory cells 51 each of which is (i) connected via a corresponding one of unselected word lines to the other end of a corresponding one of the (n−1) memory cells 51 included in the first unselected memory cells 190 and (ii) connected via a corresponding one of unselected bit lines to the other end of a corresponding one of the (m−1) memory cells 51 included in the third unselected memory cells 192.

One of the (n−1) memory cells 51 included in the first unselected memory cells 190 has the other end connected to one ends of the (m−1) memory cells 51 included in the second unselected memory cells 191. As many as (n−1) such connection relationships between the first unselected memory cells 190 and the second unselected memory cells 191 are present. One of the (m−1) memory cells 51 included in the third unselected memory cells 192 has the other end connected to the other ends of the (n−1) memory cells 51 included in the second unselected memory cells 191. As many as (m−1) such connection relationships between the third unselected memory cells 192 and the second unselected memory cells 191 are present.

Since as many states in each of which one of the (n−1) memory cells 51 included in the first unselected memory cells 190 is connected to the (m−1) memory cells 51 included in the second unselected memory cells 191 as the relationships each between the first unselected memory cells 190 and the second unselected memory cells 191 are present, each node of the unselected word lines has the substantially same voltage. Moreover, since as many states in each of which one of the (m−1) memory cells 51 included in the third unselected memory cells 192 as the relationships each between the third unselected memory cells 192 and the second unselected memory cells 191 are present, each node of the unselected bit lines has the substantially same voltage.

Figure 9:
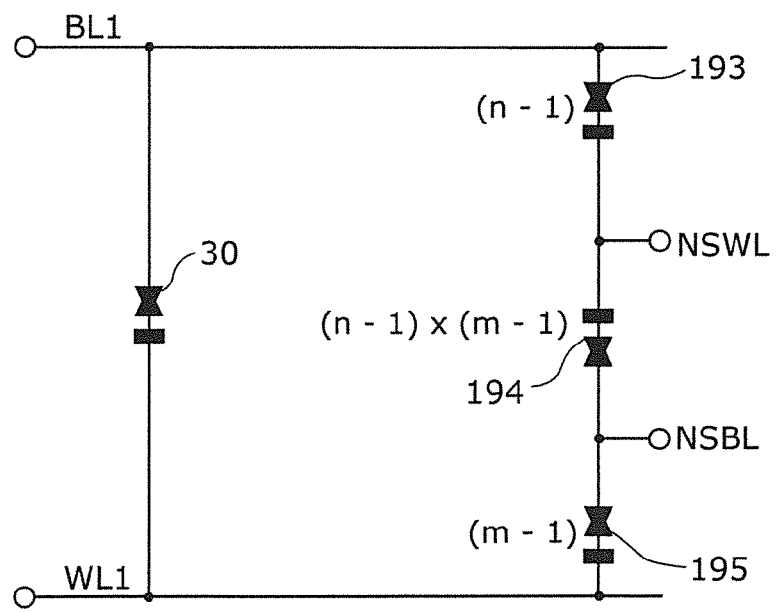
FIG. 9 is a reduced equivalent circuit diagram of a memory cell array.

Thus, in the equivalent circuit shown in FIG. 8, it is possible to reduce all the nodes of the unselected word lines and all the nodes of the unselected bit lines to respective single lines. FIG. 9 shows an equivalent circuit thus reduced.

In FIG. 9, the selected memory cell 30 has one end connected to the selected bit line BL1, and the other end connected to the selected word line WL1. A first unselected memory cell 193 is equivalent to the first unselected memory cells 190, and has (n−1) parallels. A second unselected memory cell 194 is equivalent to the second unselected memory cells 191, and has (n−1)×(m−1) parallels. A third unselected memory cell 195 is equivalent to the third unselected memory cells 192, and has (m−1) parallels. The first unselected memory cell 193, the second unselected memory cell 194, and the third unselected memory cell 195 are connected in series. The first unselected memory cell 193 has a terminal that is not connected to the second unselected memory cell 194 but connected to the selected bit line BL1, and the third unselected memory cell 195 has a terminal that is not connected to the second unselected memory cell 194 but connected to the selected word line WL1. An intermediate node that connects the first unselected memory cell 193 and the second unselected memory cell 194 is referred to as an unselected word line NSWL, and an intermediate node that connects the second unselected memory cell 194 and the third unselected memory cell 195 is referred to as an unselected bit line NSBL.

As stated above, the equivalent circuit, which shows the relationship between the selected memory cell and the unselected memory cells of the cross point memory cell array 1 shown in FIG. 7, is reduced as shown in FIG. 9. Hereinafter, an I-V characteristic of any selected memory cell of the cross point memory cell array and an I-V characteristic of a leakage current flowing through unselected memory cells are touched on in connection with a write characteristic of the selected memory cell. The I-V characteristic of such a memory cell array is described below with reference to the equivalent circuit shown in FIG. 9, for the sake of simplicity.

[Equivalent Circuit and I-V Characteristic at Time of Writing]

Figure 10:
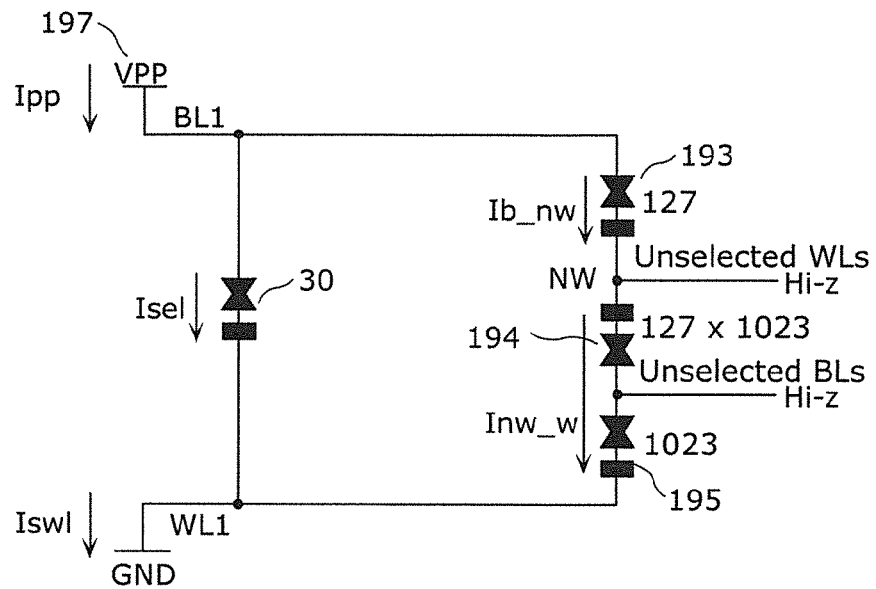
FIG. 10 is an equivalent circuit diagram illustrating a state of 1-bit writing when unselected lines are in Hi-z.
Figure 11:
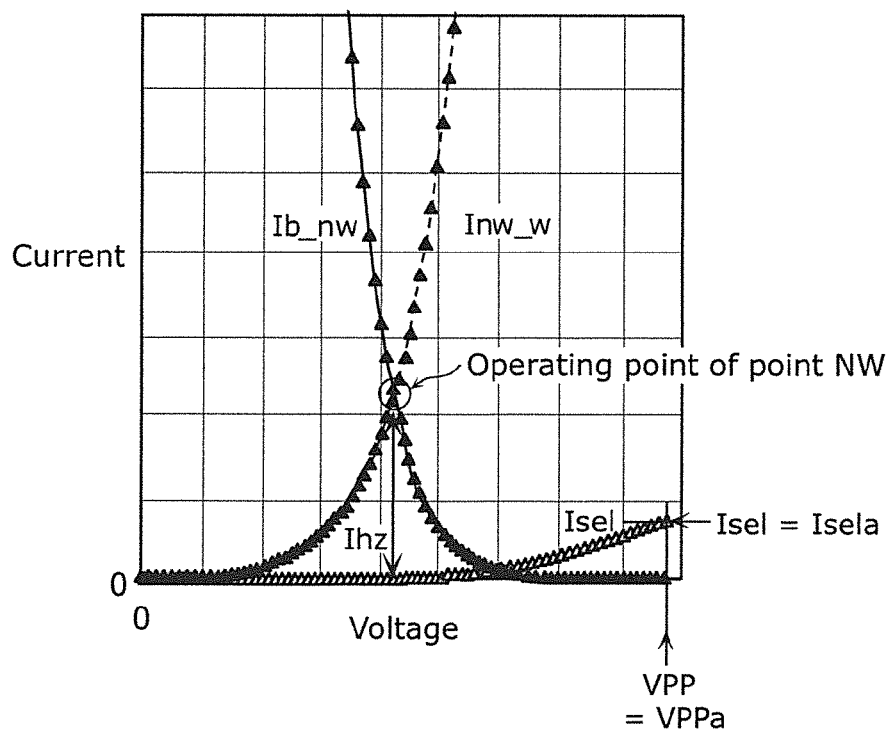
FIG. 11 is an I-V characteristic graph for a memory cell array at a time of 1-bit writing.

The following describes, using the equivalent circuit shown in FIG. 9, a conventional write (here, low resistance writing) operation and its characteristics, with reference to FIG. 10 and FIG. 11.

FIG. 10 is a diagram showing a state of a case where a selected 1-bit memory cell 30 is written to by changing the memory cell 30 to the low resistance (LR) state when unselected word lines and unselected bit lines are in a high impedance state (hereinafter, referred to as Hi-z state) in the equivalent circuit of the memory cell array shown in FIG. 9.

In FIG. 10, a write power source 197 is a power source that generates a voltage at a time of writing (write voltage) VPP, and has an output terminal electrically connected to the selected bit line BL1 in this selection state. A ground (GND) voltage 0V is electrically connected to the selected word line WL1. The unselected word lines (WLs) that connect the first unselected memory cell 193 and the second unselected memory cell 194 are referred to as NW point. The unselected word lines are in the Hi-z state, and the unselected bit lines (BLs) that connect the second unselected memory cell 194 and the third unselected memory cell 195 are also in the Hi-z state. It goes without saying that the selected memory cell 30 has one end connected to the selected bit line BL1, and the other end connected to the selected word line WL1. Moreover, the write voltage VPP is applied from the write power source 197 to the selected bit line BL1 of FIG. 10, and a GND potential is applied to the selected word line WL1. In this state, a LR writing current Isel flows through the selected memory cell 30 from the selected bit line BL1 to the selected word line WL1, a current Ib_nw flows through the first unselected memory cell 193 from the selected bit line BL1, and a current Inw_w flows through the second unselected memory cell 194 and the third unselected memory cell 195 to the selected word line WL1. A current Ipp that is a sum of the current Isel flowing through the selected memory cell 30 and the current Ib_nw flowing through the first unselected memory cell 193 flows through the write power source 197, and a current Iswl that is a sum of the current Isel flowing through the selected memory cell 30 and the current Inw_w flowing through the second unselected memory cell 194 and the third unselected memory cell 195 flows through a GND terminal.

In other words, the current Ipp that flows from the write power source 197 and the current Iswl that flows through the GND terminal are expressed by Equation 1 and Equation 2, respectively.

$$Ipp = Isel + Ib\_nw \quad \text{(Equation 1)}$$

$$Iswl = Isel + Inw\_w \quad \text{(Equation 2)}$$

Here, since both of the unselected WLs and the unselected BLs are in the Hi-z state, the following equation holds.

$$Ib\_nw = Inw\_w \quad \text{(Equation 3)}$$

Thus, the current Ipp of the write power source 197 and the GND current Iswl are identical to each other.

Considering that a size of the memory cell array 1 is defined by 128 bits (n=128) on the same bit line and 1024 bits (m=1024) on the same word line, a bit count of each of the unselected memory cells shown in FIG. 10 is calculated as follows: the first unselected memory cell 193 has n−1=127 bits; the second unselected memory cell 194 has (n−1)×(m−1)=127×1023 bits; and the third unselected memory cell 195 has m−1=1023 bits.

FIG. 11 shows a current-voltage characteristic (I-V characteristic) at a time of low resistance writing in the case of the above array size. In FIG. 11, the horizontal axis represents a voltage applied to each memory cell, and the vertical axis represents a current flowing through each memory cell. Here, three characteristic lines are described which respectively correspond to the current Isel (white triangle) flowing through the selected memory cell 30, the current Ib_nw (black triangle) flowing through the first unselected memory cell 193, and the current Inw_w (black triangle) flowing through the second unselected memory cell 194 and the third unselected memory cell 195.

In FIG. 11, in order to set, to Rl, a low resistance value of a variable resistance element 10 of the selected memory cell 30, when a magnitude of the voltage across the variable resistance element 10 in the low resistance state in the characteristics shown in FIG. 6 is expressed as VR, a current Isela flowing through the variable resistance element 10 in the low resistance state is calculated as Isela=VR/Rl, and thus it is necessary to apply, as the write voltage VPP at the time of low resistance writing, a voltage VPPa with which such a current flows. From FIG. 11, VPPa is applied as the write voltage VPP here in order to satisfy the conditions. (At this time the current Isel flowing through the selected memory cell 30 becomes Isela.)

Assuming that a voltage is the write voltage VPP and that a current has a point of Ib_nw=0 A as a starting point, the characteristics of the current Ib_nw flowing through the first unselected memory cell 193 become Ib_nw characteristics shown in FIG. 11. Moreover, assuming that a voltage is 0V and that a current has a point of Inw_w=0 A as a starting point, the characteristics of the current Inw_w flowing through the second unselected memory cell 194 and the third unselected memory cell 195 become Inw_w characteristics shown in FIG. 11. When the write voltage VPP=VPPa is applied, a current flowing through the second unselected memory cell 194 and the third unselected memory cell 195 is a current at an intersection point (operating point of point NW) of each characteristics where Ib_nw=Inw_w, and a magnitude of the current is Ihz.

As described above, in the memory cell array 1 having the above array size, when the current Isela for the low resisting writing flows through the selected memory cell 30, the leakage current Ihz flows through the unselected memory cells accordingly. Thus, the current flowing from the write power source 197 is calculated as Ipp=Isela+Ihz. Where a proportion of the current Isela flowing through the selected memory cell 30 to the power supply current Ipp is defined as writing efficiency, writing efficiency K is expressed by the following equation.

$$\text{Writing efficiency } K = Isel/Ipp \times 100(\%)$$

When the writing efficiency K is calculated from the current value, the following equation holds.

$$K = Isela/(Isela + Ihz)$$

In the example shown in FIG. 11, it is clear that approximately a mere quarter or less of the applied current contributes to writing, and the remaining three quarters or more wastefully flow as the leakage current.

In this manner, most of the applied current from the write power source 197 is wasted as the leakage current flowing through the unselected memory cells, and thus a consumption current at the time of writing increases significantly. Increasing the proportion of the current flowing through the selected memory cell to the applied current, that is, the writing efficiency, leads to reduction in the consumption current.

The inventors have found one access method that successfully solves the above problem, that is, successfully increases writing efficiency.

The following describes a cross point variable resistance nonvolatile memory device, a method of writing for use in a cross point variable resistance nonvolatile memory device, and a method of reading for use in a cross point variable resistance nonvolatile memory device according to embodiments of the present invention, with reference to the drawings. Each of the embodiments described below shows a general or specific example. The numerical values, shapes, materials, constituent elements, the arrangement and connection of the constituent elements, steps, the processing order of the steps, etc. shown in the following embodiments are mere examples, and therefore do not limit the scope of the present invention. Only the Claims limit the scope of the present invention. Therefore, among the structural elements in the following embodiments, structural elements not recited in any one of the independent claims are described as arbitrary structural elements, though not always required to solve the problem described in the present invention.

Embodiment 1

Increasing Efficiency by Multi-Bit Simultaneous Writing

A method of writing for use in a cross point variable resistance nonvolatile memory device according to Embodiment 1 of the present invention is schematically described with reference to a memory cell array configuration diagram shown in FIG. 12. It is to be noted that the method of writing to be described below is achieved as a function of a write circuit included in a cross point variable resistance nonvolatile memory device 2000 shown in FIG. 23 to be described later. In other words, the method of writing described using FIG. 12 corresponds to conceptual functions of a selection circuit and a write circuit included in a cross point variable resistance nonvolatile memory device in the present invention, and FIG. 12 shows a conceptual diagram of the cross point variable resistance nonvolatile memory device.

Figure 12:
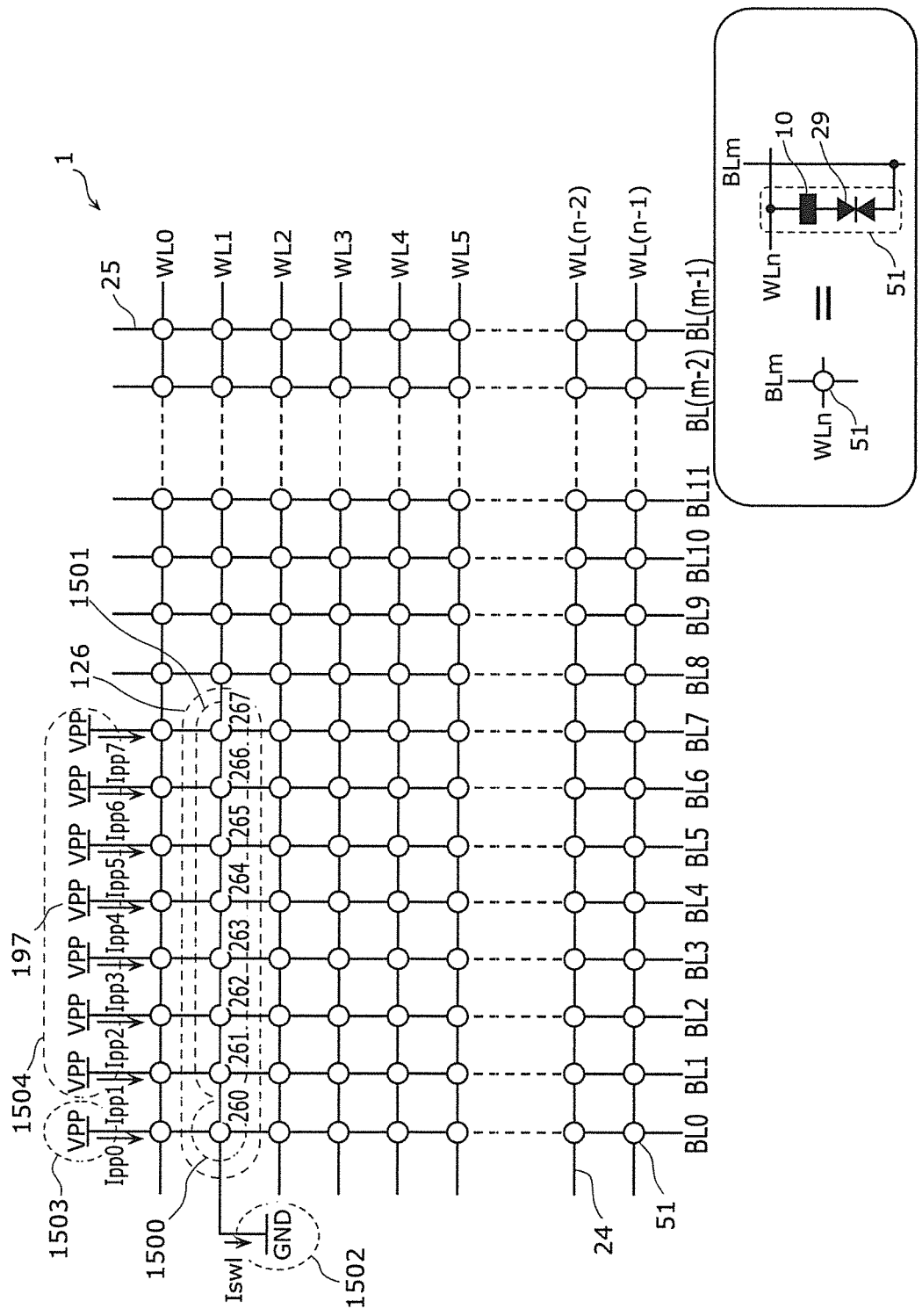
FIG. 12 is a conceptual diagram showing selection of memory cells at a time of multi-bit simultaneous writing according to Embodiment 1 of the present invention.

In FIG. 12, each of memory cells 51 has the same configuration as shown in FIG. 4, and is placed at a different one of cross points of word lines 24 and bit lines 25, so as to form a matrix. A memory cell array 1 includes: WL0 to WL(n−1), an n number of word lines 24, arranged in parallel with each other in X direction; BL0 to BL(m−1), a m number of bit lines 25, arranged in parallel with each other to be orthogonal to the word lines 24 in Y direction; and each memory cell 51 placed at a different one of cross points of the word lines 24 and the bit lines 25. Here, logically, the memory cell array 1 includes: first memory cells for data storage each of which is connected to a different one of bits; and second memory cells that are connected to the same word lines WL0 to WL(n−1) as those connected to the first memory cells and are connected to other bit lines.

In FIG. 12, a word line write circuit 1502 applies a ground (GND) voltage to WL1 as a selected word line, a first bit line write circuit 1503 applies a write voltage VPP of a power source to at least one BL0 as a selected bit line, to store data, and a memory cell 260 placed at a cross point of the selected word line WL1 and the selected bit line BL0 is selected as a memory cell (i.e., a memory cell included in first memory cells 1500) for data storage (intended for data storage), thereby performing a write operation. On the other hand, at the same time, a second bit line write circuit 1504 applies a write voltage VPP of the power source to seven bits (an A number of exemplary selected bit lines) of BL1 to BL7 as bit lines selected for data storage or for performing a write operation not for data storage, and 7-bit memory cells 261 to 267 each placed at a different one of cross points of the selected word line WL1 and the selected bit lines BL1 to BL7 are selected as memory cells (i.e., memory cells included in second memory cells 1501) for data storage or for write operation not for data storage, thereby performing the same write operation as that of the selected memory cell 260.

Consequently, the write operation is performed using at least 1 bit for data storage and the other bits for data storage or not for data storage, and thus the eight bits (exemplary (1+A) bits) on the same word line are selected as write operation target bits (selected 8-bit memory cells 126).

It is to be noted that the selected memory cells 126 in this example merely represent examples of the simultaneously selected 8-bit memory cells 260 to 267, and thus are exemplary memory cells when eight memory cells each placed at a different one of cross points of the one selected word line WL1 and the eight consecutive selected bit lines BL0 to BL7 are selected, and are not necessarily adjacent memory cells.

A write power source 197 is a power source that generates a voltage at a time of writing (write voltage) VPP. The write power source 197 is electrically connected to the eight selected bit lines BL0 to BL7 that is included in the first bit line write circuit 1503 and the second bit line write circuit 1504 or generates the voltage VPP through the first bit line write circuit 1503 and the second bit line write circuit 1504 and further through a first bit line selection circuit (not shown) between the first bit line write circuit 1503 and BL0 and a second bit line selection circuit (not shown) between the second bit line write circuit 1504 and BL1 to BL7. It is to be noted that the first bit line selection circuit is a circuit that selects one of bit lines of first memory cells as a first bit line. It is also to be noted that the second bit line selection circuit is a circuit that selects A (A is an integer greater than or equal to 1) bit lines of second memory cells as at least one second bit line.

On the other hand, a ground (GND) voltage 0V is electrically connected to the one selected word line WL1 through the word line write circuit 1502 and a word line selection circuit (not shown). Other unselected bit lines and unselected word lines are electrically blocked by the first bit line selection circuit, the second bit line selection circuit, and the word line selection circuit, and thus are in the high impedance (Hi-z) state. To put it another way, the first bit line selection circuit and the second bit line selection circuit put the unselected bit lines into the high impedance state. It is to be noted that the word line selection circuit is a circuit that selects one of word lines as a selected word line for a memory cell array, and puts the other unselected word lines into the high impedance state.

Thus, among two terminals of each selected memory cell, the write voltage VPP is applied to one terminal connected to an current steering element 29, and the GND voltage is applied to the other terminal connected to a variable resistance element 10. This allows a low resistance writing operation to be simultaneously performed on eight bits.

It is to be noted that in high resistance writing when a current flows from a selected word line to a selected bit line contrary to when a current flows from a selected bit line to a selected word line, an 8-bit (i.e., (1+A)-bit) simultaneous high resistance writing operation is successfully performed by electrically applying a low voltage such as the ground (GND) voltage to unselected bit lines and a high voltage such as the write voltage VPP to one selected word line. As above, in this embodiment, when writing to a memory cell array is performed, simultaneous writing is always performed on (1+A) memory cells connected to the same word line.

It is to be noted that the diagram shown in FIG. 12 is a diagram showing a concept of the present invention, and shows, as an example, a state in which, when writing is performed on a write target memory cell of 1 bit (the first memory cells 1500), a write operation is performed on memory cells of 7 bits (the second memory cells 1501) on the same word line under the same bias conditions as those of the write target memory cell of 1 bit. Thus, as long as the selected memory cells on which the write operation is performed are on the same word line, the selected memory cells may not be adjacent to each other.

It is to be noted that the first bit line selection circuit and the second bit line selection circuit each are a circuit that functions in the same manner as a bit line decoder 206 shown in FIG. 23 to be described later.

The inventors have found that such multi-bit simultaneous writing to bits connected on the same word line is a method of writing that successfully increases writing efficiency.

Figure 13:
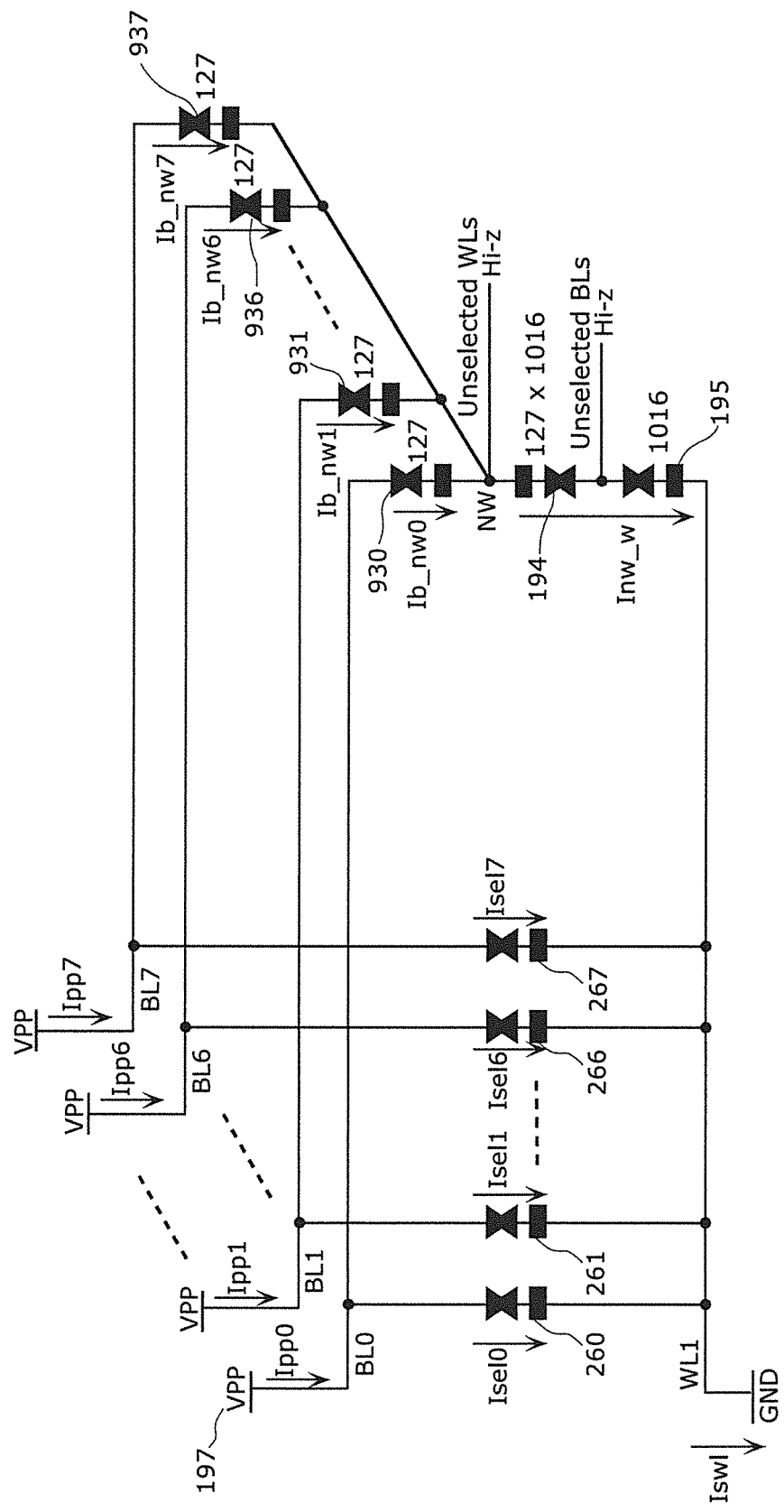
FIG. 13 is an equivalent circuit diagram illustrating a state of multi-bit simultaneous writing in the present invention.

The following describes reasons for the increase in efficiency by the method, with reference to an equivalent circuit shown in FIG. 13 and graphs each showing an I-V characteristic of a memory cell array shown in FIG. 14.

FIG. 13 is a diagram showing a relationship among an array equivalent circuit of the selected 8-bit memory cells 260 to 267 and the other unselected memory cells shown in FIG. 12, a low resistance writing power source 197 (a write voltage VPP), and a GND power source (0V).

In FIG. 13, a selected memory cell 260 has one terminal connected to a selected word line WL1, and the other terminal connected to a selected bit line BL0. Likewise, a second selected memory cell 261 has one terminal connected to the selected word line WL1, and the other terminal connected to a selected bit line BL1. Similarly, a seventh selected memory cell 266 has one terminal connected to the selected word line WL1, and the other terminal connected to a selected bit line BL6. In the same way, an eighth selected memory cell 267 has one terminal connected to the selected word line WL1, and the other terminal connected to a selected bit line BL7. It is to be noted that, although not shown in the figure, third to sixth selected memory cells similarly have the other terminals connected to selected bit lines BL2 to BL5, respectively.

Moreover, a tenth unselected memory cell 930 has one terminal connected to unselected word lines NW, and the other terminal connected to the selected bit line BL0. Likewise, an eleventh unselected memory cell 931 has one terminal connected to the unselected word lines NW, and the other terminal connected to the selected bit line BL1. Similarly, a sixteenth unselected memory cell 936 has one terminal connected to the unselected word lines NW, and the other terminal connected to the selected bit line BL6. In the same way, a seventeenth unselected memory cell 937 has one terminal connected to the unselected word lines NW, and the other terminal connected to the selected bit line BL7. It is to be noted that, although not shown in the figure, twelfth to fifteenth unselected memory cells similarly have the other terminals connected to selected bit lines BL2 to BL5, respectively.

A second unselected memory cell 194 is a memory cell provided between unselected WLs and unselected BLs. A third unselected memory cell 195 is a memory cell provided between the unselected BLs and the selected word line WL1. A target number of each of second unselected memory cells 194 and third unselected memory cells 195 slightly varies depending on the number of selected memory cells. A write power source 197 is electrically connected to each of the selected bit lines BL0 to BL7. The selected word line WL1 is electrically connected to a ground (GND) power source (0V). It is to be noted that unselected bit lines (corresponding to unselected BLs in FIG. 13) and unselected word lines (corresponding to unselected WLs in FIG. 13) are in the high impedance (Hi-z) state.

(a) and (b) in FIG. 14 show operating point diagrams each for an I-V characteristic of the memory cell array in the present invention shown in FIG. 13 with reference to unselected word lines (point NW) in the case of the multi-bit simultaneous writing operation in the memory cell array, comparing 1-bit writing and simultaneous writing to eight bits on the same word line. (a) in FIG. 14 is a characteristic diagram at a time of 1-bit writing and the same as FIG. 11. (b) in FIG. 14 is a characteristic diagram obtained by adding, to (a) in FIG. 14, a sum (corresponding to Ib_nw×8) of currents Ib_nw0 to Ib_nw7 flowing through the tenth to seventeenth unselected memory cells 930 to 937 at a time of 8-bit simultaneous writing.

In (a) in FIG. 14 (and (b) in FIG. 14), the horizontal axis represents a voltage applied to each memory cell, the vertical axis represents a current flowing through each memory cell, and the following currents are described as three characteristic lines: a current Isel (white triangle, corresponding to Iseli (where i is an integer from 0 to 7) in FIG. 13 and Isel0 to Isel7) flowing through a selected memory cell 30 (corresponding to the selected memory cells 260 to 267 in FIG. 13); a current Ib_nw (black triangle, corresponding to Ib_nwi (where i is an integer from 0 to 7) in FIG. 13 and Ib_nw0 to Ib_nw7) flowing through the tenth to seventeenth unselected memory cells 930 to 937; and a current Inw_w (black triangle) flowing through the second unselected memory cell 194 and the third unselected memory cell 195.

In order to perform the low resistance writing, VPPa (VPPi in (b) in FIG. 14, VPPi=VPPa) is applied as the write voltage VPP. Here, the current Isel flowing through the selected memory cell 30 becomes Isela (Iseli in (b) in FIG. 14, Iseli=Isela).

Assuming that a voltage is the write voltage VPP and that a current has a point of Ib_nw=0 A as a starting point, the characteristics of the current Ib_nw (corresponding to Ib_nw0 to Ib_nw7) flowing through the tenth to seventeenth unselected memory cells 930 to 937 become Ib_nw characteristics (i) shown in (a) and (b) in FIG. 14. Moreover, assuming that a voltage is 0V and that a current has a point of Inw_w=0 A as a starting point, the characteristics of the current Inw_w flowing through the second unselected memory cell 194 and the third unselected memory cell 195 become Inw_w characteristics shown in (a) and (b) in FIG. 14. In (a) in FIG. 14, a current that flows when the write voltage VPP=VPPa is applied is a current at an intersection point (operating point of point NW) of each characteristics where Ib_nw=Inw_w, and a magnitude of the current is Ihz. Thus, the current flowing from the write power source 197 is calculated as Ipp=Isela+Ihz. In the example shown in (a) in FIG. 14, a proportion of the current Isela flowing through the selected memory cell to the power supply current Ipp, that is, writing efficiency K is approximately 25%.

Moreover, here, an operating voltage at point NW is Vnwa in (a) in FIG. 14.

In contrast, when simultaneous writing is performed on the eight memory cells on the same selected word line, the write voltage VPP is applied from the write power source 197 to each selected bit line. The currents flow through the unselected WLs through the tenth to seventeenth unselected memory cells 930 to 937, and a sum of the currents is eight times as much as the time of 1-bit writing. In view of this, a current (Ib_nw×8 shown in (ii) in (b) in FIG. 14) that is eight times as much as a current (i) Ib_nw at the time of 1-bit writing flows at point NR, and thus an intersection point (operation point 2 of point NW) of a characteristic line (ii) shown in (b) in FIG. 14 and the current Inw_w flowing through the second unselected memory cell 194 and the third unselected memory cell 195 is an operating point at the time of 8-bit simultaneous writing. A current concentrated at point NW here is Ihz8, and a voltage at point NW here rises to Vnwi (Vnwi>Vnwa). It is to be noted that the rise of the voltage at point NW by the 8-bit simultaneous writing reduces voltages between the unselected memory cells 930 to 937 connected to the selected bit lines, and thus the current is shifted to a direction in which disturbing influence is reduced. The disturbing influence is separately described in details below.

Each of the currents Ib_nw0 to Ib_nw7 flowing through the tenth to seventeenth unselected memory cells 930 to 937 connected to the respective bit lines at the time of the 8-bit simultaneous writing corresponds to a current when the voltage at point NW is Vnwi, and thus is Ib_nwi. In other words, the current Ib_nwa at the time of the 1-bit writing is reduced to Ib_nwi by the 8-bit simultaneous writing.

Thus, the current Ipp flowing from the write power source 197 to one selected bit line is calculated as below.

$$Ipp = Iseli + Ib\_nwi$$

A proportion of the current Iseli flowing through the selected memory cell to the current Ipp, that is, writing efficiency K is calculated as below.

$$K = Iseli/(Iseli + Ib\_nwi)$$

In the example shown in (b) in FIG. 14, the writing efficiency K is approximately 50%.

To put it another way, the writing efficiency for the one selected memory cell is approximately 25% at the time of the 1-bit writing and approximately 50% at the time of the simultaneous writing to eight bits on the same word line. It is clear that such a method of writing in the present invention successfully increases the writing efficiency by approximately two times.

As described above, the method of simultaneously writing to the memory cells on the same word line successfully reduces the leakage current flowing through the unselected memory cells at the time of writing, and further successfully reduces the consumption current at the time of writing.

It is to be noted that although the simultaneous writing to the bits on the same word line has been described as the example using the low resistance writing performed on the selected memory cell, the high resistance writing in which a high voltage is applied to a selected word line and a low voltage is applied to a selected bit line is also expected to produce the same effect.

It is to be noted that although the exemplary mode in which the voltage is applied to the selected word line in the above configuration has been described, it goes without saying that a mode in which a constant current is applied to a selected word line is also expected to produce the same effect. The following describes the effect of multi-bit simultaneous writing in writing by the application of the constant current.

[Effect of Multi-Bit Simultaneous Writing in Writing by Application of Constant Current]

In terms of characteristics of a resistance change of the variable resistance element 10 in the memory cell 51, as described with reference to FIG. 6, to perform a stable resistance change operation to change to the low resistance state, it is necessary to perform current control (current limit) so that a predetermined amount of a current flows through the selected memory cell 51. It is to be noted that in the case of voltage control, a current steering element 29 has non-linear characteristics and significantly large fluctuation in current vis-a-vis fluctuation in voltage, and thus it is difficult to control a resistance value determined by an amount of a flowing current.

From the above, the following describes influence on and effect of the method of simultaneous writing to bits on the same word line when the current control is performed in the low resistance writing.

FIG. 15 is a configuration diagram showing a memory cell array 1 when multi-bit simultaneous writing in the present invention is performed by application of a constant current. It is to be noted that FIG. 15 shows a state of 8-bit simultaneous writing. FIG. 15 differs from FIG. 12 in that write constant current sources 210a to 210h are inserted into the memory cell configuration diagram shown in FIG. 12 as structural elements connected to selected bit lines BL0 to BL7, in addition to the write power source 197. Thus, only the part of FIG. 15 that is different from FIG. 12 is described below.

In FIG. 15, a word line write circuit 1507 applies a ground (GND) voltage to WL1 as a selected word line, a first bit line write circuit 1508 applies a write constant current Ips0 to at least one BL0 as a selected bit line, to store data, and a memory cell 260 placed at a cross point of the selected word line WL1 and the selected bit line BL0 is selected as a memory cell (i.e., a memory cell included in first memory cells 1505) for data storage (intended for data storage), thereby performing a write operation. On the other hand, at the same time, a second bit line write circuit 1509 applies write constant currents Ips1 to Ips7 to seven bits (the A number of the exemplary selected bit lines) of BL1 to BL7 as bit lines selected for data storage or for performing a write operation not for data storage, and 7-bit memory cells 261 to 267 each placed at a different one of cross points of the selected word line WL1 and the selected bit lines BL1 to BL7 are selected as memory cells (i.e., memory cells included in second memory cells 1506) for data storage or for write operation not for data storage, thereby performing the same write operation as that of the selected memory cell 260.

Consequently, the write operation is performed using at least one bit for data storage and the other bits for data storage or not for data storage, and thus the eight bits on the same word line are selected as write operation target bits (selected 8-bit memory cells 126).

It is to be noted that the selected memory cells 126 in this example merely represent examples of the simultaneously selected 8-bit memory cells 260 to 267, and thus are exemplary memory cells when eight memory cells each placed at a different one of cross points of the one selected word line WL1 and the eight consecutive selected bit lines BL0 to BL7 are selected, and are not necessarily adjacent memory cells.

The write constant current sources 210a to 210h are power sources that generate the currents (write currents) Ips0 to Ips7 at a time of writing. The current sources are electrically connected to the eight selected bit lines BL0 to BL7 that are included in the first bit line write circuit 1508 and the second bit line write circuit 1509 or generate the currents Ips0 to Ips7 through the first bit line write circuit 1508 and the second bit line write circuit 1509, and further through a first bit line selection circuit (not shown) between the first bit line write circuit 1508 and BL0, and a second bit line selection circuit (not shown) between the second bit line write circuit 1509 and BL1 to BL7.

It is to be noted that the currents Ips0 to Ips7 supplied from the write constant current sources 210a to 210h have the substantially same amount.

On the other hand, a ground (GND) voltage 0V is electrically connected to the one selected word line WL1 through a word line write circuit 1507 and a word line selection circuit (not shown), and other unselected bit lines and unselected word lines are electrically blocked by the word line selection circuit and thus are in the high impedance (Hi-z) state.

Thus, among two terminals of each selected memory cell, the write currents Ips0 to Ips7 are applied to one terminal connected to the current steering element 29, and the GND voltage is applied to the other terminal connected to a variable resistance element 10. This allows a low resistance writing operation to be simultaneously performed on eight bits.

It is to be noted that in high resistance writing when a current flows from a selected word line to a selected bit line contrary to when a current flows from a selected bit line to a selected word line, an 8-bit simultaneous high resistance writing operation is successfully performed by electrically applying a sink constant current to unselected bit lines and a high voltage such as the write voltage VPP to one selected word line.

It is to be noted that the diagram shown in FIG. 15 is a diagram showing a concept of the present invention, and shows, as an example, a state in which, when writing is performed on a write target memory cell of 1 bit (first memory cells), a write operation is performed on memory cells of 7 bits (second memory cells) on the same word line under the same bias conditions as those of the write target memory cell of 1 bit. Thus, as long as the selected memory cells on which the write operation is performed are on the same word line, the selected memory cells may not be adjacent to each other.

It is to be noted that the first bit line selection circuit and the second bit line selection circuit each are a circuit that functions in the same manner as the bit line decoder 206 shown in FIG. 23 to be described later.

FIG. 16 represents the configuration diagram shown in FIG. 15 as a memory cell array equivalent circuit. FIG. 16 also differs from FIG. 13 in that write constant current sources are inserted to the memory cell array equivalent circuit shown in FIG. 13 as structural elements connected to selected bit lines BL0 to BL7, in addition to the write power source 197.

As described in terms of the effect produced by the multi-bit simultaneous writing in the present invention, the simultaneous writing to the bits on the same word line has the higher writing efficiency than that of the 1-bit writing, that is, the proportion of the current flowing through the selected memory cell to the current flowing through the selected bit lines increases, and thus it is expected that a set resistance value will differ depending on the number of bits simultaneously written, when the low resistance writing in which a resistance value is determined according to an amount of flowing current is performed.

To verify this, a writing simulation using the memory cell array equivalent circuit shown in FIG. 16 is performed. A variable resistance element mode in which when a voltage VR applied to a selected variable resistance element 10 reaches a predetermined voltage, a resistance value of the variable resistance element 10 is determined according to VR and an amount of a current flowing through the variable resistance element 10 (i.e., the resistance value is calculated as VR/the amount of the current) is used for a simulation method. In this manner, a current flowing through the variable resistance element 10 and a resistance value of the variable resistance element 10 are calculated in connection with the number of bits simultaneously written.

FIG. 17A and FIG. 17B each are a graph showing a calculation result.

FIG. 17A is a graph whose horizontal axis represents the number of bits simultaneously written and vertical axis represents a current flowing through a selected memory cell that is a target of the low resistance writing. According to the graph of FIG. 17A, whereas a current flowing through a selected memory cell is Il1 in the 1-bit writing, a cell current increases as the number of bits on the same word line that are simultaneously written increases, and increases to Il8 in the 8-bit simultaneous writing.

FIG. 17B is a graph obtained by plotting, based on the current values in FIG. 17A, low resistance set values according to the calculation method.

FIG. 17B is a graph whose horizontal axis represents the number of bits simultaneously written and vertical axis represents a set resistance value of a variable resistance element that is a target of the low resistance writing. According to the graph of FIG. 17B, although a current flowing through a selected memory cell is Il1 in the 1-bit writing, a voltage VR applied to the variable resistance element does not reach a threshold voltage necessary for resistance change, and thus a resistance change (low resistance writing) fails to occur, and the resistance value is Rl1 corresponding to the high resistance (HR) state. The resistance change (low resistance writing) of the variable resistance element occurs when the number of bits simultaneously written is greater than or equal to two bits. The set resistance value decreases as the number of bits simultaneously written increases, and decreases to Rl8 in the 8-bit simultaneous writing.

As stated above, the method of simultaneously writing to memory cells on the same word line makes it possible to efficiently set the low resistance writing (i.e., to control a resistance value of the variable resistance element 10 in the low resistance state) when the variable resistance element 10 of the selected memory cell is changed to the low resistance state, in addition to the low power consumption effect by the increase in the writing efficiency.

To summarize, in the cross point variable resistance nonvolatile memory device in the present invention, the following method is considered as a programming method when simultaneous writing is performed on memory cells on the same word line.

In the case where memory cells that constitute a memory cell array include memory cells of two groups that share a word line, that is, (i) first memory cells for data storage and (ii) second memory cells for data storage or not for data storage, when one or more predetermined memory cells of the first memory cells are written to by changing the one or more predetermined memory cells to a first resistance state (the high resistance state/low resistance state), a word line write circuit provides a first voltage or a first current to a selected word line, a first bit line write circuit provides a third voltage or a third current to one bit line of the first memory cells, and a second bit line write circuit provides the third voltage or the third current to the A bit line or lines of the second memory cells.

Specifically, the word line write circuit provides the first voltage to one selected word line, and the first bit line write circuit and the second bit line write circuit provide the third voltage to selected bit lines, thereby simultaneously writing to selected memory cells each placed at a different one of cross points of the selected bit lines and the one selected word line, by changing the selected memory cells to the first resistance state.

Alternatively, the word line write circuit provides the first voltage to one selected word line, and the first bit line write circuit and the second bit line write circuit provide the third current to selected bit lines, thereby simultaneously writing to selected memory cells each placed at a different one of cross points of the selected bit lines and the one selected word line, by changing the selected memory cells to the first resistance state.

In contrast, when one or more predetermined memory cells of the first memory cells are written to by changing the one or more predetermined memory cells to a second resistance state (the high resistance state/low resistance state), the word line write circuit provides a second voltage or a second current to a selected word line, the first bit line write circuit provides a fourth voltage or a fourth current to one bit line of the first memory cells, and the second bit line write circuit provides the fourth voltage or the fourth current to the A bit line or lines of the second memory cells.

Specifically, the word line write circuit provides the second voltage to one selected word line, and the first bit line write circuit and the second bit line write circuit provide the fourth voltage to selected bit lines, thereby simultaneously writing to selected memory cells each placed at a different one of cross points of the selected bit lines and the one selected word line, by changing the selected memory cells to the second resistance state.

Alternatively, the word line write circuit provides the second voltage to one selected word line, and the first bit line write circuit and the second bit line write circuit provide the fourth current to selected bit lines, thereby simultaneously writing to selected memory cells each placed at a different one of cross points of the selected bit lines and the one selected word line, by changing the selected memory cells to the second resistance state.

In particular, it is possible to set a resistance value of a variable resistance element in the low resistance state to be a desired value by writing to a memory cell by applying a constant current to the memory cell.

Here, when the first bit line write circuit and the second bit line write circuit apply a voltage to the selected bit lines, for instance, a voltage of approximately the same (substantially the same) level is applied. Moreover, when the first bit line write circuit and the second bit line write circuit apply a current to the selected bit lines, for example, a current having approximately the same (substantially the same) amount is applied. In this way, the voltage or the current applied to variable resistance elements included in memory cells is adjusted to be the same value, any variable resistance element included in a corresponding one of the memory cells is set to approximately the same high resistance state or low resistance state, thereby achieving stable writing.

[Optimum Conditions for Minimizing Disturbing Caused by Unselected Memory Cells]

In terms of write disturbing occurring in variable resistance elements in unselected memory cells (influence such as a voltage leading to a possibility of resistance change of variable resistance elements of which resistance is not desired to change), the inventors have found an optimum number of bits simultaneously written for the multi-bit simultaneous writing method in the present invention in connection with an array aspect ratio of a memory cell array (a ratio between the n memory cells connected to one bit line and the m memory cells connected to one word line, or a ratio between the number of word lines and the number of bit lines that constitute the memory cell array).

The following describes an optimum number of bits for simultaneous writing in terms of minimizing disturbing, with reference to the drawings.

To verify disturbing characteristics for the variable resistance elements 10 in the unselected memory cells on the same word line in the multi-bit simultaneous writing method, a simulation using a memory cell equivalent circuit shown in FIG. 18 is performed. A configuration shown in FIG. 18 includes the configuration shown in FIG. 13. The simulation is performed while an n number of word lines of the memory cell array and a s number of bits simultaneously written are being varied as variable parameters.

The differences between the memory cell equivalent circuits shown in FIGS. 13 and 18 are described below.

The first difference is a size of the memory cell array. A m number of bit lines is fixed to 512 (bits), and the n number of word lines is varied in a range from 8 to 64 (lines).

The second difference is that the s number of bits simultaneously written is varied for each of three patterns of 1-bit writing, 8-bit simultaneous writing, and 16-bit simultaneous writing.

Since the memory cell array has the size in which the number of bits on the same bit line is "n" bits and the number of bits on the same word line is m=512 (bits), the numbers of bits of unselected memory cells in FIG. 18 are as follows: (n−1) for the number of tenth, eleventh, . . . (10+s−1)-th unselected memory cells 930, 931, . . . (930+s−1); (n−1)× (512−s) for the number of second unselected memory cells 194; and (512−s) for the number of third unselected memory cells 195.

Moreover, to determine the disturbing characteristics, a voltage applied across each of the variable resistance elements 10 of the tenth, eleventh, . . . (10+s−1)-th unselected memory cells 930, 931, . . . (930+s−1) is represented by Vr1, a voltage applied across the variable resistance element 10 of the second unselected memory cell 194 is represented by Vr2, a voltage applied across the variable resistance element 10 of the third unselected memory cell 195 is represented by Vr3, and set resistance values of the variable resistance elements of all the unselected memory cells indicate the high resistance (HR) state.

Next, the voltages Vr1, Vr2, and Vr3 applied to the variable resistance elements of first (the tenth, eleventh, . . . (10+s−1)-th) unselected memory cells, the second unselected memory cell, and the third unselected memory cell when an output voltage VPP of a write power source is 4.4V at the time of low resistance writing are calculated through simulations for the memory cell array under the conditions in which the n number of word lines of the memory cell array and the s number of bits simultaneously written are the variable parameters. FIG. 19 is a graph showing the calculation results.

(a), (b), and (c) in FIG. 19 are graphs obtained by plotting the calculation results of the voltages Vr1 to Vr3 at the time of the 1-bit writing, the time of the 8-bit simultaneous writing, and the time of the 16-bit simultaneous writing, respectively. In each of the graphs, the horizontal axis represents the n number of word lines of a memory cell array, and the vertical axis represents a voltage (0 to 9×) applied between variable resistance elements of unselected memory cells. Moreover, a disturbing limit voltage of each of the variable resistance elements 10 is 4×V and commonly applied to voltages between the variable resistance elements of the unselected memory cells as shown in FIG. 19.

In the 1-bit writing of (a) in FIG. 19, it is satisfactory that the voltage Vr2 of the variable resistance element of the second unselected memory cell 194 and the voltage Vr3 of the variable resistance element of the third unselected memory cell 195 are below the disturbing limit voltage 4×V, but the voltage Vr1 of each variable resistance element of the tenth, eleventh, . . . (10+s−1)-th unselected memory cells 930, 931, . . . (930+s−1) exceeds the disturbing limit voltage 4×V in any number of word lines (8 to 64). Thus, it is considered that the 1-bit writing is influenced by the disturbing.

In contrast, in the 8-bit simultaneous writing of (b) in FIG. 19, it is satisfactory that the voltage Vr2 of the variable resistance element of the second unselected memory cell 194 and the voltage Vr3 of the variable resistance element of the third unselected memory cell 195 are below the disturbing limit voltage 4×V, and although the voltage Vr1 of the variable resistance element of the tenth, eleventh, . . . (10+s−1)-th unselected memory cells 930, 931, . . . (930+s−1) slightly exceeds the disturbing limit voltage 4×V only when the number of word lines is eight, it is clear that increasing the number of word lines to 16 or more successfully minimizes the disturbing influence.

Moreover, it is clear from (b) in FIG. 19 that all of the voltages Vr1, Vr2, and Vr3 are lowest when the number of word lines is 64. Here, the 8-bit simultaneous writing in the memory cell array including the 64 word lines and 512 bit lines that is shown in (b) in FIG. 19 is referred to as case (A).

In contrast, in the 16-bit simultaneous writing shown in (c) in FIG. 19, any of the voltage Vr1 of the variable resistance element of the tenth, eleventh, . . . (10+s−1)-th unselected memory cells 930, 931, . . . (930+s−1), the voltage Vr2 of the variable resistance element of the second unselected memory cell 194, and the voltage Vr3 of the variable resistance element of the third unselected memory cell 195 are below the disturbing limit voltage 4×V, and thus it is clear that the disturbing influence is absent.

Moreover, it is clear from (c) in FIG. 19 that all of the voltages Vr1, Vr2, and Vr3 are lowest when the number of word lines is 32. Here, the 16-bit simultaneous writing in the memory cell array including the 32 word lines and 512 bit lines that is shown in (c) in FIG. 19 is referred to as case (B).

In the case (A), that is, in the 8-bit simultaneous writing shown in (b) in FIG. 19, since it is clear that the highest voltage among the three voltages Vr1 to Vr3 becomes the lowest voltage when the number of words is 64 (a dashed circle in the figure), the memory cell array whose number of word lines is 64 (the number of bit lines is 512) clearly makes most uniform the disturbing influence on the variable resistance elements of the unselected memory cells. From a reverse point of view, when the memory cell array has the size of 512 bit lines×64 word lines, the number of bits simultaneously written which makes the disturbing influence most uniform is eight bits.

In the case (B), that is, in the 16-bit simultaneous writing shown in (c) in FIG. 19, since it is clear that the highest voltage among the three voltages Vr1 to Vr3 becomes the lowest voltage when the number of words is 32 (a dashed circle in the figure), the memory cell array whose number of word lines is 32 (the number of bit lines is 512) clearly makes most uniform the disturbing influence on the variable resistance elements of the unselected memory cells. From a reverse point of view, when the memory cell array has the size of 512 bit lines×32 word lines, the number of bits simultaneously written which makes the disturbing influence most uniform is 16 bits.

The optimum s number of bits simultaneously written, and the m number of bit lines and the n number of word lines included in a memory cell array are calculated by the following simple relational expression.

The *s* number of bits simultaneously written=the *m* number of bit lines/the *n* number of word lines  (Equation 4)

It is found from Equation 4 that a relationship between the size of the memory cell array and the optimum number of bits simultaneously written can be considered in the following manner.

When the memory cell array has a size corresponding to a rectangle bit shape (n<m), the number of arrays having a square bit shape obtained by dividing the memory cell array having the rectangle bit shape into the square bit shapes corresponds to the optimum s number of bits simultaneously written (=m/n).

The details are described with reference to FIG. 20B showing a case where the 8-bit simultaneous writing is optimum and FIG. 20C showing a case where the 16-bit simultaneous writing is optimum. A memory cell array shown in FIG. 20B has a size of n×m=64 WLs×512 BLs, and when the memory cell array is divided into arrays having a square bit shape of 64 WLs×64 BLs, the number of the resultant arrays is eight. Thus, since this number (eight) is the same as the number of bits simultaneously written which makes the disturbing influence most uniform (described for (b) in FIG. 19), the number of the arrays having the square bit shape=the s number of bits simultaneously written is obvious.

Next, a memory cell array shown in FIG. 20C has a size of n×m=32 WLs×512 BLs, and when the memory cell array is divided into arrays having a square bit shape of 32 WLs×32 BLs, the number of the resultant arrays is 16. Thus, since this number (16) is the same as the number of bits simultaneously written which makes the disturbing influence most uniform (described for (c) in FIG. 19), the number of the arrays having the square bit shape=the s number of bits simultaneously written is obvious.

In other words, from the relationship between the case where the disturbing influence is minimum and the array division diagram (FIG. 20B, FIG. 20C), which is indicated by the voltage characteristic of the variable resistance elements 10 in the unselected memory cells to which the number of word lines WLs is varied as a variable parameter, it is clear that writing to a cell of 1 bit per array having a square bit shape (memory cell array having the number of bit lines=the number of word lines) makes the disturbing influence most uniform. Conversely, the array shape that makes most uniform the disturbing influence for the 1-bit writing is the square bit shape. (It is considered that the array shapes shown in FIGS. 20A, 20B, and 20C correspond to such a shape.)

Thus, where the number of bit lines extending in a Y direction is M, and the number of word lines in an X direction that three-dimensionally cross the Y direction is N (M>N), the selection circuit included in the cross point variable resistance nonvolatile memory device in the present invention may select, for instance, an M/N number of bit lines as bit lines simultaneously selected. This successfully minimizes the disturbing influence on the unselected memory cells in the multi-bit simultaneous writing.

Stated differently, when the first bit line selection circuit selects one bit line from the first memory cells (for data storage) included in the memory cells, and at the same time the second bit line selection circuit selects A (A is an integer greater than or equal to 1) bit line or lines from the second memory cells included in the memory cells, A is, for example, a predetermined constant value, that is, a value determined depending on M and N. More specifically, A is M/N−1, for instance. Here, the number of simultaneously selected bit lines is M/N. This successfully minimizes the disturbing influence on the unselected memory cells in the multi-bit simultaneous writing.

Moreover, when the number of selected word lines is specified as being greater than or equal to B (B is an integer) so that unselected memory cells each of which is placed at a different one of cross points of word lines unselected by the word line selection circuit and bit lines selected by the first bit line selection circuit and the second bit line selection circuit and is connected to a different one of the selected bit lines have a voltage less than or equal to a disturbing limit voltage defined based on the disturbing characteristics of the memory cells shown in FIG. 19, and the number of selected bit lines is specified as being less than or equal to C (C is an integer) so that unselected memory cells each of which is placed at a different one of cross points of a word line selected by the word line selection circuit and bit lines unselected by the first bit line selection circuit and the second bit line selection circuit and is connected to the selected word line have a voltage less than or equal to the disturbing limit voltage, a total number of bit lines (A+1) is set in, for example, a condition of B≤(A+1)≤C.

To put it another way, when, in the memory cell array, the number of bit lines to be simultaneously selected is greater than or equal to B so that a voltage applied to the first unselected memory cells that are memory cells connected to the unselected word lines other than the selected word line and the bit lines selected by the first bit line selection circuit and the second bit line selection circuit becomes less than or equal to a predetermined disturbing voltage, and the number of bit lines to be simultaneously selected is less than or equal to C (C is an integer) so that a voltage applied to the second unselected memory cells that are memory cells connected to the selected word line and the unselected bit lines other than the selected bit lines becomes less than or equal to the predetermined disturbing voltage, the total number of bit lines (A+1) selected by the first bit line selection circuit and the second bit line selection circuit is set in, for example, the condition of B≤(A+1)≤C.

From the above description, writing to the memory cell of 1 bit per memory cell array having the square bit shape makes substantially equally uniform the applied voltage of the unselected memory cells connected to the selected word line in the memory cell array having the square bit shape and the applied voltage of the unselected memory cells connected to the selected bit lines, thereby minimizing the disturbing influence. Since the entire memory cell array has the rectangular bit shape, the number of bits simultaneously written may be determined so that the entire memory cell array is effectively divided into arrays having the square bit shape or a similar shape depending on the number of bits in the multi-bit simultaneous writing.

Even when an effective memory cell array fails to have a square bit shape due to addition of redundant bits, ECC parity bits, and so on, as long as an applied voltage to unselected memory cells connected to a selected word line and an applied voltage to unselected memory cells connected to selected bit lines are less than or equal to a disturbing limit voltage in the effective memory cell array per 1 bit of a memory cell to which writing is performed, the effective memory cell array may have a rectangular bit shape.

As above, performing, using the optimum number of bits, the multi-bit simultaneous writing on the memory cell array having the rectangular bit shape produces the following effects:

An increase in efficiency of a current flowing through a selected memory cell per 1 bit makes it possible to perform sufficient writing, thereby increasing power consumption efficiency;

Disturbing influence on unselected memory cells is made uniform, and data is stably stored; and An access speed is increased depending on a method of writing.

To summarize, the multi-bit simultaneous writing method for the memory cells on the same word line (i) reduces the leakage current flowing through the unselected memory cells, (ii) achieves the high writing efficiency for the selected memory cells, (iii) minimizes the disturbing influence on the unselected memory cells, by performing, using the optimum number of bits (s=m/n), the multi-bit simultaneous writing on the memory cell array having the rectangular bit shape (the m number of bit lines, the n number of word lines, n<m), and (iv) further makes it possible to provide a cross point variable resistance nonvolatile memory device that enables high-speed writing.

It is to be noted that the memory cell array generally includes pseudo memory cells, redundant memory cells, and so on for various purposes. For this reason, there is a case where the number of bits simultaneously written s=m/n cannot be divided by an integer. In this case, the number of bits simultaneously written may be set to an integer close to m/n and to the extent that circuit design or layout design is possible.

It is to be noted that although the multi-bit simultaneous writing for the memory cells on the same word line is described using the single-layer cross point memory cell array shown in FIG. 1A in this embodiment, a similar multi-bit simultaneous writing method can be applied to the multi-layer cross point memory cell array shown in FIG. 1B, using a mode in which multiple memory cells are selected in the same predetermined layer. (e.g., simultaneous writing is performed on selected memory cells in the same layer by selecting one bit line in a predetermined layer, selecting bit lines in the same layer that are connected to one of terminals of a selected memory cell so that multiple memory cells in the same layer that are connected to selected bit lines are selected, and causing other word lines and bit lines to be in the high impedance state.)

In other words, the memory cell array included in the cross point variable resistance nonvolatile memory device in the present invention may be a multilayer cross point memory cell array including layers stacked in a Z direction orthogonal to an X direction and a Y direction, each of the layers including memory cells placed at respective cross points of bit lines and word lines. Here, the selection circuit included in the cross point variable resistance nonvolatile memory device selects bit lines belonging to the same layer as selected bit lines, and one word line belonging to a layer adjacent in the Z direction to the layer to which the selected bit lines belong (i.e., a word line connected to one ends of memory cells having the other ends connected to the selected bit lines) as a selected word line. In this manner, the multilayer memory cell array makes it possible to perform simultaneous writing on selected memory cells in the same layer (i.e., one layer including a layer of bit lines and a layer of word lines that are adjacent to each other).

Embodiment 2

Method for Stabilizing Multi-Bit Simultaneous Writing

The inventors have examined a stable writing method by the multi-bit simultaneous writing in the present invention when the multi-bit simultaneous writing method for the memory cells on the same word line is applied to the cross point variable resistance nonvolatile memory device. The details are described below as Embodiment 2.

In the cross point variable resistance nonvolatile memory device, data is generally accessed (inputted and outputted) using a format such as a byte (e.g., a group of eight bits) and a word (e.g., a group of 16 bits) each of which is a group of bits. For the sake of simplicity, the following describes a write operation for a byte consisting of 8-bit data.

(a) in FIG. 21 is an example showing an overview at a time of writing a byte, and shows exemplary given input data to be written. (b) in FIG. 21 shows exemplary data at a time of writing "0" data among the input data (e.g., low resistance (LR) writing). (c) in FIG. 21 shows exemplary data at a time of writing "1" data among the input data (e.g., high resistance (HR) writing).

The exemplary input data to be written shown in (a) in FIG. 21 is 8-bit data having "01000101" as D0 to D7. As shown in (a) in FIG. 21, since the input data to be written includes bits each having "0" or "1," in the cross point memory cell array including the variable resistance element that changes a direction of a write current, it is necessary to set a write voltage of the selected bit lines and the selected word line to different states for the low resistance writing and the high resistance writing. Thus, single input data needs to be divided into "0" data parts and "1" data parts, and writing needs to be performed by a time division method in which writing is performed with different timings. (b) in FIG. 21 shows, as W0 to W7, data cell write bits (a data cell write unit) obtained by extracting only the "0" data parts from the input data shown in (a) in FIG. 21. In addition, (c) in FIG. 21 shows, as W0 to W7, data cell write bits obtained by extracting only the "1" data parts from the input data shown in (a) in FIG. 21.

The number of the "0" data parts or the "1" data parts of the data cell write bits W0 to W7 respectively shown in (b) or (c) in FIG. 21 differs from time to time depending on the content of the input data. For instance, in the case of "0" data parts, the number of the "0" data parts may be only one bit or eight bits in input data. When the number of the bits having "0" or "1" and simultaneously written differs depending on the content of the input data, as can be seen from the dependency of the resistance value on the number of the bits simultaneously written described in FIG. 17B, the resistance value of the variable resistance element 10 to which writing is performed varies greatly.

The inventors have conceived a mechanism that makes the number of bits written always constant, to solve the above problem and stabilize the resistance value of the variable resistance element 10 after the writing. The following describes the basic concept of this mechanism, using a compensation cell write unit shown in (b) and (c) in FIG. 21.

(b) in FIG. 21 shows an overview of a "0" writing mechanism. As shown in (b) in FIG. 21, a compensation cell write unit for seven bits is separately provided in addition to the above-described data cell write unit for eight bits. Bits to which "0" is written by the data cell write unit are five bits of W0, W2, W3, W4, and W6, and thus the number of bits to which "0" is written by the compensation cell write unit is three bits. Based on the number of bits (in this example, five bits) to which "0" is written by the data cell write unit, the number of the bits (in this example, three bits) to which "0" is written by the compensation cell write unit is controlled so that a total number of the bits to which "0" is written by the data cell write unit and the compensation cell write unit is always eight bits.

(c) in FIG. 21 shows an overview of a "1" writing mechanism that is conceptually similar to the "0" writing mechanism. Bits to which "1" is written by the data cell write unit are three bits of W1, W5, and W7, and thus the number of bits to which "1" is written by the compensation cell write unit is five bits. Based on the number of the bits (in this example, three bits) to which "1" is written by the data cell write unit, the number of the bits (in this example, five bits) to which "1" is written by the compensation cell write unit is controlled so that a total number of the bits to which "1" is written by the data cell write unit and the compensation cell write unit is always eight bits.

FIG. 22A and FIG. 22B each show a configuration of a memory cell array 250 including a data cell unit 251 and a compensation cell unit 252. The following describes a more detailed write operation with reference to FIGS. 22A and 22B.

In FIGS. 22A and 22B, the data cell unit 251 is a memory cell array in which word lines are arranged evenly and in parallel with each other, bit lines orthogonal to the word lines are arranged evenly and in parallel with each other, and memory cells 51 each are placed at a different one of cross points of the word lines and the bit lines. The compensation cell unit 252 is a memory cell array in which word lines are arranged evenly and in parallel with each other, bit lines orthogonal to the word lines are arranged evenly and in parallel with each other, and memory cells 51 each are placed at a different one of cross points of the word lines and the bit lines. The word lines of the data cell unit 251 and those of the compensation cell unit 252 are connected (common), and collectively constitute the single memory cell array 250.

In the case of the "0" writing shown in FIG. 22A, one word line is selected, and among the memory cells 51 connected to the selected word line, five bits (W0, W2, W3, W4, W6) corresponding to the "0" writing in (b) in FIG. 21 are selected for writing as selected memory cells (indicated by black circle) in the data cell unit 251 by selecting bit lines, and three bits (S0, S1, S2) corresponding to compensation cell writing in (b) in FIG. 21 are selected for writing as selected memory cells (indicated by back circle) in the compensation cell unit 252 by selecting bit lines. Based on the number of the bits to which "0" is written by the data cell write unit, the number of the bits to which "0" is written by the compensation cell write unit is controlled so that the number of bits simultaneously written in the data cell unit 251 and the compensation cell unit 252 is always eight bits.

In the case of the "1" writing shown in FIG. 22B, one word line is selected, and among the memory cells 51 connected to the selected word line, three bits (W1, W5, W7) corresponding to the "1" writing in (c) in FIG. 21 are selected for writing as selected memory cells (indicated by black circle) in the data cell unit 251 by selecting bit lines, and five bits (S0, S1, S2, S3, S4) corresponding to compensation cell writing in (c) in FIG. 21 are selected for writing as selected memory cells (indicated by back circle) in the compensation cell unit 252 by selecting bit lines. In this case also, based on the number of the bits to which "1" is written by the data cell write unit, the number of the bits to which "1" is written by the compensation cell write unit is controlled so that the number of bits simultaneously written in the data cell unit 251 and the compensation cell unit 252 is always eight bits.

Thus, the input data having a mixture of "0, 1" is divided into data for the "0" writing and data for the "1" writing, the number of bits for the compensation cell writing is determined for each data, and multi-bit simultaneous writing for "0" data writing and multi-bit simultaneous writing for "1" data writing are sequentially performed in this order on the selected memory cells of the data cell unit and the compensation cell unit.

It is to be noted that the compensation cell write unit performs the same write operation as the data cell write unit, and a state change of the memory cells of the compensation cell write unit does not matter. In addition, everything other than unselected word lines, the compensation cell unit 252, "0" writing target bit lines at the time of the "0" writing, and "1" writing target bit lines at the time of the "1" writing is in the high impedance (Hi-z) state.

As above, based on the number of the bits written by the data cell write unit, the number of the bits written by the compensation cell write unit is controlled so that the total number of the bits simultaneously written is always constant, and thus it is possible to stabilize a set resistance value of the variable resistance element 10 that is a write target in the data cell unit.

In other words, the memory cell array included in the cross point variable resistance nonvolatile memory device in the present invention includes: the data cell unit 251 that is a group of memory cells corresponding to part of bit lines; and the compensation cell unit 252 that is a group of memory cells corresponding to another part of the bit lines. Then, the selection circuit included in the cross point variable resistance nonvolatile memory device selects, as the selected word line, the one word line common to the data cell unit 251 and the compensation cell unit 252, and selects bit lines from the bit lines included in the data cell unit 251 and bit lines from the bit lines included in the compensation cell unit 252 so that the total number of the selected bit lines is constant (for example, m/n lines).

Specifically, when "0" is written to the memory cells of the data cell unit 251, the selection circuit selects, as the selected word line, the one word line common to the data cell unit 251 and the compensation cell unit 252, and selects bit lines from the bit lines included in the data cell unit 251 and bit lines from the bit lines included in the compensation cell unit 252 so that the total number of the selected bit lines (the above A+1) is constant (for example, m/n lines). In addition, the write circuit simultaneously writes "0" to the memory cells placed at cross points of the one selected word line and the bit lines of the data cell unit 251 and the compensation cell unit 252 that are selected by the selection circuit.

In contrast, when "1" is written to the memory cells of the data cell unit 251, the selection circuit selects, as the selected word line, the one word line common to the data cell unit 251 and the compensation cell unit 252, and selects bit lines from the bit lines included in the data cell unit 251 and bit lines from the bit lines included in the compensation cell unit 252 so that the total number of the selected bit lines (the above A+1) is constant (for example, m/n lines). In addition, the write circuit simultaneously writes "1" to the memory cells placed at cross points of the one selected word line and the bit lines of the data cell unit 251 and the compensation cell unit 252 that are selected by the selection circuit.

As above, by making constant the total number of the bits to which "0" or "1" is simultaneously written for the data cell unit 251 and the compensation cell unit 252, it is possible to write multi-bit data including a given number of "0" (or a given number of "1") for the data cell unit, and to stabilize the set resistance value of the variable resistance element 10 included in the memory cell that is the target of writing in the data cell unit.

FIG. 23 is a block diagram showing an exemplary circuit configuration of a cross point variable resistance nonvolatile memory device 2000 that achieves the multi-bit simulation writing for the memory cells on the same word line. The following describes the circuit configuration and its operation with reference to FIG. 23.

The cross point variable resistance nonvolatile memory device 2000 functionally has the following structure. Specifically, the cross point variable resistance nonvolatile memory device 2000 includes a cross point memory cell array (the memory cell array (data cell unit) 203 and the compensation cell unit 252) that, includes memory cells each including: a variable resistance element that reversibly changes at least between a first resistance state and a second resistance state due to application of voltages having different polarities; and a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction. Here, the memory cells of the memory cell array are divided into first memory cells (e.g., part of the memory cell array (data cell unit) 203) and second memory cells (e.g., another part of the memory cell array (data cell unit) 203 or the compensation cell unit 252) that are connected to the same word line connected to the first memory cells.

The cross point variable resistance nonvolatile memory device 2000 further includes: a word line selection circuit (a word line decoder/driver 205) that selects, for the memory cell array, one word line as a selected word line; a first bit line selection circuit (a bit line decoder 206) that selects one bit line of the first memory cells as a first selected bit line; a second bit line selection circuit (the bit line decoder 206 or a selection circuit included in a compensation write circuit 211) that selects, as at least one second selected bit line, A (A is an integer greater than or equal to 1) bit line or lines of the second memory cells including memory cells on the selected word line; a word line write circuit (the word line decoder/driver 205, a write power source 218) that supplies, to memory cells selected from among the first memory cells and the second memory cells through the selected word line, a first voltage or a first current to write to the memory cells by changing the memory cells to a first resistance state, and a second voltage or a second current to write to the memory cells by changing the memory cells to a second resistance state; a first bit line write circuit (a write circuit 210, the write power source 218) that supplies, to a memory cell selected from among the first memory cells through the first selected bit line selected by the first bit line selection circuit, a third voltage or a third current to write to the memory cell by changing the memory cell to the first resistance state, and a fourth voltage or a fourth current to write to the memory cell by changing the memory cell to the second resistance state; and a second bit line write circuit (the write circuit 210, the write power source 218, a write bit count control circuit 209, the compensation write circuit 211) that supplies, to at least one memory cell selected from the second memory cells through the at least one second selected bit line selected by the second bit line selection circuit, the third voltage or the third current to write to the at least one memory cell by changing the at least one memory cell to the first resistance state, and the fourth voltage or the fourth current to write to the at least one memory cell by changing the at least one memory cell to the second resistance state.

When the cross point variable nonvolatile memory device 2000 writes, through a write operation, to a predetermined number of the first memory cells by changing the predetermined number of the first memory cells to the first resistance state, the word line write circuit supplies the first voltage or the first to the selected word line, the first bit line write circuit supplies the third voltage or the third current to the one bit line of the first memory cells, and the second bit line write circuit supplies the third voltage or the third current to the A bit line or bit lines of the second memory cells. In contrast, when the write circuit 2000 writes to a predetermined number of the first memory cells by changing the predetermined number of the first memory cells to the second resistance state, the word line write circuit supplies the second voltage or the second current to the selected word line, the first bit line write circuit supplies the fourth voltage or the fourth current to the one bit line of the first memory cells, and the second bit line write circuit supplies the fourth voltage or the fourth current to the A bit line or lines of the second memory cells.

Moreover, the cross point variable nonvolatile memory device 2000 includes, for reading: a word line read voltage generation circuit (the power source of the word line decoder/driver 205) that supplies a fifth voltage to a memory cell selected from among the first memory cells and the second memory cells through the selected word line, to read stored data from the memory cell; a first read circuit (the sense amplifier 212) that supplies a sixth voltage or a sixth current to a memory cell selected from among the first memory cells through the first selected bit line selected by the first bit line selection circuit, to read stored data from the memory cell; and at least one second read circuit (the sense amplifier 212) that supplies the sixth voltage or the sixth current to a memory cell selected from among the second memory cells through the A selected bit line or lines selected by the second bit line selection circuit, to read stored data from the memory cell.

When the cross point variable nonvolatile memory device 2000 reads, through a read operation, from a predetermined number of the second memory cells, the word line read voltage generation circuit supplies the fifth voltage to the selected word line, the first read circuit supplies the sixth voltage or the sixth current to the one bit line of the first memory cells, and the second read circuit supplies the sixth voltage or the sixth current to the A bit line or lines of the second memory cells. The following describes the details of these structural elements.

In FIG. 23, a memory cell array 203 is an example of the memory cell array of the data cell unit 251 shown in FIGS. 22A and 22B. The memory cell array 203 has, for instance, a size of 64 WLs×512 BLs, and blocks 204 obtained by dividing its array region by eight (e.g., a unit of 64 BLs) each include bit lines. Stated differently, in this embodiment, the array region is divided by eight, since the number of bits simultaneously written is eight bits. The memory cell array 203 typically corresponds to the first memory cells including a first memory cell for data storage. However, the memory cell array 203 may include the second memory cells for data storage or not for data storage.

A compensation cell unit 252 is the memory cell array (a block of a compensation memory cell array) of the compensation cell unit 252 shown in FIGS. 22A and 22B, and has, for instance, a size of 64 WLs×7 BLs. Word lines of the compensation cell unit 252 are shared with the memory cell array 203 of the data cell unit. The compensation cell unit 252 typically includes the second memory cells not for data storage.

The word line decoder/driver 205 corresponds to the word line selection circuit and the word line read voltage generation circuit, and is a circuit that selectively drives word lines WL0 to WL(n−1) [e.g., n=64].

The bit line decoder 206 corresponds to the first bit line selection circuit and the second bit line selection circuit, and is a decoder circuit that selects bit lines BL00 to BL7 (h−1) [h is the number of BLs divided, and h=64, for example] of the memory cell array 203 as the data cell unit. Bit line decoders 206 each correspond to a different one of the eight blocks 204 (block 0 to block 7) and select one of bit lines in the corresponding one of the blocks 204. The bit line decoders 206 select a total of the eight bit lines for all the blocks and set other unselected bit lines to the high impedance state.

A data input circuit 207 is an 8-bit input circuit that receives data from an input terminal Din(i) [i=0 to 7].

A data latch circuit is an 8-bit latch circuit that latches outputs of the data input circuit 207.

The write circuit 210 corresponds to the first bit line write circuit and the second bit line write circuit, and is an 8-bit write circuit that selectively generates a write voltage (or current) according to an output data signal of the data latch circuit 208. Here, an output WD(i) of the write circuit 210 is applied to a bit line of a write target bit through the bit line decoder 206.

The write bit count control circuit 209 corresponds to a circuit that partially constitutes the second bit line write circuit, outputs a bit line decoder control signal Wcnt(i) for determining validity or invalidity of bit line selection determined by addresses of the bit line decoders 206 each corresponding to the different one of the blocks 204 (transmits, to a selected bit line, an output WD(i) state of the write circuit 210 in the case where the bit line selection is determined valid, and puts bit lines into the high impedance state in the case where the bit line selection is determined invalid), according to an output of the data latch circuit 208, and outputs, as Wbit(j) [j=0 to 2], a write target bit count information signal for the compensation cell unit 252.

The compensation write circuit 211 corresponds to a circuit that partially constitutes the second bit line write circuit, and is a circuit that selects, upon receiving the write target bit count information signal Wbit(j), a write target bit line in the compensation cell unit 252 and applies a write voltage (or current) to the write target bit line. The compensation write circuit 211 has functions of both the bit line decoder and the write circuit. Thus, the bit lines other than the write target bit line in the compensation cell unit 252 are put into the high impedance state.

A sense amplifier 212 corresponds to a first read circuit and a second read circuit, and is an exemplary read circuit that determines data memory states of respective 8-bit memory cells 51 selected from each block 204 by the bit line decoder 206, that is, whether the 8-bit selected memory cells 51 each are in the high resistance state or the low resistance state.

A data output circuit 213 is an 8-bit latch circuit that outputs, to a latch and Dout terminal, an 8-bit data signal RD(i) outputted by the sense amplifier 212.

A memory functional block 201 is a circuit including the memory cell array 203, the compensation cell unit 252, the word line decoder/driver 205, the bit line decoder 206, the data input circuit 207, the data latch circuit 208, the write circuit 210, the write bit count control circuit 209, the compensation write circuit 211, the sense amplifier 212, and the data output circuit 213.

An address input circuit 214 is a circuit that latches an address signal input, and outputs a word line selection address signal AX and a bit line selection address signal AY after dividing the address signal input into bits. Here, the word line selection address signal AX is inputted to the word line decoder/driver 205, and the bit line selection address signal AY is inputted to the bit line decoder 206.

A control circuit 215 is a CPU or the like that outputs, upon receiving various control signals from the outside, a control signal for controlling the operation of the memory functional block 201 (e.g., a write pulse signal PULSE to be described later, a signal W01C representing a state of "0" data writing and "1" data writing, and so on).

An LR writing power source 216 is a power source that generates a low resistance writing voltage VLR (or current). The output of the LR writing power source 216 is provided to the write circuit 210 and the compensation write circuit 211.

A HR writing power source 217 is a power source that generates a high resistance writing voltage VHR (or current). The output of the HR writing power source 217 is provided to the word line decoder/driver 205.

The write power source 218 includes the LR writing power source 216 and the HR writing power source 217, and generates each of voltages based on a power source VDD and further a power supply voltage (write voltage VPP) that is a high voltage.

The following describes in detail the operation of the cross point variable resistance nonvolatile memory device 2000 that is thus configured and achieves the multi-bit simultaneous writing in the present invention, with reference to a sequence diagram of FIG. 24 showing a specific example.

In FIG. 24, a clock inputted to the control circuit 215 as one of control signals is outputted to the memory functional block 201 as a clock signal CLK, and a rise cycle of the clock includes times t0, t4, t7, t10, . . . . Main operations of the memory functional block 201 are controlled with rise timing of the CLK. Upon receiving an address signal as an external input, the address input circuit 214 latches the address signal at a rise time (t0, t4, t7, t10, . . . ) of the clock signal CLK, and outputs the address signal as internal address signals AX and AY. Here, AX=1, AY=1 at the times t0 to t7, and AX=2, AY=1 after the time t7.

The signal W01C outputted by the control circuit 215 is a signal indicating whether an operation is the "0" data writing (LR writing) or the "1" data writing (HR writing) according to the control signal. The signal W01C is used for controlling the LR writing or the HR writing for the word line decoder/driver 205, the write circuit 210, the write bit count control circuit 209, the compensation write circuit 211, and so on. The signal W01C changes to "L" level representing the "0" data writing at the times t0 to t4, and thus the memory functional block 201 performs a low resistance (LR) writing operation. In addition, the signal W01C changes to "H" level representing the "1" data writing at the times t4 to t7, and thus the memory functional block 201 performs a high resistance (HR) writing operation.

Din(i) is an 8-bit data input signal and used when data to be written (e.g., "01000101") before the time t0 is inputted to the data input circuit 207.

LD(i) is an output signal of the data latch circuit 208. The data latch circuit 208 latches Din(i) data inputted through the data input circuit 207, when the clock signal CLK rises (t0, t4, t7, t10, . . . ). An output of the data latch circuit 208 is held regardless of whether an output of the data input circuit 207 varies, and is maintained until the next clock signal rises.

The bit line decoder control signal Wcnt(i) outputted by the write bit count control circuit 209 is a signal for controlling, upon reception of the signals W01C and LD(i), a valid state or an invalid state of each of the bit line decoders 206 corresponding to the different one of the blocks, at each of the time of the "0" data writing and the time of the "1" data writing. Here, at the times t0 to t4, a bit line decoder control signal Wcnt(0, 2, 3, 4, 6) changes to "H," and Wcnt(1, 5, 7) changes to "L." At this time, the bit line decoders 206 respectively corresponding to the blocks 0, 2, 3, 4, 6 each electrically connect a predetermined selected bit line and a WD(0, 2, 3, 4, 6) node, whereas the bit line decoders 206 respectively corresponding to the blocks 1, 5, 7 each electrically terminate (disable) a connection with a WD(1, 5, 7) node. At times t4 to t7, the bit line decoder control signal Wcnt(1, 5, 7) changes to "H," and the bit line decoder control signal Wcnt(0, 2, 3, 4, 6) changes to "L." Here, the bit line decoders 206 respectively corresponding to the blocks 1, 5, 7 each electrically connect a predetermined selected bit line and a WD(1, 5, 7) node, whereas the bit line decoders 206 respectively corresponding to the blocks 0, 2, 3, 4, 6 each electrically terminate (disable) a connection with a WD(0, 2, 3, 4, 6) node.

The write bit count control circuit 209 simultaneously outputs the bit line decoder control signal Wcnt(i) and the write target bit count information signal Wbit(j) to the compensation write circuit 211, and performs control at the times t0 to t4 so that the number of bits written by the compensation write circuit 211 is three bits, by outputting a write target bit count information signal Wbit(j)=3. In addition, the write bit count control circuit 209 performs control at the times t4 to t7 so that the number of bits written by the compensation write circuit 211 is five bits, by outputting a write target bit count information signal Wbit(j)=5.

When the PULSE signal outputted by the control circuit 215 is at "L," all the word lines and a selected bit line are pre-charged to a pre-charge voltage VPRE, and when the PULSE signal is at "H," a predetermined write voltage is applied to a selected word line and the selected bit line. All the word lines and the selected bit line are pre-charged at the times t0 to t1 according to PULSE="L," a predetermined low resistance (LR) writing voltage is applied to the selected word line and the selected bit line at the times t1 to t2 according to PULSE="H," the pre-charging is performed at the times t2 to t5 according to PULSE="L," a predetermined high resistance (HR) writing voltage is applied to the selected word line and the selected bit line at the times t5 to t6 according to PULSE="H," and the pre-charging is performed again at the times t6 to t7 according to PULSE="L."

A write pulse output WD(i) of the write circuit 210 is outputted in synchronization with the PULSE signal to a write target block 204 as a write voltage corresponding to the time of the "0" data writing and the time of the "1" data writing. For instance, all WD(i) become pre-charge voltage VPRE outputs at the times t0 to t1 according to PULSE="L," a predetermined low resistance (LR) writing voltage is outputted to "0" data write target WD(i) at the times t1 to t2 according to PULSE="H," all WD(i) become the pre-charge voltage VPRE outputs at the times t2 to t5 according to PULSE="L," a predetermined high resistance (HR) writing voltage is outputted to "1" data write target WD(i) at the times t5 to t6 according to PULSE="H," and all WD(i) become the pre-charge voltage VPRE outputs at the times t6 to t7 according to PULSE="L."

As shown in FIG. 24, the write control is performed on each word line, bit line, and compensation bit line at the predetermined times according to the signals CLK, W01C, LD(i), Wcnt(i), Wbit(j), PULSE, and WD(i). For example, when CLK changes from "L" to "H" at the time t0, the following occur: a selected word line and a selected bit line connected to a write target bit are determined based on addresses AX and AY latch outputted by the address input circuit 214; the memory functional block 201 is functionally set to the "0" data writing because the W01C signal changes to "L"; the data latch circuit 208 latch outputs, as LD(i), Din(i) inputted through the data input circuit 207; in response to a change of LD(i), Wcnt(i) changes to "H" [Wcnt(0, 2, 3, 4, 6)="H"] for a bit having "0" as indicated by LD(i), and Wcnt(i) changes to "L" [Wcnt(1, 5, 7)="L"] for a bit having "1" as indicated by LD(i); and upon receiving the Wcnt(i) signal, it is determined whether the blocks of the respective bit line decoders 206 each are a "0" data writing valid block or a "0" data writing invalid block. Similarly, in response to the change of LD(i), Wbit(j) indicating the number of bits having "1" as indicated by LD(i) is outputted. At this point, appropriate low resistance writing when PULSE changes to "H" is prepared, all the word lines are pre-charged to the pre-charge voltage VPRE, a selected bit line BL(0, 2, 3, 4, 6)m that is a target of the "0" data writing is pre-charged to the pre-charge voltage VPRE, a selected bit line BL(1, 5, 7)m that is a target of the "1" data writing is put into the high impedance (Hi-z) state, unselected bit lines are put into the high impedance (Hi-z) state, and all compensation bit lines BLC(s) are pre-charged to the pre-charge voltage VPRE.

When PULSE changes from "L" to "H" at the time t1, the selected word line has a voltage of 0V, the unselected word lines are put into the high impedance (Hi-z) state, a low resistance writing voltage VLR of WD (0, 2, 3, 4, 6) is applied to the selected bit line BL(0, 2, 3, 4, 6)m that is the target of the "0" data writing, the selected bit line BL(1, 5, 7)m that is the target of the "1" data writing is still in the high impedance (Hi-z) state, the unselected bit lines are still in the high impedance (Hi-z) state, three of the compensation bit lines BLC(s) have the low resistance writing voltage VLR, and four of the same are put into the high impedance (Hi-z) state.

When PULSE changes from "H" to "L" at the time t2, as with the time t0, all the word lines are pre-charged to the pre-charge voltage VPRE, the selected bit line BL(0, 2, 3, 4, 6)$_m$ that is the target of the "0" data writing is pre-charged to the pre-charge voltage VPRE by WD(0, 2, 3, 4, 6), the selected bit line BL(1, 5, 7)m that is the target of the "1" data writing is still in the high impedance (Hi-z) state, the unselected bit lines are still in the high impedance (Hi-z) state, and all the compensation bit lines BLC(s) are pre-charged to the pre-charge voltage VPRE.

When CLK changes from "L" to "H" at the time t4, the following occur: the address input circuit 214 latches again the same addresses as in the previous clock cycle, thereby continuously selecting the selected word line and the selected bit line connected to the write target bit determined based on the addresses AX and AY in the same manner as the previous clock cycle; the memory functional block 201 is functionally set to the "1" data writing this time because the W01C signal changes from "L" to "H"; the data latch circuit 208 latch outputs again, as LD(i), Din(i) inputted through the data input circuit 207 in the same manner as the previous clock cycle; in response to a change of W01C, Wcnt(i) changes to "L" [Wcnt (0, 2, 3, 4, 6)="L"] for a bit having "0" as indicated by LD(i), and Wcnt(i) changes to "H" [Wcnt(1, 5, 7)="H"] for a bit having "1" as indicated by LD(i); and upon receiving the Wcnt(i) signal, it is determined whether the blocks of the respective bit line decoders 206 each are the "0" data writing valid block or the "0" data writing invalid block. Similarly, in response to the change of W01C, LD(i) is outputted as Wbit(j) indicating the number of bits having "0." At this point, appropriate low resistance writing when PULSE changes to "H" is prepared, all the word lines are continuously pre-charged to the pre-charge voltage VPRE, the selected bit line BL(0, 2, 3, 4, 6)m that is the target of the "0" data writing is put into the high impedance (Hi-z) state, the selected bit line BL(1, 5, 7)m that is the target of the "1" data writing is pre-charged to the pre-charge voltage VPRE, the unselected bit lines are continuously in the high impedance (Hi-z) state, and all the compensation bit lines BLC(s) are continuously pre-charged to the pre-charge voltage VPRE.

When PULSE changes from "L" to "H" at the time t5, the selected word line has a high resistance writing voltage VHR, the unselected word lines are put into the high impedance (Hi-z) state, a high resistance writing voltage of 0V is applied to the selected bit line BL(1, 5, 7)m that is the target of the "1" data writing, the selected bit line BL(0, 2, 3, 4, 6)m that is the target of the "0" data writing is continuously in the high impedance (Hi-z) state, the unselected bit lines are continuously in the high impedance (Hi-z) state, five of the compensation bit lines BLC(s) have the high resistance writing voltage of 0V, and two of the same are put into the high impedance (Hi-z) state.

When PULSE changes from "H" to "L" at the time t6, as with the time t4, all the word lines are pre-charged to the pre-charge voltage VPRE, the selected bit line BL(1, 5, 7)m that is the target of the "1" data writing is pre-charged to the pre-charge voltage VPRE by WD(1, 5, 7), the selected bit line BL(0, 2, 3, 4, 6)m that is the target of the "0" data writing is still in the high impedance (Hi-z) state, the unselected bit lines are still in the high impedance (Hi-z) state, and all the compensation bit lines BLC(s) are pre-charged to the pre-charge voltage VPRE.

The following summarizes the above method of writing. Specifically, the method of writing for use in the cross point variable resistance nonvolatile memory device 2000 in the present invention includes: selecting bit lines as selected bit lines, and one word line as a selected word line, from a cross point memory cell array that includes memory cells each including: a variable resistance element that reversibly changes at least between the low resistance state and the high resistance state due to application of voltages having different polarities; and a bidirectional current steering element that is connected in series with the variable resistance element and has nonlinear current-voltage characteristics, the memory cells being placed at respective cross points of bit lines extending in a Y direction and word lines extending in an X direction; and performing simultaneous writing on memory cells placed at cross points of the selected bit lines and the one selected word line, by supplying a first voltage or a first current to each of the selected bit lines selected in the selecting, and a second voltage or a second current to the one selected word line. In other words, when writing to the memory cell array, the cross point variable resistance nonvolatile memory device always performs the simultaneous writing on (1+A) memory cells connected to the same word line.

More specifically, the memory cell array includes: a data cell unit (the memory cell array 203) that is a group of memory cells corresponding to part of the bit lines; and a compensation cell unit (the compensation cell unit 252) that is a group of memory cells corresponding to another part of the bit lines, and in the selecting, one word line common to the data cell unit and the compensation cell unit is selected as a selected word line, and bit lines are selected from the bit lines included in each of the data cell unit and the compensation cell unit so that a total number of the bit lines selected from the bit lines included in the data cell unit and the bit lines selected from the bit line included in the compensation cell unit is constant.

From another point of view, when the cross point variable resistance nonvolatile memory device 2000 writes, through a write operation, to a predetermined number of the first memory cells by changing the predetermined number of the first memory cells to the first resistance state, the word line write circuit supplies the first voltage or the first current to the selected word line, the first bit line write circuit supplies a third voltage or a third current to one of the bit lines of the first memory cells, and the second bit line write circuit supplies the third voltage or the third current to the A bit line or lines of the second memory cells. On the other hand, when the cross point variable resistance nonvolatile memory device 2000 writes to a predetermined number of the first memory cells by changing the predetermined number of the first memory cells to a second resistance state, the word line write circuit supplies the second voltage or the second current to the selected word line, the first bit line write circuit supplies a fourth voltage or a fourth current to one of the bit lines of the first memory cells, and the second bit line write circuit supplies the fourth voltage or the fourth current to the A bit line or lines of the second memory cells. Here, the A is always, for instance, a predetermined constant value and, specifically, equal to M/N−1 or an integer close to M/N−1.

As described in FIG. 21, such a configuration example and operation achieve a multi-bit simultaneous writing memory system that successfully controls the number of bits written in the compensation cell write unit based on the number of bits written in the data cell write unit so that a total number of bits having "0" or "1" and simultaneously written is always constant. As a result, it is possible to write, to the data cell unit, multi-bit data having a given number of "0" (or a given number of "1"), and to provide the cross point variable resistance nonvolatile memory device that successfully stabilizes the set resistance value of the variable resistance element 10 that is the write target in the data cell unit.

Embodiment 3

Method for Stabilizing Multi-Bit Simultaneous Reading

The multi-bit simultaneous writing for the memory cells on the same word line, which increases the efficiency of writing, its specific configuration, and its operation have thus far been described.

Similar to the multi-bit simultaneous writing, multi-bit simultaneous reading is also effective as a method for stabilizing read characteristics in which a leakage current is reduced. The following describes, as Embodiment 3, a reading stabilization effect by the multi-bit simultaneous reading, its specific configuration, and its operation.

FIG. 25 shows an outline of a configuration of a memory cell array 1.

In FIG. 25, memory cells 51 are the same as those shown in FIG. 4. The memory cell array 1 includes: WL0 to WL(n−1), an n number of word lines 24, arranged in parallel with each other; BL0 to BL(m−1), a m number of bit lines 25, arranged in parallel with each other to be orthogonal to the word lines 24; and the memory cells 51 placed at respective cross points of the word lines 24 and the bit lines 25.

In FIG. 25, a first selected memory cell 1510 (i.e., a memory cell among first memory cells) and second selected memory cells 1511 (i.e., memory cells among second memory cells) that are connected to the same word line connected to the first selected memory cell 1510 are selected as read target memory cells. Here, assuming that the second selected memory cells 1511 are seven bits (an example of the A selected bit line or lines), a case of selecting and reading 8-bit memory cells 126 on the same word line is described as an example.

A word line selection circuit (not shown) that selects a predetermined one word line from among the n number of word lines is connected to ends of WL0 to WL(n−1), and selects WL1 here. A first bit line selection circuit (not shown) that selects a bit line BL0 connected to the first selected memory cell 1510 is connected to an end of the bit line BL0, and selects BL0 here. A second bit line selection circuit (not shown) that selects a predetermined bit line is connected to ends of bit lines BL1 to BL(m−1) connected to memory cells other than the first selected memory cell 1510, and selects BL1 to BL7 here. The word line selection circuit has an input terminal connected to a word line read voltage generation circuit (not shown) that supplies a word line voltage at a time of reading, and applies the word line voltage to the selected word line through the word line selection circuit at the time of reading. In contrast, the first bit line selection circuit and the second bit line selection circuit each have an input terminal connected to the same number of read circuits as that of the selected memory cells. Here, a first read circuit (not shown) is electrically connected to the first selected memory cell 1510 through the first bit line selection circuit, and seven second read circuits (not shown) each are electrically connected to a corresponding one of selected memory cells among the second selected memory cells 1511 through the second bit line selection circuit.

The word line read voltage generation circuit supplies a fifth voltage to the selected word line WL1 through the word line selection circuit, and at the same time the first read circuit and the seven second read circuits each supply a sixth voltage or a sixth current to a corresponding one of the selected bit lines BL0 to BL7 through the first bit line selection circuit and the second bit line selection circuit, thereby simultaneously reading states of data stored in the selected 8-bit memory cells. Stated differently, in this embodiment, when reading from the memory cell array, the cross point variable resistance nonvolatile memory device always simultaneously reads from (1+A) memory cells connected to the same word line.

FIG. 25 is a diagram showing a relationship between an array equivalent circuit including the 8-bit selected memory cells 126 and the unselected memory cells, and eight current detection circuits 960 to 967 each corresponding to a different one of the eight selected memory cells.

In FIG. 26, a first selected memory cell 260 has one terminal connected to the selected word line WL1, and the other terminal connected to the selected bit line BL0. Likewise, a second selected memory cell 261 has one terminal connected to the selected word line WL1, and the other terminal connected to the selected bit line BL1. Similarly, a seventh selected memory cell 266 has one terminal connected to the selected word line WL1, and the other terminal connected to the selected bit line BL6. In the same way, an eighth selected memory cell 267 has one terminal connected to the selected word line WL1, and the other terminal connected to the selected bit line BL7. It is to be noted that, although not shown in the figure, third to sixth selected memory cells similarly have the other terminals connected to the selected bit lines BL2 to BL5, respectively.

Moreover, a tenth unselected memory cell 930 has one terminal connected to unselected word lines NW, and the other terminal connected to the selected bit line BL0. Likewise, an eleventh unselected memory cell 931 has one terminal connected to the unselected word lines NW, and the other terminal connected to the selected bit line BL1. Similarly, a sixteenth unselected memory cell 936 has one terminal connected to the unselected word lines NW, and the other terminal connected to the selected bit line BL6. In the same way, a seventeenth unselected memory cell 937 has one terminal connected to the unselected word lines NW, and the other terminal connected to the selected bit line BL7. It is to be noted that, although not shown in the figure, twelfth to fifteenth unselected memory cells similarly have the other terminals connected to the selected bit lines BL2 to BL5, respectively.

A second unselected memory cell 194 is a memory cell provided between unselected WLs and unselected BLs. A third unselected memory cell 195 is a memory cell provided between the unselected BLs and the selected word line WL1. A target number of each of second unselected memory cells 194 and third unselected memory cells 195 slightly varies depending on the number of selected memory cells.

A sense power source 97 is a power source for current detection. A first current detection circuit 960 is a current detection circuit that uses the sense power source 97 as a power source and is connected to the selected bit line BL0. A second current detection circuit 961 is a current detection circuit that uses the sense power source 97 as the power source and is connected to the selected bit line BL1. A seventh current detection circuit 966 is a current detection circuit that uses the sense power source 97 as the power source and is connected to the selected bit line BL6. An eighth current detection circuit 967 is a current detection circuit that uses the sense power source 97 as the power source and is connected to the selected bit line BL7. It is to be noted that, although not shown in the figure, third to sixth current detection circuits each are connected to a corresponding one of the selected bit lines BL2 to BL5. It is also to be noted that the unselected WLs are in the high impedance (Hi-z) state.

(a), (b), and (c) in FIG. 27 show operating point diagrams each for an I-V characteristic of the memory cell array in the present invention shown in FIG. 26 with reference to unselected word lines (point NW) at the time of reading, comparing 1-bit reading and 8-bit reading. (a) in FIG. 27 is a characteristic diagram at a time of 1-bit writing. (b) and (c) in FIG. 27 each are a characteristic diagram obtained by adding, to (a) in FIG. 27, a sum of current Ib_nw (from Ib_nw0 to Ib_nw7) flowing through the tenth to seventeenth unselected memory cells 930 to 937 at a time of 8-bit simultaneous reading.

In (a) in FIG. 27, the horizontal axis represents a voltage applied to each memory cell, the vertical axis represents a current flowing through each memory cell, and the following currents each are described as two characteristic lines: a current Isel (any of Isel0 to Isel7 in FIG. 26) flowing through a selected memory cell 30; a current Ib_nw (any of Ib_nw0 to Ib_nw7) flowing through the tenth to seventeenth unselected memory cells 930 to 937; and a current Inw_w flowing through the second unselected memory cell 194 and the third unselected memory cell 195. Each of the six characteristic lines shows a corresponding one of two states in one of which a variable resistance element is in the high resistance state (HR) and in the other of which the variable resistance element is in the low resistance state (LR) (shows a corresponding one of two states in one of which all variable resistance elements of unselected memory cells are in the high resistance state and in the other of which all the variable resistance elements are in the low resistance state). Specifically, the characteristic line of the current Isel when the selected memory cell 30 is in the low resistance (LR) state, that of the current Isel when the selected memory cell 30 is in the high resistance (HR) state, those of the current Ib_nw and the current Inw_w when all the unselected memory cells are in the low resistance (LR) state, and those of the current Ib_nw and the current Inw_w when all the unselected memory cells are in the high resistance (HR) state are plotted with white triangle, white circle, block triangle, and black circle, respectively. It is to be noted that a resistance value of the variable resistance element in the high resistance state is expressed as Rh, that of the variable resistance element in the low resistance state is expressed as Rl, and resistance is assumed to change by decade or more.

The characteristics line of the selected memory cell 30 is represented by Isel(HR) when the variable resistance element is in the high resistance state, and is represented by Isel(LR) when the variable resistance element is in the low resistance state. For instance, in the case where a sense voltage VSA is VSAa, a sense current flowing through the variable resistance element is Isel(HR) when the variable resistance element is in the high resistance state, and is Isel(LR) when the variable resistance element is in the low resistance state. The characteristics lines of the respective tenth to seventeenth unselected memory cells show a case where all the variable resistance elements of the tenth to seventeenth unselected memory cells are in the high resistance (HR) state and a case where all the variable resistance elements of the tenth to seventeenth unselected memory cells are in the low resistance (LR) state, for the current Ib_nw flowing through the tenth to seventeenth unselected memory cells when, assuming that an applied voltage of the selected bit line BL1 is VSAa, a voltage of the unselected WLs (point NW) is gradually increased from 0V to VSAa. Moreover, the characteristics lines for a combination of the second unselected memory cell 194 and the third unselected memory cell 195 show a case where all the variable resistance elements are in the high resistance (HR) state and a case where all the variable resistance elements are in the low resistance (LR) state, for the current Inw_w flowing through the second unselected memory cell 194 and the third unselected memory cell 195 when a voltage of the unselected WLs (point NW) is gradually increased from 0 to VSAa with reference to the voltage of 0V of the selected word line WL1. To put it differently, the characteristic lines of the unselected memory cells show a case where the voltage of the unselected word lines (point NW) is gradually increased with reference to the voltage of the selected bit line BL1 or the selected word line WL1.

In the current-voltage characteristic, since the unselected WLs and the unselected BLs are in the Hi-z state, the currents Ib_nw and Inw_w flowing through the unselected memory cells are expressed as Ib_nw=Inw_w. Thus, an operating point in the I-V characteristic shown in (a) in FIG. 27 is at a position of a cross point of the currents Ib_nw and Inw_w. An amount of the current at the operating point is Ihzh when the variable resistance elements of all the unselected memory cells are in the high resistance (HR) state, and is Ihzl (Ihzl>Ihzh) when the variable resistance elements of all the unselected memory cells are in the low resistance (LR) state.

In other words, the current Isel of the selected memory cell 30 is Isel(HR) when the variable resistance element is in the high resistance state, is Isel(LR) when the variable resistance element is in the low resistance state, and the difference between the cases is about three times in the example shown in (a) in FIG. 27. By comparison, the current flowing through the unselected memory cells varies depending on the resistance states of the variable resistance elements, ranging significantly such as from Ihzl to Ihzh (Ihzh>Isel(LR), about three or more times in the example shown in (a) in FIG. 27). Thus, the sense current Isen of the current detection circuits 960 to 967 is calculated as follows.

$$Isen = Isel + Ib\_nw \quad \text{(Equation 5)}$$

Accordingly, Isen1=Isel(HR)+Ihzl when the variable resistance element of the selected memory cell 30 is in the high resistance state and all the variable resistance elements of the unselected memory cells are in the low resistance state, whereas Isen2=Isel(LR)+Ihzh when the variable resistance element of the selected memory cell 30 is in the low resistance state and all the variable resistance elements of the unselected memory cells are in the high resistance state. It is clear from FIG. 27 that a current ratio between the current Isel of the selected memory cell 30 in the high resistance state and the current Isel of the same in the low resistance state is about three times, while a current ratio of the sense current Isen is about one time, that is, reduced by about one-third of the current ratio of the current Isel. It is to be noted that the current ratio of the sense current Isen is a minimum interval (the worst value) of a current ratio between a sense current Isel when a variable resistance element of a selected memory cell is in the high resistance state and a sense current Isel when the variable resistance element of the selected memory cell is in the low resistance state, and corresponds to a read margin in a cross point variable resistance nonvolatile memory device.

As above, when both the unselected WLs and the unselected BLs are in the Hi-z state, it is highly inefficient to perform reading after the current detection circuits 960 to 967 determine the resistance state of the selected memory cell 30.

In contrast, when the eight memory cells on the same selected word line are simultaneously read from, a sense voltage is applied to each of the selected bit lines through the current detection circuits 960 to 967. Currents flow through the unselected WLs to the tenth to seventeenth unselected memory cells, and a sum of the currents is eight times as much as the time of the 1-bit reading. Accordingly, since a current that is eight times as high as the current Ib_nw at the time of the 1-bit reading flows through point NW, an operating point 2 of point NW shown in (b) in FIG. 27 becomes an operating point at the time of the 8-bit simultaneous reading. A current concentrated at point NW here is Ihz8, and a voltage at point NW rises from Vnw1 to Vnw8.

Each of the currents Ib_nw0 to Ib_nw7 flowing through the tenth to seventeenth unselected memory cells connected to the respective bit lines at the time of the 8-bit simultaneous reading corresponds to a current when the voltage at point NW is Vnw8, and is thus Ib_nwi ((c) in FIG. 27). In other words, the current Ib_nw (Ihzl) at the time of the 1-bit reading is reduced to Ib_nwi by 8-bit reading.

Thus, according to Equation 5, the sense current Isen detected by the current detection circuits 960 to 967 is Isen=Isel(HR)+Ib_nwi when the variable resistance element of the selected memory cell 30 is in the high resistance state and all the variable resistance elements of the unselected memory cells are in the low resistance state, and is, by comparison, Isen=Isel(LR)+Ib_nwi when the variable resistance element of the selected memory cell 30 is in the low resistance state and all the variable resistance elements of the unselected memory cells are in the high resistance state. It is clear from the example shown in FIG. 27 that a current ratio between the current Isel of the selected memory cell 30 in the high resistance state and the current Isel of the same in the low resistance state is about three times, while a current ratio of the sense current Isen is about one and half times, that is, reduced by about half of the current ratio of the current Isel.

As above, the method of simultaneously reading from memory cells on the same word line successfully increases the read margin and achieves the stable reading.

[Description of Read Operation]

The following first describes component circuit blocks relating to reading and its functions with reference to the circuit block diagram of the cross point variable resistance nonvolatile memory device 2000 shown in FIG. 23.

In FIG. 23, at a time of reading, the control circuit 215 inputs a signal indicating a read mode to the memory functional block according to a control signal, and the word line decoder/driver 205 drives one word line corresponding to an address AX to a selection voltage of 0V, based on the address AX and an address AY outputted by the address input circuit 214 according to an address signal. Moreover, the bit line decoder 206 selects one bit line for each block according to the address AY, and electrically connects the selected one bit line to a node YD(i). The sense amplifier 212 that is an aggregate of an I number of sense amplifier circuits performs multi-bit simultaneous reading by applying a read voltage VSA to each of the selected bit lines through the respective nodes YD(i), detects an amount of a current flowing through the selected memory cells during the multi-bit simultaneous reading, determines whether stored data of each of the selected memory cells has "0" or "1," based on the amount of the current, and outputs the determination result as an output signal RD(i). The data output circuit 213 latches the output signal RD(i) from the sense amplifier 212 with predetermined timing, and outputs, as a data signal Dout(i), the latched output signal RD(i) to the outside of the cross point variable resistance nonvolatile memory device 2000.

Next, the read operation is described in detail with reference to a read sequence diagram shown in FIG. 28.

In FIG. 28, a clock inputted to the control circuit 215 as one of control signals is outputted to the memory functional block 201 as a clock signal CLK, and a rise cycle of the clock includes times tr0, tr4, tr7, tr10, . . . . Main operations of the memory functional block 201 are controlled with rise timing of the CLK. Upon receiving an address signal as an external input, the address input circuit 214 latches the address signal at a rise time (tr0, tr4, tr6, . . . ) of the clock signal CLK, and outputs the address signal as internal address signals AX and AY. For instance, AX=1 and AY=1 at the times tr0 to tr2, AX=2 and AY=1 at the times tr2 to tr4, and AX=3 and AY=1 at the times tr4 to tr6.

When CLK changes from "L" to "H" at the time tr0, the following occur: a selected word line and a selected bit line connected to a read target bit are determined based on addresses AX and AY latch outputted by the address input circuit 214; all word lines are pre-charged to a pre-charge voltage VPR; a selected bit line BL1m that is a read target is pre-charged to the pre-charge voltage VPR by the sense amplifier 212 through a corresponding node YD(i); and unselected bit lines are put into the high impedance (Hi-z) state.

When CLK changes from "H" to "L" at the time tr1, a selection voltage of 0V is applied to a selected word line WL1, and all the other word lines are put into the high impedance (Hi-z) state. A read voltage VSA is applied to each of the selected bit lines by the sense amplifier 212 through the corresponding node YD(i), and the other unselected bit lines are put into the high impedance (Hi-z) state. The sense amplifier 212, the aggregate of the i number of the sense amplifier circuits, performs the multi-bit simultaneous reading, detects an amount of current flowing through the selected memory cells, determines whether the stored data of each of the selected memory cells has "0" or "1," based on the amount of the current, and outputs the determination result as an output signal RD(i). The data output circuit 213 latches the output signal RD(i) of the sense amplifier 212 with predetermined timing (here, the next time tr2), and outputs data D1 as a data signal Dout(i).

When CLK changes from "L" to "H" at the time tr2, the following occur: a selected word line and a selected bit line connected to a read target bit are determined based on addresses AX and AY latch outputted by the address input circuit 214; all word lines are pre-charged to a pre-charge voltage VPR; a selected bit line BL1m that is a read target is pre-charged to the pre-charge voltage VPR by the sense amplifier 212 through a corresponding node YD(i); and unselected bit lines are put into the high impedance (Hi-z) state.

When CLK changes from "H" to "L" at the time tr3, a selection voltage of 0V is applied to a selected word line WL2, and all the other word lines are put into the high impedance (Hi-z) state. A read voltage VSA is applied to each of the selected bit lines by the sense amplifier 212 through the corresponding node YD(i), and the other unselected bit lines are put into the high impedance (Hi-z) state. The sense amplifier 212, the aggregate of the i number of the sense amplifier circuits, performs the multi-bit simultaneous reading, detects an amount of current flowing through the selected memory cells, determines whether the stored data of each of the selected memory cells has "0" or "1," based on the amount of the current, and outputs the determination result as an output signal RD(i). The data output circuit 213 latches the output signal RD(i) of the sense amplifier 212 with predetermined timing (here, the next time tr4), and outputs data D2 as a data signal Dout(i).

When CLK changes from "L" to "H" at the time tr4, the following occur: a selected word line and a selected bit line connected to a read target bit are determined based on addresses AX and AY latch outputted by the address input circuit 214; all word lines are pre-charged to a pre-charge voltage VPR; a selected bit line BL1m that is a read target is pre-charged to the pre-charge voltage VPR by the sense amplifier 212 through a corresponding node YD(i); and unselected bit lines are put into the high impedance (Hi-z) state.

When CLK changes from "H" to "L" at the time try, a selection voltage of 0V is applied to a selected word line WL3, and all the other word lines are put into the high impedance (Hi-z) state. A read voltage VSA is applied to each of the selected bit lines by the sense amplifier 212 through the corresponding node YD(i), and the other unselected bit lines are put into the high impedance (Hi-z) state. The sense amplifier 212, the aggregate of the i number of the sense amplifier circuits, performs the multi-bit simultaneous reading, detects an amount of current flowing through the selected memory cells, determines whether the stored data of each of the selected memory cells has "0" or "1," based on the amount of the current, and outputs the determination result as an output signal RD(i). The data output circuit 213 latches the output signal RD(i) of the sense amplifier 212 with predetermined timing (here, the next time tr6), and outputs data D3 as a data signal Dout(i).

It is to be noted that the compensation cell unit 252 used in the multi-bit simultaneous writing are not used in the multi-bit simultaneous reading, and thus compensation bit lines BLC(s) are always in the high impedance (Hi-z) state.

The following summarizes the above method of reading. Specifically, the method of reading for use in the cross point variable resistance nonvolatile memory device 2000 in the present invention includes: selecting bit lines as selected bit lines, and one word line as a selected word line, from a cross point memory cell array that includes memory cells each including: a variable resistance element that reversibly changes at least between the low resistance state and the high resistance state due to application of voltages having different polarities; and a bidirectional current steering element that is connected in series with the variable resistance element and has nonlinear current-voltage characteristics, the memory cells being placed at respective cross points of bit lines extending in a Y direction and word lines extending in an X direction; and performing simultaneous reading on memory cells placed at cross points of the selected bit lines and the one selected word line, by supplying a first voltage or a first current to each of the selected bit lines selected in the selecting, and a second voltage or a second current to the one selected word line.

When the cross point variable resistance nonvolatile memory device 2000 reads from, through a read operation, a predetermined number of memory cells among the first memory cells and the second memory cells, a word line read circuit supplies a fifth voltage to the selected word line, a first bit line read circuit supplies a sixth voltage or a sixth current to one of the bit lines of the first memory cells, and a second bit line read circuit supplies the sixth voltage or the sixth current to the A bit line or lines of the second memory cells.

Such a configuration example and operation makes it possible to achieve a multi-bit simultaneous reading memory system, and to provide the cross point variable resistance nonvolatile memory device that enables the stable reading in which the leakage current flowing through the unselected memory cells is reduced.

As described above, when performing the write operation, the cross point variable resistance nonvolatile memory device according to this embodiment (i) reduces the leakage current flowing through the unselected memory cells by using the simple operation method for performing the simultaneous writing on the selected memory cells connected to the one selected word line, (ii) achieves the writing in which the ratio of the selected memory cell current to the supply current for the selected bit lines is high, that is, the highly efficient writing, (iii) minimizes the disturbing influence on the unselected memory cells, by performing, using the optimum number of the bits, the multi-bit simultaneous writing on the memory cell array having the rectangular bit shape, and (iv) reduces the chip area by eliminating the unnecessary decode circuit and drive circuit.

In addition, when performing the read operation, the cross point variable resistance nonvolatile memory device according to this embodiment (i) reduces the leakage current flowing through the unselected memory cells by using the simple operation method for performing the simultaneous reading on the selected memory cells connected to the one selected word line, and (ii) enables more stable reading, in the same manner as when performing the write operation.

As above, it is possible to achieve the cross point variable resistance nonvolatile memory device whose costs are low and memory cell write and read characteristics are stable.

Embodiment 4

Other Configuration Examples of Specific Peripheral Circuit (Column Decoder Switching Control Method)

The inventors have examined and invented a configuration and a method that keep constant the number of bits written in a manner simpler than Embodiment 2 that requires the write bit count control circuit 209. The details are described below as Embodiment 4.

As described in Embodiment 2, in this embodiment also, in a cross point variable resistance nonvolatile memory device, data is accessed (inputted and outputted) using a format such as a byte (e.g., a group of eight bits) and a word (e.g., a group of 16 bits) each of which is a group of bits. For the sake of simplicity, the following describes a method of writing in the present invention, based on a write operation for a byte consisting of 8-bit data.

FIG. 29 is an example showing an overview of byte writing. (a) in FIG. 29 shows an example of given input data to be written. (b) in FIG. 29 shows a state where "0" data writing (e.g., low resistance (LR) writing) bits are extracted from the input data and listed. (c) in FIG. 29 shows a state where "1" data writing (e.g., high resistance (HR) writing) bits are extracted from the input data and listed. In other words, FIG. 29 shows a state where the input data shown in (a) in FIG. 29 is separated (time-divided) into the "0" writing bits shown in (b) in FIG. 29 and the "1" writing bits shown in (c) in FIG. 29 without changing data storage bits (D0 to D7).

The exemplary input data to be written shown in (a) in FIG. 29 is 8-bit data having "01000101" as D0 to D7. As shown in (a) in FIG. 29, since the input data to be written includes bits each having "0" or "1," in the cross point memory cell array including the variable resistance element that changes a direction of a write current, it is necessary to put a write voltage of the selected bit lines and the selected word line into different states for the low resistance writing and the high resistance writing. Thus, single input data needs to be divided into "0" data parts and "1" data parts, and writing needs to be performed by a time division method in which writing is performed with different timings. (b) in FIG. 29 shows, as W0 to W7, data cell write bits obtained by extracting only the "0" data parts from the input data shown in (a) in FIG. 29. In addition, (c) in FIG. 29 shows, as W0 to W7, data cell write bits obtained by extracting only the "1" data parts from the input data shown in (a) in FIG. 29.

The number of the "0" data parts or the "1" data parts of the data cell write bits W0 to W7 respectively shown in (b) or (c) in FIG. 29 differs from time to time depending on the content of the input data. For instance, in the case of "0" data parts, the number of the "0" data parts may be only one bit or eight bits in input data. When the number of the bits simultaneously written differs depending on the content of the input data, as can be seen from the dependency of the resistance value on the number of the bits simultaneously written described in FIG. 17B, the resistance value of the variable resistance element 10 to which writing is performed varies greatly.

Although the exemplary method for solving the problem is described in Embodiment 2, in order to constantly keep the number of all the bits simultaneously written at eight bits in Embodiment 2, it is required to provide a circuit such as the write bit count control circuit 209 that calculates the number of the bits written in the compensation cell unit based on the number of the input data parts having "0" or "1." Moreover, as is clear from FIG. 21, the compensation cell unit 252 causes imbalance such as performing a write operation on S0 bit most frequently and a write operation on S6 bit least frequently, and the memory cell write damage is uneven in the compensation cell unit 252. These are expected to be unfavorable in terms of the reliability of the memory cells.

To solve such a problem, the following have been invented: a new configuration in which compensation cell units each are provided adjacent to a corresponding one of data regions to which respective data D0 to D7 are written and that keeps constant the number of bits written by using a column decoder circuit selecting a write region; and a method for use in the configuration. This embodiment describes the details of those below.

FIG. 30A and FIG. 30B each show configurations of data cell regions and compensation cell regions in the present invention, and are a schematic diagram showing a corresponding one of an access method at a time of "0" writing and an access method at a time of "1" writing.

FIG. 30A is a diagram illustrating a method for accessing a memory cell array in terms of the "0" writing shown in (b) in FIG. 29, and shows states of "0" write bits in W0 to W7. (Here, the states of W0 to W7 are the same as those in (b) in FIG. 29.)

In FIG. 30A, each of divided memory cell arrays 1001a to 1001h which is indicated as a "'0' write target bit" shows an exemplary memory cell array that is divided into eight regions to each of which a corresponding one of the bits W0 to W7 is written. (Note that word lines of all the respective regions are connected to each other.) The bits W0, W1, W2, W3, W4, W5, W6, and W7 correspond to the divided memory cell arrays 1001a, 1001b, 1001c, 1001d, 1001e, 1001f, 1001g, and 1001h, respectively. Specification of a write bit of the divided memory cell arrays 1001a to 1001h (To which memory cell array "0" is written) is determined based on an address and a state of the write bit. Each of the divided memory cell arrays 1001a to 1001h includes: a corresponding one of data memory cell arrays 1002a to 1002h each including bit lines (having a configuration in which memory cells are placed at respective cross points of an n number of word lines and a q number of bit lines); and a corresponding one of compensation memory cell arrays 1003a to 1003h each including one bit line. (The n number of the word lines is shared by the data memory cell arrays 1002a to 1002h and the compensation memory cell arrays 1003a to 1003h.)

To put it another way, in this embodiment: the divided memory cell array 1001a includes the data memory cell array 1002a and the compensation memory cell array 1003a; the divided memory cell array 1001b includes the data memory cell array 1002b and the compensation memory cell array 1003b; the divided memory cell array 1001c includes the data memory cell array 1002c and the compensation memory cell array 1003c; the divided memory cell array 1001d includes the data memory cell array 1002d and the compensation memory cell array 1003d; the divided memory cell array 1001e includes the data memory cell array 1002e and the compensation memory cell array 1003e; the divided memory cell array 1001f includes the data memory cell array 1002f and the compensation memory cell array 1003f; the divided memory cell array 1001g includes the data memory cell array 1002g and the compensation memory cell array 1003g; and the divided memory cell array 1001h includes the data memory cell array 1002h and the compensation memory cell array 1003h.

Selection of the data memory cell arrays 1002a to 1002h and the compensation memory cell arrays 1003a to 1003h (i.e., for each of the divided memory cell arrays 1001a to 1001h, whether to write to a data memory cell array or a compensation memory cell array) is determined based on a 0 or 1 write mode and a state of a write bit. It is to be noted that the write mode includes writing "0" to a memory cell array (a "0" write mode) as shown in FIG. 30A or writing "1" to a memory cell array (a "1" write mode) as shown in FIG. 30B.

More specifically, in the "0" write mode, writing to a data memory cell array is performed for, among the write bits W0 to W7, bits whose states are set to "0," whereas writing to a compensation memory cell array is performed for, among the write bits W0 to W7, bits whose states are set to "1" (blank in FIG. 30A).

In the example shown in FIG. 29, specifically, the following occur: the data memory cell array 1002a is selected as a selected write region because the write bit W0 has "0," and writing is performed on a selected bit (e.g., the memory cell 1004a) determined by an address; the compensation memory cell array 1003b is selected as a selected write region because the write bit W1 has "1" (a blank), and writing is performed on a selected bit (e.g., the memory cell 1004b) determined by an address; the data memory cell array 1002c is selected as a selected write region because the write bit W2 has "0," and writing is performed on a selected bit (e.g., the memory cell 1004c) determined by an address; the data memory cell array 1002d is selected as a selected write region because the write bit W3 has "0," and writing is performed on a selected bit (e.g., the memory cell 1004d) determined by an address; the data memory cell array 1002e is selected as a selected write region because the write bit W4 has "0," and writing is performed on a selected bit (e.g., the memory cell 1004e) determined by an address; the compensation memory cell array 1003f is selected as a selected write region because the write bit W5 has "1" (a blank), and writing is performed on a selected bit (e.g., the memory cell 1004f) determined by an address; the data memory cell array 1002g is selected as a selected write region because the write bit W6 has "0," and writing is performed on a selected bit (e.g., the memory cell 1004g) determined by an address; and the compensation memory cell array 1003h is selected as a selected write region because the write bit W7 has "1" (a blank), and writing is performed on a selected bit (e.g., the memory cell 1004h) determined by an address.

FIG. 30B is a diagram illustrating a method for accessing a memory cell array in terms of the "1" writing shown in (c) in FIG. 29, and shows states of "1" write bits in W0 to W7. (Here, the states of W0 to W7 are the same as those in (c) in FIG. 29.)

Divided memory cell arrays 1001a to 1001h each of which is indicated as a "'1' write target bit" in FIG. 30B are the same as those in FIG. 30A showing the "'0' write target bits," except for selected write regions that are write targets according to the write bits W0 to W7, and thus a description of a configuration of the memory cell arrays is omitted.

As stated above, the selection of the data memory cell arrays 1002a to 1002h and the compensation memory cell arrays 1003a to 1003h (i.e., for each of the divided memory cell arrays 1001a to 1001h, whether to write to a data memory cell array or a compensation memory cell array) is determined based on the 0 or 1 write mode and a state of a write bit. In the "1" write mode, writing to a data memory cell array is performed for, among the write bits W0 to W7, bits whose states are set to "1," and writing to a compensation memory cell array is performed for, among the write bits W0 to W7, bits whose states are set to "0" (blank in FIG. 30B).

In the example shown in FIG. 29, specifically, the following occur: the compensation memory cell array 1003a is selected as a selected write region because the write bit W0 has "0" (a blank), and writing is performed on a selected bit (e.g., the memory cell 1004a) determined based on an address; the data memory cell array 1002b is selected as a selected write region because the write bit W1 has "1," and writing is performed on a selected bit (e.g., the memory cell 1004b) determined based on an address; the compensation memory cell array 1003c is selected as a selected write region because the write bit W2 has "0" (a blank), and writing is performed on a selected bit (e.g., the memory cell 1004c) determined based on an address; the compensation memory cell array 1003d is selected as a selected write region because the write bit W3 has "0" (a blank), and writing is performed on a selected bit (e.g., the memory cell 1004d) determined based on an address; the compensation memory cell array 1003e is selected as a selected write region because the write bit W4 has "0" (a blank), and writing is performed on a selected bit (e.g., the memory cell 1004e) determined based on an address; the data memory cell array 1002f is selected as a selected write region because the write bit W5 has "1," and writing is performed on a selected bit (e.g., the memory cell 1004f) determined based on an address; the compensation memory cell array 1003g is selected as a selected write region because the write bit W6 has "0" (a blank), and writing is performed on a selected bit (e.g., the memory cell 1004g) determined based on an address; and the data memory cell array 1002h is selected as a selected write region because the write bit W7 has "1," and writing is performed on a selected bit (e.g., the memory cell 1004h) determined based on an address.

As above, in the "0" write mode, the write operation is performed, for the "0" write bits, on predetermined bits of the data memory cell arrays, while the write operation is performed, for the "1" write bits, on predetermined bits of the compensation memory cell arrays. In addition, in the "1" write mode, the write operation is performed, for the "1" write bits, on predetermined bits of the data memory cell arrays, while the write operation is performed, for the "0" write bits, on predetermined bits of the compensation memory cell arrays.

In other words, in this embodiment, when writing of the write data of the bits is performed, simultaneous writing is always performed on the divided memory cell arrays. As a result, it is possible to keep, at eight bits (i.e., at a constant number), the number of the bits that are on the same word line and simultaneously written in any writing, which enables the stable writing. In addition, the data memory cell arrays and the compensation memory cell arrays are selected on a write bit basis, and thus it is possible to perform control relating to the selection by simply using a decoder.

Moreover, assuming that each of the divided memory cell arrays 1001a to 1001h (possibly the data memory cell arrays 1002a to 1002h when the compensation memory cell arrays 1003a to 1003h each including one bit line are excluded) has a substantially square bit shape (n=q), an applied voltage to unselected memory cells connected to a selected word line included in the divided memory cell arrays 1001a to 1001h and an applied voltage to unselected memory cells connected to a selected bit line are substantially leveled, and thus it is possible to minimize the disturbing influence at the time of writing.

For this reason, even when the whole memory cell array has the rectangular bit shape, such a memory cell array may be effectively divided into memory cell arrays each having the square bit shape or its similar shape, and the number of the bits simultaneously written, that is, the number of the divided memory cell arrays may be determined, according to the above-described multi-bit simultaneous writing in the divided memory cell array mode.

Conversely, the number of bit lines per divided memory cell array may be determined based on the number of word lines included in a memory cell array and the number of bits simultaneously written.

Moreover, even when a divided memory cell array fails to have the square bit shape due to addition of pseudo memory cells, redundant bits, ECC parity bits, or the like for different purposes, as long as an applied voltage to unselected memory cells connected to a selected word line and an applied voltage to unselected memory cells connected to selected bit lines (specifically, a voltage between two terminals of a variable resistance element included in each of the unselected memory cells) are less than or equal to a disturbing limit voltage in an effective memory cell array per 1 bit of a memory cell to which writing is performed, the divided memory cell array may have a rectangular bit shape (n≠q).

The following describes a configuration of a circuit (a 1D memory access circuit) that selects a data memory cell array having a write bit corresponding to a one bit (1D) region, and a compensation memory cell array (i.e., a circuit for one divided memory cell array) with reference to FIG. 31.

In FIG. 31, a data memory cell array 1005 includes memory cells 51 at respective cross points of an n number of word lines 1007 (WL0 to WL(n−1)) arranged in an X direction and a q number of bit lines 1008 arranged in a Y direction three-dimensionally crossing the X direction. The data memory cell array 1005 is an exemplary data memory cell array that includes memory cells each including: a variable resistance element that reversibly changes at least between the first resistance state and the second resistance state when voltages having different polarities are applied thereto; and a bidirectional current steering element that is connected in series with the variable resistance element and has nonlinear current-voltage characteristics, the memory cells being placed at respective cross points of N (N is an integer) word lines extending in the X direction and M (M is an integer) bit lines extending in the Y direction.

A compensation memory cell array 1006 includes dummy cells (here, memory cells 51) at respective cross points of the n number of the word lines 1007 (WL0 to WL(n−1)) arranged in the X direction and one bit line 1009 arranged in the Y direction. The compensation memory cell array 1006 is an exemplary compensation memory cell array that includes dummy cells each including at least a bidirectional current steering element having nonlinear current-voltage characteristics, the dummy cells being placed at respective cross points of N (N is an integer) word lines and at least one bit line extending in the Y direction.

A bit line pre-charge circuit 1010 pre-charges each of the bit lines 1008 and 1009 to a voltage VPR when signal PRE_Y="L." Each of CMOS switches 1011 includes an n-channel transistor and a p-channel transistor. A bit line decoder circuit 1012 that includes the CMOS switches selects a predetermined one bit in a corresponding one of the bit lines 1008 of the data memory cell array 1005 according to bit line selection signals PY0 to PY(q-1) and NPY0 to NPY(q-1) (here, q is an integer) generated from address signals inputted from the outside, and connects the selected bit line and a node YDM. The bit line decoder circuit 1012 is an example of the first bit line selection circuit that selects one of bit lines of data memory cell arrays included in each divided memory cell array. Moreover, a CMOS switch 1011 connected to the bit line 1009 is an example of the second bit line selection circuit that selects one of bit lines of compensation memory cell arrays included in each divided memory cell array.

Each of CMOS switches 1015 to 1018 includes an n-channel transistor 1013 and a p-channel transistor 1014. A data/compensation selection and W/R selection switch circuit 1019 includes the CMOS switches 1015 to 1018. The data/compensation selection and W/R selection switch circuit 1019 controls, at a time of writing, selection of whether to transmit a write voltage node W to the node YDM or a node YDD by performing ON/OFF control according to control signals MW/NMW and DW/NDW. By comparison, the data/compensation selection and W/R selection switch circuit 1019 controls, at a time of reading, selection of whether the node YDM or the node YDD is read and transmitted to a read node R by performing ON/OFF control according to control signals MR/NMR and DR/NDR. The data/compensation selection and W/R selection switch circuit 1019 is an exemplary data/compensation selection circuit that performs writing by selecting, for each of the divided memory cell arrays, the first bit line selection circuit or the second bit line selection circuit to operate, based on a data input signal and a write data flag to be described later. The data/compensation selection circuit performs, for each divided memory cell array, the writing in one of the following four cases.

(1) When a data input signal to one of the divided memory cell arrays instructs writing by changing to the first resistance state (e.g., "0"), and a write data flag instructs writing by changing to the first resistance state (e.g., the "0" data write mode), the data/compensation selection circuit performs writing to a data memory cell array of the divided memory cell array by selecting the first bit line selection circuit to operate.

(2) When a data input signal to one of the divided memory cell arrays instructs writing for changing to the second resistance state (e.g., "1"), and a write data flag instructs writing for changing to the second resistance state (e.g., the "1" data write mode), the data/compensation selection circuit performs writing to a data memory cell array of the divided memory cell array by selecting the first bit line selection circuit to operate.

(3) When a data input signal to one of the divided memory cell arrays instructs writing by changing to the first resistance state (e.g., "0"), and a write data flag instructs writing by changing to the second resistance state (e.g., the "1" data write mode), the data/compensation selection circuit performs writing to a compensation memory cell array of the divided memory cell array by selecting the second bit line selection circuit to operate.

(4) When a data input signal to one of the divided memory cell arrays instructs writing by changing to the second resistance state (e.g., "1"), and a write data flag instructs writing by changing to the first resistance state (e.g., the "0" data write mode), the data/compensation selection circuit performs writing to a compensation memory cell array of the divided memory cell array by selecting the first bit line selection circuit to operate.

A data/compensation selection control circuit 1020 controls the data/compensation selection and W/R selection switch circuit 1019 using a write data signal and various control signals as inputs. The data/compensation selection control circuit 1020 is an exemplary data/compensation selection control circuit that outputs, to the data/compensation selection and W/R selection switch circuit 1019, a data memory cell array selection signal that instructs selection of a data memory cell array.

A write register 1021 is a register that stores write data Wd(i) for a certain period of time, and corresponds to each of D0 to D7 shown in FIG. 29 or FIGS. 30A and 30B. The write register 1021 is an exemplary write register that outputs, to each of the corresponding divided memory cell arrays, a data input signal that instructs writing by changing to the first resistance state or the second resistance state, according to write data.

A sense amplifier 1022 reads a memory state of a selected memory cell.

The following describes operation of an 1D memory access circuit 1023 shown in FIG. 31.

First, upon receiving PRE_Y='H,' the bit line pre-charge circuit 1010 that is pre-charging the bit lines 1008 and 1009 to the voltage VPR terminates the pre-charge so as to select a predetermined memory cell to be accessed. Simultaneously, the bit line decoder circuit 1012 turns ON only one of the CMOS switches 1011 according to an address input, to keep the selected bit line and the node YDM connected. (At this time the CMOS switch 1011 corresponding to the compensation memory cell array 1006 is ON.)

(i) Case of Write Bit Having "0" and of "0" Write Mode

When writing is performed in the "0" write mode while write data "0" inputted as the write data Wd(i) is stored in the write register 1021, data LD(i) from the write register 1021 shows a signal WRITE changes to an 'H' state representing a write mode, a low resistance writing voltage VLR is applied as a VBL voltage, and a signal D_FLAG shows a signal representing the "0" write mode. When a write pulse signal PULSE is inputted in this situation, according to WRITE='H,' LD(i)='L,' and D_FLAG='L,' the data/compensation selection control circuit 1020 performs outputting so that MW='L' and NMW='H' are changed to MW='H' and NMW='L,' respectively, and DW='H,' NDW='H,' MR='L,' NMR='H,' and DR='L' are kept. As a result, among the four CMOS switches 1015 to 1018 of the data/compensation selection and W/R selection switch circuit 1019, only the CMOS switch 1015 corresponding to writing to the data memory cell array 1005 is turned ON. At this time, the low resistance writing voltage VLR at a node VBL is applied through the bit line decoder circuit 1012 to a predetermined selected bit line 1008 corresponding to the data memory cell array 1005. Simultaneously, according to an address and the PULSE signal, a voltage of a predetermined one selected word line 1007 is changed from a voltage VPR to a low resistance writing voltage of 0V, and the "0" data is written through the low resistance writing to a selected memory cell in the data memory cell array 1005.

(ii) Case of Write Bit Having "1" and of "0" Write Mode

When writing is performed in the "0" write mode while write data "1" inputted as the write data Wd(i) is stored in the write register 1021, data LD(i) from the write register 1021 shows 'H,' a signal WRITE changes to an 'H' state representing a write mode, a low resistance writing voltage VLR is applied as a VBL voltage, and a signal D_FLAG shows a signal representing the "0" write mode. When a write pulse signal PULSE is inputted in this situation, according to WRITE='H,' LD(i)='H,' and D_FLAG='L,' the data/compensation selection control circuit 1020 performs outputting so that DW='L' and NDW='H' are changed to DW='H' and NDW=respectively, and MW='L,' NMW='H,' MR='L,' NMR='H,' and DR='L' are kept. As a result, among the four CMOS switches 1015 to 1018 of the data/compensation selection and W/R selection switch circuit 1019, only the CMOS switch 1016 corresponding to writing to the compensation memory cell array 1006 is turned ON. At this time, the low resistance writing voltage VLR at a node VBL is applied through the CMOS switch 1011 in the same column as the bit line decoder circuit 1012 to the bit line 1009 corresponding to the compensation memory cell array 1006. Simultaneously, according to an address and the PULSE signal, a voltage of the predetermined one selected word line 1007 is changed from a voltage VPR to a low resistance writing voltage of 0V, and the low resistance writing is performed on a selected memory cell in the compensation memory cell array 1006.

(iii) Case of Write Bit Having "1" and of "1" Write Mode

When writing is performed in the "1" write mode while write data "1" inputted as the write data Wd(i) is stored in the write register 1021, data LD(i) from the write register 1021 shows 'H,' a signal WRITE changes to an 'H' state representing a write mode, a high resistance writing voltage of 0V is applied as a VBL voltage, and a signal D_FLAG shows a signal 'H' representing the "1" write mode. When a write pulse signal PULSE is inputted in this situation, according to WRITE='H,' LD(i)='H,' and D_FLAG='H,' the data/compensation selection control circuit 1020 performs outputting so that MW='L' and NMW='H' are changed to MW='H' and NMW='L,' respectively, and DW='L,' NDW='H,' MR='L,' NMR='H,' DR='L,' and NDR='H' are kept. As a result, among the four CMOS switches 1015 to 1018 of the data/compensation selection and W/R selection switch circuit 1019, only the CMOS switch 1015 corresponding to writing to the data memory cell array 1005 is turned ON. At this time, the high resistance writing voltage of 0V at a node VBL is applied through the bit line decoder circuit 1012 to the predetermined selected bit line 1008 corresponding to the data memory cell array 1005. Simultaneously, according to an address and the PULSE signal, a voltage of the predetermined one selected word line 1007 is changed from a voltage VPR to a high resistance writing voltage VHR, and the "1" data is written through the high resistance writing to a selected memory cell in the data memory cell array 1005.

(iv) Case of Write Bit Having "0" and of "1" Write Mode

When writing is performed in the "1" write mode while write data "0" inputted as the write data Wd(i) is stored in the write register 1021, data LD(i) from the write register 1021 shows 'L,' a signal WRITE changes to an 'H' state representing a write mode, a high resistance writing voltage of 0V is applied as a VBL voltage, and a signal D_FLAG shows a signal 'H' representing the "1" write mode. When a write pulse signal PULSE is inputted in this situation, according to WRITE='H,' LD(i)='L,' and D_FLAG='H,' the data/compensation selection control circuit 1020 performs outputting so that DW='L' and NDW='H' are changed to DW='H' and NDW='L,' respectively, and MW='L,' NMW='H,' MR='L,' NMR='H,' DR='L,' and NDR='H' are kept. As a result, among the four CMOS switches 1015 to 1018 of the data/compensation selection and W/R selection switch circuit 1019, only the CMOS switch 1016 corresponding to writing to the compensation memory cell array 1006 is turned ON. At this time, the high resistance writing voltage of 0V at a node VBL is applied through the CMOS switch 1011 in the same column as the bit line decoder circuit 1012 to the bit line 1009 corresponding to the compensation memory cell array 1006. Simultaneously, according to an address and the PULSE signal, a voltage of the predetermined one selected word line 1007 is changed from a voltage VPR to a high resistance writing voltage VHR, and the high resistance writing is performed on a selected memory cell in the compensation memory cell array 1006.

In contrast, at a time of reading, when receiving, as a signal WRITE, an 'L' state representing a read mode, the data/compensation selection control circuit 1020 performs outputting so that MR='L' and NMR='H' are changed to MR='H' and NMR='L,' respectively, and MW='L,' NMW='H,' DW='L,' NDW='H,' DR='L,' and NDR='H' are kept. As a result, among the four CMOS switches 1015 to 1018 of the data/compensation selection and W/R selection switch circuit 1019, only the CMOS switch 1017 corresponding to reading from the data memory cell array 1005 is turned ON. At this time, the predetermined selected bit line 1008 corresponding to the data memory cell array 1005 is connected to the sense amplifier 1022 through the bit line decoder circuit 1012. Furthermore, a voltage VPR of the predetermined one selected word line 1007 is changed to a read voltage of 0V, a read operation is performed on a selected memory cell in the data memory cell array 1005, and a memory state of the selected memory cell is outputted from the sense amplifier 1022 to a node Rd(i).

It is to be noted that because the variable resistance elements included in the memory cells in the data memory cell array 1005 and the compensation memory cell array 1006 have an initial resistance state after manufacturing that indicates ultra high resistance greater than or equal to 10 ΩM, it is necessary to perform, on both the data memory cell array 1005 and the compensation memory cell array 1006, a forming process for allowing all the memory cells to change resistance (initialization), at a testing stage. In such a case, required is an access operation to arbitrarily select a specific memory cell such as accessing the data memory cell array 1005 and accessing the compensation memory cell array 1006.

For the case, the data/compensation selection control circuit 1020 has a control terminal that receives a DCELL signal as a signal for externally controlling accessing only the data memory cell array 1005, and an HCELL signal as a signal for externally controlling accessing only the compensation memory cell array 1006.

Stated differently, when the DCELL signal is activated, only the data memory cell array 1005 is selected regardless of input data, and when the HCELL signal is activated, only the compensation memory cell array 1006 is selected regardless of input data.

Specifically, when the DCELL signal is activated, an output signal of the data/compensation selection control circuit 1020 is set so that, among the four CMOS switches 1015 to 1018 of the data/compensation selection and W/R selection switch circuit 1019, the CMOS switch 1015 is turned ON at the time of writing as a CMOS switch corresponding to the data memory cell array 1005, while the CMOS switch 1017 is turned ON at the time of reading as a CMOS switch corresponding to the data memory cell array 1005, regardless of an output of the write register 1021 and a state of a D_FLAG signal. To put it another way, while the data/compensation selection control circuit is outputting a data memory cell array selection signal, the data/compensation selection circuit forcibly selects a data memory cell array regardless of write data and a write data flag.

Moreover, when the HCELL signal is activated, an output signal of the data/compensation selection control circuit 1020 is set so that, among the four CMOS switches 1015 to 1018 of the data/compensation selection and W/R selection switch circuit 1019, the CMOS switch 1016 is turned ON at the time of writing as a CMOS switch corresponding to the compensation memory cell array 1006, while the CMOS switch 1018 is turned ON at the time of reading as a CMOS switch corresponding to the compensation memory cell array 1006, regardless of an output of the write register 1021 and a state of a D_FLAG signal. Stated differently, while the data/compensation selection control circuit is outputting a compensation memory cell array selection signal, the data/compensation selection circuit forcibly selects a compensation memory cell array regardless of write data and a write data flag.

It is to be noted that the activation of the DCELL signal or the HCELL signal can be used for various tests such as verifying a state of a resistance value of a memory cell other than for the forming of a memory cell.

Although the case is described above where the number of CMOS switches 1011 is one because the number of bit lines corresponding to the compensation memory cell array 1006 is one, when bit lines belong to the compensation memory cell array 1006, one of the bit lines is selected, and thus as many CMOS switches 1011 as the bit lines may be provided between each of the bit lines and a YDD node (a transistor included in each of the CMOS switches 1011 has a drain terminal and a source terminal connected to the bit lines and the YDD node) so that each CMOS switch selects a corresponding one of the bit lines, and may serve as a compensation memory cell array bit line decoder circuit having a selection function similar to that of the bit line decoder circuit 1012.

Moreover, a write function is performed by a part including the CMOS switches 1015 and 1016 and the data/compensation selection control circuit 1020, the CMOS switches 1015 and 1016, and the data/compensation selection control circuit 1020 are collectively referred to as a write circuit.

FIG. 32 is a diagram showing an exemplary circuit block configuration of a cross point variable resistance nonvolatile memory device 1036 that achieves, as a memory configuration, the simultaneous writing to bits on the same word line using the bit line selection switch mode shown in FIG. 31. The following describes the circuit configuration and its operation with reference to FIG. 32.

In FIG. 32, a memory cell array 1034 is an exemplary memory cell array including divided memory cell arrays. Here, the memory cell array 1034 is a memory cell array that includes a 1D data memory cell array 1005 and compensation memory cell array 1006 (i.e., one divided memory cell array) for 8D arranged in a word line direction, and has, for instance, a size of 64W×520BL (the data memory cell arrays having a size of 64BL×8D, the compensation memory cell arrays having a size of 1BL×8D, and the total size being 520BL). (In this embodiment, the number of bits simultaneously written is eight bits, and thus the memory cell array is divided into eight array regions.)

A word line decoder/driver 205 is an exemplary word line selection circuit that selects, for the divided memory cell arrays, one word line. Here, the word line decoder/driver 205 selectively drives word lines WL0 to WL(n−1) [e.g., n=64].

Bit line decoder and pre-charge circuits 1033 are circuits formed by arranging eight sets of a bit line decoder circuit 1012, a CMOS switch 1011, and a bit line pre-charge circuit 1010 in conformity with the memory cell array 1034 for 8D. The bit line decoder and pre-charge circuits 1033 correspond to a combination of (i) a first bit line selection circuit that selects one bit line of a data memory cell array included in each of the divided memory cell arrays and (ii) a second bit line selection circuit that selects one bit line of a compensation memory cell array included in each of the divided memory cell arrays.

Data/compensation selection and W/R selection switch circuits 1032 are circuits formed by arranging eight of the data/compensation selection and W/R selection switch circuit 1019 in conformity with the memory cell array 1034 for 8D. The data/compensation selection and W/R selection switch circuits 1032 are an exemplary data/compensation selection circuit that performs writing by selecting, for each of the divided memory cell arrays, the first bit line selection circuit or the second bit line selection circuit to operate, based on a data input signal and a write data flag.

Write registers and data/compensation selection circuits 1031 are circuits formed by arranging eight sets of the write register 1021 and the data/compensation selection control circuit 1020 in conformity with the memory cell array 1034 for 8D. Sense amplifier circuits 212 are circuits formed by arranging eight of the sense amplifier 1022 in conformity with the memory cell array 1034 for 8D. The 1D memory access circuit 1023 shown in FIG. 31 is an 1D memory access circuit configuration itself shown in FIG. 32, and eight of the 1D memory access circuit 1023 are arranged in the word line direction in the cross point variable resistance nonvolatile memory device 1036.

A memory functional block 1035 includes a word line decoder/driver 205 and memory access circuits formed by arranging eight of the 1D memory access circuit 1023. A data input circuit 207 is an 8-bit data input circuit that outputs, upon receiving input data of an input terminal Din(i) [i=0 to 7], data to the memory functional block 1035. A data output circuit 213 is an 8-bit data output circuit that stores, upon receiving read data outputted from the memory functional block 1035, the data for a certain period of time, and outputs the data to an output terminal Dout(i) [i=0 to 7]. An address input circuit 214 outputs the address signals as a word line selection address AX and a bit line selection address AY to the memory functional block 1035, using address signals from the outside as inputs. A control circuit 1024 is, for example, a CPU that outputs a control signal for controlling operation of the memory functional block 1035 (e.g., a clock signal CLK to be described later, a write pulse signal PULSE, a signal MODE representing states of various modes, and PRE_Y for controlling pre-charge of a bit line), using control signals from the outside as inputs.

Upon receiving a MODE signal, a write/read selection circuit 1026 outputs, to the registers and data/compensation selection circuits 1031 and a write data flag generating circuit 1027, a signal WRITE representing states of "0" data writing and "1" data writing. The write/read selection circuit 1026 is an exemplary write/read selection circuit that outputs, to the divided memory cell arrays, a write signal WRITE instructing a write mode or a read mode.

The write data flag generating circuit 1027 outputs, to the write registers and data/compensation selection circuits 1031, a control flag signal D_FLAG for controlling selection of "0" data writing or "1" data writing in the write mode, using a WRITE signal and a CLK signal as inputs. The write data flag generating circuit 1027 is an exemplary write data flag generating circuit that generates, for the divided memory cell arrays, a write data flag (D_FLAG) instructing which of writing by changing to the first resistance state and writing by changing to the second resistance state is to be simultaneously performed. The write data flag generating circuit 1027 is capable of generating the write data flag by dividing a basic clock for controlling writing which is inputted from the outside.

A switching circuit 1029 is a circuit that switches between the voltage VHR and 0V according to the D_FLAG signal, and outputs the switched voltage as a voltage VWL. Specifically, the switching circuit 1029 selects and provides, to the word line decoder/driver 205, VWL=0V when D_FLAG='L,' and VWL=VHR when D_FLAG='H.'

A switching circuit 1030 is a circuit that switches between the voltage VLR and 0V according to the D_FLAG signal, and outputs the switched voltage as a voltage VBL. Specifically, the switching circuit 1030 selects and provides, to the data/compensation and W/R selection switch circuits 1032, VBL=VLR when D_FLAG='L,' and VBL=0V when D_FLAG='H.'

An HR writing power source 217 is a power source that generates a high resistance writing voltage VHR (or a current) based on a power source VDD and further a power source VPP that is a high voltage, and its outputs are provided to the switching circuit 1029.

A LR writing power source 216 is a power source that generates a low resistance writing voltage VLR (or a current) based on the power source VDD and further the power source VPP that is the high voltage, and its outputs are provided to the switching circuit 1030.

A write voltage generation circuit 1025 includes the HR writing power source 217, the LR writing power source 216, the switching circuit 1029, and the switching circuit 1030. The write voltage generation circuit 1025 is an exemplary write voltage generation circuit that supplies, to the divided memory cell arrays through the word line selected by the word line selection circuit, a first voltage or a first current when writing by changing to the first resistance state is performed, and a second voltage or a second current when writing by changing to the second resistance state is performed. In addition, the write voltage generation circuit 1025 is an exemplary write voltage generation circuit that supplies a voltage or a current for writing to the divided memory cell arrays through the first bit line selection circuit and the second bit line selection circuit, that is, an exemplary write voltage generation circuit that supplies a third voltage or a third current to a selected bit line through the first bit line selection circuit and the second bit line selection circuit when a write data flag instructs the writing by changing to the first resistance state, and supplies a fourth voltage or a fourth current to a selected bit line through the first bit line selection circuit and the second bit line selection circuit when a write data flag instructs the writing by changing to the second resistance state.

Although the operation of the cross point variable resistance nonvolatile memory device 1036 that is configured as shown in FIG. 32 and achieves the multi-bit simultaneous writing in the present invention is described below with reference to sequence diagrams shown in FIG. 34 and subsequent figures, the following first describes generation patterns of a D_FLAG signal representing a "0" writing direction or a "1" writing direction with reference to sequence diagrams shown in FIG. 33A to FIG. 33C.

FIG. 33A shows, as an exemplary change of a D_FLAG signal at a time of writing, a sequence diagram when a D_FLAG signal changes in a double cycle with respect to a clock signal CLK.

The clock signal CLK is a cyclic clock signal having times tn to t(n+1) as one cycle, and is generated by the control circuit 1024. An address AX is, for instance, AX=i, that is, represents a state where a predetermined word line is selected. An address AY represents a state where an increment of one address is made from AY=j for every two clocks starting from a time t0 (an increment at times t2, t4, t6, t8, . . . , tn), that is, selection of an address next to a predetermined bit line is sequentially made for every two clocks. A WRITE signal representing a write state changes to an 'H' state representing writing at the time t0. After WRITE='H,' a D_FLAG signal representing a write mode is generated, and D_FLAG='L' or 'H' is set per cycle of the clock CLK. Upon receiving a state of the D_FLAG signal, the write voltage generation circuit 1025 sets, for supply, voltages of a word line power source node VWL and a bit line power source node VBL to (i) voltages VWL=GND(=0V) and VBL=VLR necessary for the low resistance writing, respectively, at a time of D_FLAG='L,' and (ii) voltages VWL=VHR and VBL=GND necessary for the high resistance writing, respectively, at a time of D_FLAG='H.' Moreover, a write pulse signal PULSE is generated for every cycle of CLK in synchronization with the clock CLK. While PULSE='H,' the VWL and VBL voltages are applied to a selected memory cell, and a predetermined write operation is performed on the selected memory cell.

FIG. 33B shows, as an exemplary change of a D_FLAG signal at a time of writing, a sequence diagram when a D_FLAG signal changes in a quadruple cycle with respect to a clock signal CLK.

The clock signal CLK is a cyclic clock signal having times tn to t(n+1) as one cycle, and is generated by the control circuit 1024. An address AX is, for instance, AX=i, that is, represents a state where a predetermined word line is selected. An address AY represents a state where an increment of one address is made from AY=j for every four clocks starting from a time t0 (an increment at times t4, t8, . . . , tn), that is, selection of an address next to a predetermined bit line is sequentially made for every four clocks. A WRITE signal representing a write state changes to an 'H' state representing writing at the time t0. After WRITE='H,' a D_FLAG signal representing a write mode is generated, and D_FLAG='L' or 'H' is set per two cycles of the clock CLK in this example. Upon receiving a state of the D_FLAG signal, the write voltage generation circuit 1025 sets, for supply, voltages of a word line power source node VWL and a bit line power source node VBL to (i) voltages VWL=GND (=0V) and VBL=VLR necessary for the low resistance writing, respectively, at a time of D_FLAG='L,' and (ii) voltages VWL=VHR and VBL=GND necessary for the high resistance writing, respectively, at a time of D_FLAG='H.' Moreover, a write pulse signal PULSE is generated for every cycle of CLK in synchronization with the clock CLK. While PULSE='H,' the VWL and VBL voltages are applied to a selected memory cell, and a predetermined write operation is performed twice on the selected memory cell.

Furthermore, the D_FLAG signal is capable of corresponding to a cycle much greater than the quadruple cycle with respect to the clock signal CLK, and an address can be changed regardless of the change of the D_FLAG signal.

FIG. 33C shows, as an exemplary change of a D_FLAG signal at a time of writing, a sequence diagram in the case of a cycleless arbitrary setting mode that is a mode in which a D_FLAG signal changes regardless of a cycle of a clock signal CLK.

The clock signal CLK is a cyclic clock signal having times tn to t(n+1) as one cycle, and is generated by the control circuit 1024. An address AX is, for instance, AX=i, that is, represents a state where a predetermined word line is selected. An address AY represents a state where an increment of one address is made from AY=j for every clock starting from, for example, a time t0 (an increment at times t1, t2, t3, t4, . . . , tn), that is, selection of an address next to a predetermined bit line is sequentially made for every clock. A WRITE signal representing a write state changes to an 'H' state representing writing at the time t0. After WRITE='H,' a D_FLAG signal representing a write mode is generated, and D_FLAG='L' or 'H' is set regardless of the cycle of the clock CLK in this example. Upon receiving a state of the D_FLAG signal, the write voltage generation circuit 1025 sets, for supply, voltages of a word line power source node VWL and a bit line power source node VBL to (i) voltages VWL=GND (=0V) and VBL=VLR necessary for the low resistance writing, respectively, at a time of D_FLAG='L,' and (ii) voltages VWL=VHR and VBL=GND necessary for the high resistance writing, respectively, at a time of D_FLAG='H.' Furthermore, a write pulse signal PULSE is generated in synchronization with the clock CLK for every cycle of CLK, the VWL and VBL voltages are applied to a selected memory cell while PULSE='H,' and a predetermined write operation is performed on the selected memory cell.

Moreover, an address can be arbitrarily changed regardless of the change of the D_FLAG signal.

Furthermore, when a D_FLAG reset signal RSTKT is inputted to the write data flag generating circuit 1027 while the change of the D_FLAG signal is set to a k-times cycle with respect to the clock signal CLK, a cycle change of the D_FLAG signal can be reset from that point, and thus periods in one of which the D_FLAG signal is in the state and in the other of which the D_FLAG signal is in the 'H' state can be arbitrarily set.

In other words, the D_FLAG signal can be generated by dividing the clock signal CLK, set to a predetermined f-times cycle (f is an integer), and fixed to 'L' or 'H' regardless of CLK.

Moreover, when the WRITE signal changes to 'L' at the end of the write mode, the D_FLAG signal is reset to 'L' in response to the change, and the operation (writing) is terminated.

As above, the write data flag generating circuit 1027 is capable of generating the write data flag by dividing a basic clock for controlling writing which is inputted from the outside. The write data flag generating circuit 1027 starts generating the write data flag when the write signal instructs the write mode, and discontinues generating the write data flag when the instruction of the write signal changes from the write mode to a read mode.

It is to be noted that the change of the address and the change of the D_FLAG signal are not limited to the above method, and it goes without saying that various change methods are applied.

The following describes in detail the operation of the cross point variable resistance nonvolatile memory device that is shown in FIG. 32 and achieves the multi-bit simultaneous writing in the present invention, with reference to sequence diagrams shown in FIG. 34 and subsequent figures.

FIG. 34 shows a write sequence when a D_FLAG signal has a double cycle representing a "0" writing direction or "1" writing direction.

In FIG. 34, the control circuit 1024 generates a clock signal CLK in the same cycle using times t0, t3, t6, t9, t12, . . . as clock rising timings. Upon receiving an external address signal, the address input circuit 214 outputs an address AX=0, and outputs, as an address AY, AY=0 between the times t0 and t6 and AY=1 between the times t6 and t12. A WRITE signal representing a write mode changes from 'L' to 'H' at the time t0, and the write/read selection circuit 1026 outputs the WRITE signal as a write mode signal. A D_FLAG signal representing a '0/1' writing direction starts changing in reaction to WRITE='H,' and the write data flag generating circuit 1027 outputs the D_FLAG signal as 'L' (LR writing) at the time t0, 'H' (HR writing) at the time t3, 'L' (LR writing) at the time t6, 'H' (HR writing) at the time t9, 'L' (LR writing) at the time t12, . . . . As external data input Din(i) [i=0 to 7], input data "01000101" is inputted prior to the time t0, input data "11110000" is inputted prior to the time t6, input data "00001111" is inputted prior to the time t12. Such Din(i) input data is latched by the write register 1021 through the data input circuit 207 at the times t0, t6, t12, . . . , and is outputted as data "01000101" from the time t0, data "11110000" from the time t6, and data "00001111" from the time t12. The control circuit 1024 outputs, as a PULSE signal, an 'H' pulse for performing actual writing during a write mode period, between the times t1 and t2, t4 and t5, t7 and t8, t10 and t11, . . . .

Upon receiving D_FLAG='L' between the times t1 and t2, LD(i)="01000101," and PULSE='H,' the data/compensation selection control circuit 1020 corresponding to each D region (i) changes MW of D(0, 2, 3, 4, 6) to 'H' and NMW to 'L' and outputs MW and NMW to turn ON only the CMOS switch 1015 in the data/compensation selection and W/R selection switch circuit 1019, and (ii) changes DW of D(1, 5, 7) to 'H' and NDW to and outputs DW and NDW to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(0, 2, 3, 4, 6), in reaction to the on-state of the CMOS switch 1015, a low resistance writing voltage VLR of a VBL node is applied to YDM through the CMOS switch 1015, and further a voltage of a bit line selected based on the address AY changes from VPR to VLR, and at the same time a voltage of a word line selected based on the address AX changes from VPR to GND. With regard to D(1, 5, 7), in reaction to the on-state of the CMOS switch 1016, a low resistance writing voltage VLR of a VBL node is applied to YDD through the CMOS switch 1016, a voltage of a bit line of the compensation memory cell array 1006 changes from VPR to VLR, and at the same time a voltage of a selected word line changes from VPR to GND. Consequently, predetermined low resistance writing is performed on selected memory cells of D0, D2, D3, D4, and D6 of the data memory cell arrays 1005 and selected memory cells of D1, D5, and D7 of the compensation memory cell arrays 1006.

Upon receiving D_FLAG='H' between the times t4 and t5, LD(i)="01000101," and PULSE='H,' the data/compensation selection control circuit 1020 corresponding to each D region (i) changes MW of D(1, 5, 7) to 'H' and NMW to 'L' and outputs MW and NMW to turn ON only the CMOS switch 1015 in the data/compensation selection and W/R selection switch circuit 1019, and (ii) changes DW of D(0, 2, 3, 4, 6) to 'H' and NDW to 'L' and outputs DW and NDW to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(1, 5, 7), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(0, 2, 3, 4, 6), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined high resistance writing is performed on selected memory cells of D1, D5, and D7 of the data memory cell arrays 1005 and selected memory cells of D0, D2, D3, D4, and D6 of the compensation memory cell arrays 1006.

Upon receiving D_FLAG='L' between the times t7 and t8, LD(i)="11110000," and PULSE='H,' the data/compensation selection control circuit 1020 corresponding to each D region (i) changes MW of D(4 to 7) to 'H' and NMW to 'L' and outputs MW and NMW to turn ON only the CMOS switch 1015 in the data/compensation selection and W/R selection switch circuit 1019, and (ii) changes DW of D(0 to 3) to 'H' and NDW to 'L' and outputs DW and NDW to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(4 to 7), in reaction to the on-state of the CMOS switch 1015, a low resistance writing voltage VLR of a VBL node is applied to YDM through the CMOS switch 1015, and further a voltage of a bit line selected based on the address AY changes from VPR to VLR, and at the same time a voltage of a word line selected based on the address AX changes from VPR to GND. With regard to D(0 to 3), in reaction to the on-state of the CMOS switch 1016, a low resistance writing voltage VLR of a VBL node is applied to YDD through the CMOS switch 1016, a voltage of a bit line of the compensation memory cell array 1006 changes from VPR to VLR, and at the same time a voltage of a selected word line changes from VPR to GND. Consequently, predetermined low resistance writing is performed on selected memory cells of D4 to D7 of the data memory cell arrays 1005 and selected memory cells of D0 to D3 of the compensation memory cell arrays 1006.

Upon receiving D_FLAG='H' between the times t10 and t11, LD(i)="11110000," and PULSE='H,' the data/compensation selection control circuit 1020 corresponding to each D region (i) changes MW of D(0 to 3) to 'H' and NMW to 'L' and outputs MW and NMW to turn ON only the CMOS switch 1015 in the data/compensation selection and W/R selection switch circuit 1019, and (ii) changes DW of D(4 to 7) to 'H' and NDW to 'L' to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(0 to 3), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(4 to 7), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined low resistance writing is performed on selected memory cells of D0 to D3 of the data memory cell arrays 1005 and selected memory cells of D4 to D7 of the compensation memory cell arrays 1006.

As above, the cross point variable resistance nonvolatile memory device 1036 in the present invention that causes the data/compensation selection and W/R selection switch circuit 1019 of the column system to select the data memory cell array 1005 and the compensation memory cell array 1006 provided for each D region while the data/compensation selection and W/R selection switch circuit 1019 alternately performs, for the memory cell selected based on the predetermined address, the "0" writing and the "1" writing for each address according to the D_FLAG signal having the single cycle easily achieves the simultaneous writing of given eight bits. In other words, in this embodiment, when writing of the write data of the bits is performed, the simultaneous writing is always performed on the divided memory cell arrays.

As described above, the cross point variable resistance nonvolatile memory device according to this embodiment includes (1) a plurality of divided memory cell arrays each including: a data memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics; and a compensation memory cell array including dummy cells each at least including the bidirectional current steering element having the nonlinear current-voltage characteristics, the memory cells being placed at respective cross points of M (M is an integer) bit lines extending in a Y direction and N (N is an integer) word lines extending in an X direction three-dimensionally crossing the Y direction, and the dummy cells being placed at respective cross points of the N (N is an integer) word lines and at least one bit line extending in the Y direction, (2) a first bit line selection circuit that selects one of the M bit lines of the data memory cell array included in each of the divided memory cell arrays, (3) a second bit line selection circuit that selects one of the at least one bit line of the compensation memory cell array included in each of the divided memory cell arrays, and (4) a write circuit that performs writing on the data memory cell array included in each of the divided memory cell arrays, by changing the data memory cell array to the first resistance state or the second resistance, according to write data of a plurality of bits inputted from the outside.

A method of writing is executed by the cross point variable resistance nonvolatile memory device, the method including (1) performing, by the write circuit for each of the divided memory cells, writing on the data memory cell array of the divided memory cell array by selecting the first bit line selection circuit to operate, when the data input signal for the divided memory cell array instructs the writing by changing to the second resistance state and the write data flag instructs the writing by changing to the first resistance state, (2) performing, by the write circuit for each divided memory cell, writing on the data memory cell array of the divided memory cell array by selecting the first bit line selection circuit to operate, when the data input signal for the divided memory cell array instructs the writing by changing to the second resistance state and the write data flag instructs the writing by changing to the second resistance state, (3) performing, by the write circuit for each divided memory cell, writing on the compensation memory cell array of the divided memory cell array by selecting the second bit line selection circuit to operate, when the data input signal for the divided memory cell array instructs the writing by changing to the first resistance state and the write data flag instructs the writing by changing to the second resistance state, and (4) performing, by the write circuit for each divided memory cell, writing on the compensation memory cell array of the divided memory cell array by selecting the second bit line selection circuit to operate, when the data input signal for the divided memory cell array instructs the writing by changing to the second resistance state and the write data flag instructs the writing by changing to the first resistance state.

It is to be noted that the "0-1" alternate writing method in which the "1" writing is performed subsequent to the "0" writing on a selected memory cell specified by one address is described as an example in the write sequence.

The following describes, as another example of the write sequence, a method for performing HR (high resistance) writing according to input data after all memory cells of the data memory cell arrays 1005 are temporarily changed to LR (low resistance), with reference to FIG. 35 and FIG. 36. It is to be noted that a configuration of a cross point variable resistance nonvolatile memory device is the same as FIG. 32.

FIG. 35 shows a write sequence in which all memory cells of the data memory cell arrays 1005 are set to a LR (low resistance) state.

FIG. 35 differs from FIG. 34 in that an increment cycle of the address AY is the same as that of the clock CLK because all the memory cells are changed to low resistance (LR), that the input data Din(i) is always "00000000," that the D_FLAG signal is fixed to 'L' at least after t0, that the only the CMOS switch 1015 in the data/compensation selection and W/R selection switch circuit 1019 is selected by changing MW of D(0 to 7) to 'H' and NMW to 'L' and outputting MW and NMW so that writing is performed on all D(0 to 7) of the data memory cell arrays 1005 due to the fixation.

In other words, the control circuit 1024 generates the clock signal CLK in the same cycle using times t0, t3, t6, t9, t12, . . . as clock rising timings. Upon receiving an external address signal, the address input circuit 214 outputs an address AX=0, and incrementally outputs an address in concert with a cycle of the clock CLK, that is, outputs, as an address AY AY=0 between the times t0 and t3, AY=1 between the times t3 and t6, AY=2 between the times t6 and t9, and AY=3 between the times t9 and t12. The write/read selection circuit 1026 changes a WRITE signal representing a write mode from 'L' to 'H' and outputs the WRITE signal at the time t0. In reaction to WRITE='H,' a D_FLAG signal representing a '0/1' writing direction starts changing. The write data flag generating circuit 1027 outputs the D_FLAG signal as 'L' (LR writing) at least after the time t0. Input data "00000000" is inputted as external data input Din(i) [i=0 to 7] before the time t0. The write register 1021 latches such Din(i) input data through the data input circuit 207 at least at the time t0, and outputs the Din(i) input data as data "00000000" from the time t0. The control circuit 1024 outputs, as a PULSE signal, an 'H' pulse for performing actual writing during a write mode period, between the times t1 and t2, t4 and t5, t7 and t8, t10 and t11, . . . .

Upon receiving D_FLAG='L' after the time t0, LD(i)="00000000," and PULSE='H,' the data/compensation selection control circuit 1020 corresponding to each D region changes MW of all D(0 to 7) to 'H' and NMW to 'L,' and outputs MW and NMW to turn ON only the CMOS switch 1015 in the data/compensation selection and W/R selection switch circuit 1019. In addition, a pre-charge signal PRE_Y changes to 'H' at a time of PULSE='H,' and VPR pre-charging of all the bit lines is terminated. With regard to all D(0 to 7), in reaction to the on-state of the CMOS switch 1015, a low resistance writing voltage VLR of a VBL node is applied to YDM through the CMOS switch 1015, and further a voltage of a bit line selected based on the address AY changes from VPR to VLR, and at the same time a voltage of a word line selected based on the address AX changes from VPR to GND. Consequently, predetermined low resistance writing is performed on selected memory cells of all D0 to D7 of the data memory cell arrays 1005.

FIG. 36 shows a write sequence in which predetermined memory cells of the data memory cell arrays 1005 are set to the HR (high resistance) state according to input data.

FIG. 36 differs from FIG. 34 only in that predetermined memory cells are changed to the high resistance (HR) state according to input data, which means that a D_FLAG signal is fixed to "H" at least after t0 and that an increment cycle of an address AY and an input cycle of input data Din(i) are the same as those of a clock CLK.

In FIG. 36, the control circuit 1024 generates a clock signal CLK in the same cycle using times t0, t3, t6, t9, t12, . . . as clock rising timings. Upon receiving an external address signal, the address input circuit 214 outputs an address AX=0, and outputs, as an address AY, AY=0 between the times t0 and t3, AY=1 between the times t3 and t6, AY=2 between the times t6 and t9, and AY=3 between the times t9 and t12. A WRITE signal representing a write mode changes from 'L' to 'H' at the time t0, and the write/read selection circuit 1026 outputs the WRITE signal as a write signal. In reaction to WRITE='H,' a D_FLAG signal representing a '0/1' writing direction starts changing, and the write data flag generating circuit 1027 outputs the D_FLAG signal as 'H' (HR writing) after the time t0. Input data "01000101," "11110000," "00001111," "00110011," and "11001100" are inputted as external data input Din(i) [i=0 to 7] before the time t0, the time t3, the time t6, the time t9, and the time t12, respectively. The write register 1021 latches such Din(i) input data through the data input circuit 207 at the times t0, t3, t6, t9, t12, . . . , and outputs the Din(i) input data as data "01000101" from the time t0, data "11110000" from the time t3, data "00001111" from the time t6, data "00110011" from the time t9, and data "11001100" from the time t12. The control circuit 1024 outputs, as a PULSE signal, an 'H' pulse for performing actual writing during a write mode period, between the times t1 and t2, t4 and t5, t7 and t8, t10 and t11, . . . .

Upon receiving D_FLAG='H' between the times t1 and t2, LD(i)="01000101," and PULSE='H,' the data/compensation selection control circuit 1020 corresponding to each D region (i) changes MW of D(1, 5, 7) to 'H' and NMW to 'L' and outputs MW and NMW to turn ON only the CMOS switch 1015 in the data/compensation selection and W/R selection switch circuit 1019, and (ii) changes DW of D(0, 2, 3, 4, 6) to 'H' and NDW to 'L' and outputs DW and NDW to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(1, 5, 7), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(0, 2, 3, 4, 6), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined high resistance writing is performed on selected memory cells of D1, D5, and D7 of the data memory cell arrays 1005 and selected memory cells of D0, D2, D3, D4, and D6 of the compensation memory cell arrays 1006.

Upon receiving D_FLAG='H' between the times t4 and t5, LD(i)="11110000," and PULSE='H,' the data/compensation selection control circuit 1020 corresponding to each D region (i) changes MW of D(0 to 3) to 'H' and NMW to 'L' and outputs MW and NMW to turn ON only the CMOS switch 1015 in the data/compensation selection and W/R selection switch circuit 1019, and (ii) changes DW of D(4 to 7) to 'H' and NDW to 'L' to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(0 to 3), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(4 to 7), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined high resistance writing is performed on selected memory cells of D0 to D3 of the data memory cell arrays 1005 and selected memory cells of D4 to D7 of the compensation memory cell arrays 1006.

Upon receiving D_FLAG='H' between the times t7 and t8, LD(i)="00001111," and PULSE='H,' the data/compensation selection control circuit 1020 corresponding to each D region (i) changes MW of D(4 to 7) to 'H' and NMW to 'L' and outputs MW and NMW to turn ON only the CMOS switch 1015 in the data/compensation selection and W/R selection switch circuit 1019, and (ii) changes DW of D(0 to 3) to 'H' and NDW to 'L' to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(4 to 7), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(0 to 3), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined high resistance writing is performed on selected memory cells of D4 to D7 of the data memory cell arrays 1005 and selected memory cells of D0 to D3 of the compensation memory cell arrays 1006.

Upon receiving D_FLAG='H' between the times t10 and t11, LD(i)="00110011," and PULSE='H,' the data/compensation selection control circuit 1020 corresponding to each D region (i) changes MW of D(2, 3, 6, 7) to 'H' and NMW to 'L' and outputs MW and NMW to turn ON only the CMOS switch 1015 in the data/compensation selection and W/R selection switch circuit 1019, and (ii) changes DW of D(0, 1, 4, 5) to 'H' and NDW to 'L' to turn ON only the CMOS switch 1016 in the data/compensation selection and W/R selection switch circuit 1019. In addition, a pre-charge signal PRE_Y changes to 'H' at a time of PULSE='H,' and VPR pre-charging of all the bit lines is terminated. With regard to D(2, 3, 6, 7), in reaction to the on-state of the CMOS switch 1015, a high resistance writing voltage GND of a VBL node is applied to YDM through the CMOS switch 1015, and further a voltage of a bit line selected based on the address AY changes from VPR to GND, and at the same time a voltage of a word line selected based on the address AX changes from VPR to VHR. With regard to D(0, 1, 4, 5), in reaction to the on-state of the CMOS switch 1016, a high resistance writing voltage GND of a VBL node is applied to YDD through the CMOS switch 1016, a voltage of a bit line of the compensation memory cell array 1006 changes from VPR to GND, and at the same time a voltage of a selected word line changes from VPR to VHR. Consequently, predetermined high resistance writing is performed on selected memory cells of D2, D3, D6, and D7 of the data memory cell arrays 1005 and selected memory cells of D0, D1, D4, and D5 of the compensation memory cell arrays 1006.

To summarize the above procedure, the following two-stage write operation makes it possible to perform the writing on all the memory cells of the data memory cell array.

(1) First Stage

To change all memory cells of a data memory cell array to the first resistance state, the write register sets and outputs, as a data input signal, a signal instructing writing by changing to the first resistance state, the write data flag generating circuit sets and outputs, as a write data flag, the signal instructing the writing by changing to the first resistance state. The data/compensation selection circuit selects a data memory cell array based on the data input signal and the write data flag, and sequentially writes to all memory cells of the data memory cell array by changing all the memory cells to the first resistance state.

(2) Second Stage

Next, to write to a predetermined memory cell (a memory cell desired to change to the second resistance state) of a data memory cell array by changing the predetermined memory cell to the second resistance state, the write register sets a data input signal corresponding to the predetermined memory cell to a signal instructing writing by changing to the second resistance state, and outputs the data input signal, and the write data flag generating circuit sets and outputs, as a write data flag, a signal instructing the writing by changing to the second resistance state. The data/compensation selection circuit selects a data memory cell array corresponding to the predetermined memory cell based on the data input signal and the write data flag, and sequentially writes to only the predetermined memory cell of the data memory cell array by changing the predetermined memory cell to the second resistance state.

As above, by controlling the input address, the input data, and the D_FLAG signal, it is possible to perform various writing methods such as the "0-1" alternate writing method for given data and a method for writing "1" according to given input data after temporarily writing "0" to all memory regions.

Moreover, the data/compensation selection control circuit 1020 corresponding to each D region may have a write mask function to avoid writing to the data memory cell arrays 1005.

To explain using a specific example, a mask signal MASK (i) [not shown, and i being equal to the number of input data and an integer from 0 to 7 each associated with a corresponding one of D regions] prohibiting writing to the data memory cell arrays 1005 is separately inputted to the data/compensation selection control circuit 1020. The data/compensation selection control circuit 1020 performs the same write operation as described above, that is, the predetermined writing on the selected memory cells of the data memory cell arrays 1005 or the compensation memory cell arrays 1006 according to the output data LD(i) and the D_FLAG signal of the write register 1021, when MASK(i)='L,' and does not perform the writing to the data memory cell arrays 1005, when MASK(i)= 'H.' Consequently, the predetermined write operation is performed on the selected memory cells of the compensation memory cell arrays 1006 regardless of the states of LD(i) and the D_FLAG signal.

Thus, it is possible to control, for data to be written, the writing to the data memory cell arrays 1005 on a bit basis, thereby achieving a function such as verify writing for each bit and read-ahead and write control that are generally performed.

It is to be noted that using this function enables performing the writing exclusively on predetermined data memory cell arrays 1005.

With the above-described configuration of the cross point variable resistance nonvolatile memory device, in regard to write control for writing each data to a data region or a compensation region, placing the data regions to which data are written adjacent to the respective compensation cell units eliminates a need for an operational circuit such as the write bit count control circuit 209 that performs control by calculating the number of bits written to the compensation cell units from the number of data having "0" or "1," thereby achieving the method of simultaneous writing to bits on the same word line using a simple configuration of controlling a column decoder circuit selecting a write region.

The method of simultaneous writing to bits on the same word line and the configuration of the cross point variable resistance nonvolatile memory device have thus far been described based on an assumption that the memory cells of the compensation memory cell array 1006 are memory cells each including the variable resistance element. However, since it is intended to perform a write operation for writing all input data to be written to the data memory cell array 1005 and keeping constant the number of bits simultaneously written for the compensation memory cell array 1006, the resistance change of the variable resistance elements of the compensation memory cell array 1006 is of no great significance.

In contrast, as described above, because the variable resistance elements included the memory cells in the data memory cell array 1005 and the compensation memory cell array 1006 have an initial resistance state after manufacturing that indicates ultra high resistance greater than or equal to 10 ΩM, it is necessary to perform, on both the data memory cell array and the compensation memory cell array, a forming process for allowing all the memory cells to change resistance (initialization), at a testing stage. When the forming process is performed only on the data memory cell array 1005, the memory cells in the compensation memory cell array 106 maintain the ultra high resistance state. This means that the compensation memory cell array 1006 is substantially absent. As a result, it is impossible to perform accurate multi-bit writing, and set resistance values of the memory cells significantly vary depending on the number of bits written for the data memory cell array 1005. For this reason, it is necessary to cause the compensation memory cell array 1006 to be in a resistance state comparable with that of the data memory cell array 1005, by performing at least the forming process on the compensation memory cell array 1006.

From the above, when memory cells that require a forming process similar to that of the data memory cell array 1005 and of which resistance can change are used for the compensation memory cell array 1006, a testing time is increased at a time of testing, and especially a clear problem is caused in the case where a large-capacity memory is created.

In order to solve the problem, it has been examined that forming-less fixed resistance elements (i.e., pseudo memory cells) are used for the variable resistance elements of the memory cells in the compensation memory cell array 1006.

In addition, using the pseudo memory cells (dummy cells) for the memory cells in the compensation memory cell array 1006 produces an effect of eliminating a concern about reliability of the memory cells in the compensation memory cell array 1006, which is caused by concentration of write operations.

Such a pseudo memory cell structure has been conceived, and is described below.

The following describes a structure of a pseudo memory cell including a fixed resistance element.

FIG. 37 is a cross section diagram showing a pseudo memory cell 1038 including a fixed resistance element.

The pseudo memory cell 1038 differs from the memory cell 51 shown in FIG. 2 in not having the second variable resistance layer 12.

In other words, the pseudo memory cell 1038 is a 1-bit memory cell including a fixed resistance element 1037 and a current steering element 29 that are connected in series with each other.

The fixed resistance element 1037 has a structure formed by stacking a lower electrode 14 comprising tantalum nitride (TaN), a tantalum oxide layer 13*a*, and an upper electrode 11 comprising platinum (Pt) in this order.

In such a structure, unlike the memory cell shown in FIG. 2, because the pseudo memory cell 1038 does not have the second variable resistance layer 12 comprising $TaO_y$ having a higher oxygen concentration necessary for resistance change, the resistance change does not occur, and the tantalum oxide layer 13*a* serves as fixed resistance having a predetermined resistance value.

A current steering element 29 is a diode element having nonlinear current-voltage characteristics in both positive and negative directions of an applied voltage, and has a structure formed by, for instance, providing a current steering layer 22 comprising nitrogen-deficient silicon nitride between a lower electrode 23 and an upper electrode 21 that comprise tantalum nitride (TaN) or the like. The bidirectional nonlinear current-voltage characteristics are such characteristics of the current steering element 29 that is in the high resistance (OFF) state in a predetermined voltage range where an applied voltage is a predetermined voltage and that is in the low resistance (ON) state in a range outside the predetermined voltage range. That is, the current steering element 29 is in the high resistance (OFF) state when the applied voltage has an absolute value less than or equal to a predetermined value, and is in the low resistance (ON) state when the applied voltage has an absolute value greater than the predetermined value.

A pseudo memory cell 1038 is a memory cell formed by connecting the fixed resistance element 1037 and the current steering element 29 in series by a via 27. The upper electrode 11 of the fixed resistance element 1037 is connected to an upper wire 70 (corresponding to a word line) by a via 26, and the lower electrode 23 of the current steering element 29 is connected to a lower wire 71 (corresponding to a bit line) by a via 28.

Furthermore, a resistance value of the fixed resistance element 1037 is set to a value between a low resistance value and a high resistance value of the variable resistance element 10, for example.

It is to be noted that, in FIG. 37, the current steering element 29 and the variable resistance element 10 may be vertically reversed with each other.

Moreover, a pseudo memory cell 1038a from which the via 27 is omitted and which is shown in FIG. 38 may be used as the pseudo memory cell having such a fixed resistance element.

FIG. 38 is a cross section diagram showing the pseudo memory cell 1038a included in the compensation memory cell array 1006 of the cross point variable resistance nonvolatile memory device according to this embodiment of the present invention.

The pseudo memory cell 1038a has a structure formed by stacking a first electrode 23 comprising tantalum nitride (TaN), a current steering layer 22 comprising nitrogen-deficient silicon nitride, a second electrode 21 comprising TaN, a tantalum oxide layer 13a, and a third electrode 11 comprising platinum (Pt) in this order. A lower wire 71 made of aluminum (Al) is provided below the pseudo memory cell 1038a, and is connected to the first electrode 23 of the pseudo memory cell 1038a by a first via 28. In contrast, an upper wire 70 made of aluminum (Al) is provided above the pseudo memory cell 1038a, and is connected to the third electrode 11 of the pseudo memory cell 1038a by a third via 26. In addition, the lower wire 71 and the upper wire 70 are arranged so as to be orthogonal to each other.

In this structure, a current steering element 29 includes the first electrode 23, the current steering layer 22, and the second electrode 21, and a fixed resistance element 1037 includes the second electrode 21, the tantalum oxide layer 13a, and the third electrode 11. In other words, a dummy cell included in a compensation memory cell array may include not only a memory cell including (i) a variable resistance element that reversibly changes at least between a first resistance state and a second resistance state when voltages having different polarities are applied thereto and (ii) a bidirectional current steering element having nonlinear current-voltage characteristics and connected in series with the variable resistance element, but also a fixed resistance element and a current steering element connected in series with the fixed resistance element.

FIG. 39 is a circuit diagram showing a connection relationship corresponding to the structure of the fixed resistance element 1037, i.e., an equivalent circuit diagram corresponding to the pseudo memory cells 1038 and 1038a.

Applying such a pseudo memory cell to the memory cells of the compensation memory cell array 1006 makes it possible to provide a cross point variable resistance nonvolatile memory device that successfully reduces a forming time and is expected to increase its reliability.

Embodiment 5

Other Configuration Examples of Specific Peripheral Circuit (Resistanceless Memory Method for Compensation Memory Cell Array)

Examples of a structure of a second pseudo memory cell (dummy cell) for the memory cells in the compensation memory cell array 1006 include a structure having no resistance element. The following describes in detail such a structure of a second pseudo memory cell 751 that is resistanceless, with reference to a cross section diagram of FIG. 40.

In FIG. 40, the pseudo memory cell 751 includes only the current steering element 29.

The current steering element 29 is a diode element having nonlinear current-voltage characteristics in both positive and negative directions of an applied voltage, and is formed by providing a current steering layer 22 comprising nitrogen-deficient silicon nitride between a lower electrode 23 and an upper electrode 21 that comprise tantalum nitride (TaN) or the like.

The pseudo memory cell 751 is a memory cell in which only the current steering element 29 is connected by a via 27. The via 27 is connected to an upper wire 70 (corresponding to a word line) by a via 726, and a lower electrode 23 of the current steering element 29 is connected to a lower wire 71 (corresponding to a bit line) by a via 28.

Moreover, a pseudo memory cell 751a from which the via 27 is omitted and which is shown in FIG. 41 may be used as a pseudo memory cell not having such a resistance element.

FIG. 41 is a cross section diagram showing the pseudo memory cell 715a included in the compensation memory cell array 1006 of the cross point variable resistance nonvolatile memory device according to this embodiment of the present invention.

The pseudo memory cell 751a has a structure formed by stacking a first electrode 23 comprising tantalum nitride (TaN), a current steering layer 22 comprising nitrogen-deficient silicon nitride, and a second electrode 21 comprising TaN in this order. A lower wire 71 made of aluminum (Al) is provided below the pseudo memory cell 751a, and is connected to the first electrode 23 of the pseudo memory cell 751a by a first via 28. In contrast, an upper wire 70 made of aluminum (Al) is provided above the pseudo memory cell 751a, and is connected to the second electrode 21 of the pseudo memory cell 751a by a second via 726. In addition, the lower wire 71 and the upper wire 70 are arranged so as to be orthogonal to each other.

In this structure, the current steering element 29 includes the first electrode 23, the current steering layer 22, and the second electrode 21.

FIG. 42 is a circuit diagram showing a connection relationship corresponding to the structure of the current steering element 29, i.e., an equivalent circuit diagram corresponding to the pseudo memory cells 751 and 751a.

Applying such a pseudo memory cell to the memory cells of the compensation memory cell array 1006 makes it possible to provide a cross point variable resistance nonvolatile memory device that successfully reduces a forming time and is expected to increase its reliability. To put it another way, when placed at a corresponding one of cross points of N (N is an integer) word lines and at least one bit line and including at least a bidirectional current steering element having nonlinear current-voltage characteristics, each of the dummy cells included in the memory cell array included in the cross point variable resistance nonvolatile memory device in the present invention does not necessarily have the resistance element.

With these configuration examples and their operations, a multi-bit simultaneous read memory system is achieved, and it is possible to provide the cross point variable resistance nonvolatile memory device that enables the stable writing in which the leakage current flowing through the unselected memory cells is reduced, and the reduction in test time.

As described above, when performing the write operation, the cross point variable resistance nonvolatile memory device in the present invention reduces the leakage current flowing through the unselected memory cells using the simple operation method in which the simultaneous writing is performed on the selected memory cells connected to the one selected word line, and achieves the writing in which the ratio of the selected memory cell current to the selected bit line supply current is high, that is, the highly efficient writing. Stated differently, the cross point variable resistance nonvolatile memory device in the present invention makes it possible to keep the number of bits written constant using the simple method in which the column selection circuit keeps the number of bits written constant using the compensation memory cell array for the stable writing, and distributes the write operation to the data memory cell array and the compensation memory cell array. In addition, it is possible to minimize the disturbing influence on the unselected memory cells, by performing, using the optimum number of the bits, the multi-bit simultaneous writing on the memory cell array having the rectangular bit shape, and further reduce the chip area by eliminating the unnecessary decode circuit and drive circuit, and the cross point variable resistance nonvolatile memory device that requires no forming and successfully reduces the test time is achieved by using the pseudo memory cells that require no resistance change for the memory cells in the compensation memory cell array.

Moreover, it is possible to provide the nonvolatile memory device that reduces the leakage current flowing through the unselected memory cells and successfully performs more stable reading, by using the simple operation method for performing simultaneous reading on the selected memory cells connected to the one selected word line in the same manner as at the time of writing, thereby achieving the nonvolatile memory device with the stable memory cell write and read characteristics and at low cost.

Although the cross point variable resistance nonvolatile memory device, the method for writing thereby, and the method for reading thereby in the present invention have thus far been described based on Embodiments 1 to 5, the present invention is not limited to such embodiments. Those skilled in the art will readily appreciate that various modifications may be made in each of the embodiments may be realized by arbitrarily combining the structural elements and characteristic parts of the embodiment without materially departing from the novel teachings and advantages of the present invention. Accordingly, all such modifications are included within the scope of the present invention.

For example, although the wire in the row direction of the memory cell array and the wire in the column direction connected to the sense amplifier are referred to as the word line and the bit line, respectively, in the above embodiments, the respective wires may be referred to as a row wire, a column wire, and so on, and the word line and the bit line may be arranged in the column direction and the row direction, respectively. In short, as long as a method is for performing simultaneous writing or reading on memory cells connected to one wire in the row direction or the column direction in the memory cell array, the present invention includes such a method.

INDUSTRIAL APPLICABILITY

The present invention is useful as a cross point variable resistance nonvolatile memory device that reduces a leakage current flowing through unselected memory cells, by using a simple mode in which a column selection circuit distributes a write operation to a data memory cell array and a compensation memory cell array, and achieves more stable reading, such as a nonvolatile memory of a portable electronic device for which low power consumption is required.

REFERENCE SIGNS LIST 1 (Cross point) Memory cell array
10 Variable resistance element
11 Upper electrode (Third electrode)
12 Second variable resistance layer
13 First variable resistance layer
13a Tantalum oxide layer
14 Lower electrode
21 Upper electrode (Second electrode)
22 Current steering layer
23 Lower electrode (First electrode)
24 Word line
25 Bit line
26 to 28 Via
29 Current steering element
30, 126, 260 to 267 Selected memory cell
51, 51a Memory cell
52, 52a to 52b Word line
53, 53a to 53c Bit line
70 Upper wire
71 Lower wire
97 Sense power source
190 First unselected memory cells
191 Second unselected memory cells
192 Third unselected memory cells
193 First unselected memory cell
194 Second unselected memory cell
195 Third unselected memory cell
197, 200 to 20s Write power source
201 Memory functional block
203 Memory cell array (Data cell unit)
204 Block
205 Word line decoder/driver
206 Bit line decoder
207 Data input circuit
208 Data latch circuit
209 Write bit count control circuit
210 Write circuit
210a to 210h Write constant current source
211 Compensation write circuit
212 Sense amplifier (Sense amplifier circuits)
213 Data output circuit
214 Address input circuit
215 Control circuit
216 LR writing power source
216 HR writing power source
218 Write power source
250, 300 to 302 Memory cell array
251 Data cell unit
252 Compensation cell unit
751, 751a, 1038, 1038a Pseudo memory cell
930 to 937 Tenth to seventeenth unselected memory cells
960 to 967 Current detection circuit
1001a to 1001h Divided memory cell array
1002a to 1002h Data memory cell array
1003a to 1003h Compensation memory cell array
1004a to 1004h Selected memory cell
1005 Data memory cell array
1006 Compensation memory cell array
1007 Word line
1008, 1009 Bit line
1010 Bit line pre-charge circuit
1011, 1015 to 1018 CMOS switch 1012 Bit line decoder circuit
1013 N-channel transistor
1014 P-channel transistor
1019 Data/compensation selection and W/R selection switch circuit
1020 Data/compensation selection control circuit
1021 Write register
1023 1D memory access circuit
1024 Control circuit
1025 Write voltage generation circuit
1026 Write/read selection circuit
1027 Write data flag generating circuit
1029, 1030 Switching circuit
1031 Write registers and data/compensation selection circuits
1032 Data/compensation selection and W/R selection switch circuits
1033 Bit line decoders and pre-charge circuits
1035 Memory functional block
1036, 2000 Cross point variable resistance nonvolatile memory device
1037 Fixed resistance element
1500, 1505 First memory cells
1501, 1506 Second memory cells
1502, 1507 Word line write circuit
1503, 1508 First bit line write circuit
1504, 1509 Second bit line write circuit
1510 First selected memory cell
1511 Second selected memory cells

The invention claimed is:

1. A cross point variable resistance nonvolatile memory device comprising
a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M>N) word lines extending in an X direction three-dimensionally crossing the Y direction,
wherein the memory cell array includes first memory cells for data storage, and second memory cells that are connected to one of the N word lines that is connected to the first memory cells,
the cross point variable resistance nonvolatile memory device further comprises:
a word line selection circuit that selects, for the memory cell array, one of the N word lines as a selected word line;
a first bit line selection circuit that selects one of the M bit lines of the first memory cells as a first selected bit line;
a second bit line selection circuit that selects, among the M bit lines, A (A is an integer larger than or equal to 1) bit line or lines connected to the second memory cells connected to the selected word line, as at least one second selected bit line;
a word line write circuit that supplies, to a memory cell selected from among the first memory cells and the second memory cells through the selected word line, (i) a first voltage or a first current, to write to the memory cell by changing the memory cell to the first resistance state, and (ii) a second voltage or a second current, to write to the memory cell by changing the memory cell to the second resistance state;
a first bit line write circuit that supplies, to a memory cell selected from among the first memory cells through the first selected bit line selected by the first bit line selection circuit, (i) a third voltage or a third current, to write to the memory cell by changing the memory cell to the first resistance state, and (ii) a fourth voltage or a fourth current, to write to the memory cell by changing the memory cell to the second resistance state; and
a second bit line write circuit that supplies, to a memory cell selected from among the second memory cells through the at least one second selected bit line selected by the second bit line selection circuit, (i) the third voltage or the third current, to write to the memory cell by changing the memory cell to the first resistance state, and (ii) the fourth voltage or the fourth current, to write to the memory cell by changing the memory cell to the second resistance state,
when the memory cell selected from among the first memory cells is written to by changing the memory cell to the first resistance state, the word line write circuit supplies the first voltage or the first current to the selected word line, the first bit line write circuit supplies the third voltage or the third current to the first selected bit line of the first memory cells, and the second bit line write circuit supplies the third voltage or the third current to the A second selected bit line or lines of the second memory cells,
when the memory cell selected from among the first memory cells is written to by changing the memory cell to the second resistance state, the word line write circuit supplies the second voltage or the second current to the selected word line, the first bit line write circuit supplies the fourth voltage or the fourth current to the first selected bit line of the first memory cells, and the second bit line write circuit supplies the fourth voltage or the fourth current to the A second selected bit lines of the second memory cells, and
when writing to the memory cell array, the cross point variable resistance nonvolatile memory device always simultaneously writes to (1+A) memory cells connected to the same word line.

2. The access point variable resistance nonvolatile memory device according to claim 1,
wherein A is a value determined depending on M and N.

3. The access point variable resistance nonvolatile memory device according to claim 2,
wherein A is equal to M/N−1.

4. The access point variable resistance nonvolatile memory device according to claim 1,
wherein in the memory cell array, the second memory cells selectable by the second bit line selection circuit include a first memory cell for data storage.

5. The access point variable resistance nonvolatile memory device according to claim 1,
wherein in the memory cell array, the second memory cells selectable by the second bit line selection circuit include a second memory cell not for data storage.

6. The access point variable resistance nonvolatile memory device according to claim 1,
wherein the memory cell array includes a first memory cell array including a plurality of first memory cells for data storage, and a second memory cell array including a plurality of second memory cells not for data storage.

7. The access point variable resistance nonvolatile memory device according to claim 1,
wherein in the memory cell array,
when the number of bit lines to be simultaneously selected is B or larger so as to cause a voltage applied to first unselected memory cells to be less than or equal to a predetermined disturbing voltage, the first unselected memory cells being memory cells connected to an unselected word line other than the selected word line and to selected bit lines selected by the first bit line selection circuit and the second bit line selection circuit, and
the number of bit lines to be simultaneously selected is C (C is an integer) or less so as to cause a voltage which is applied to second unselected memory cells to be less than or equal to the predetermined disturbing voltage, the second unselected memory cells being memory cells connected to the selected word line and unselected bit lines other than the selected bit lines,
the number of bit lines (A+1) to be selected by the first bit line selection circuit and the second bit line selection circuit satisfies B≤(A+1)≤C.

8. The access point variable resistance nonvolatile memory device according to claim 1,
wherein the cross point variable resistance nonvolatile memory device simultaneously writes to selected memory cells by changing the selected memory cells to the first resistance state, by the word line write circuit supplying the first voltage to the one selected word line, and the first bit line write circuit and the second bit line write circuit supplying the third voltage to the respective selected bit lines, the selected memory cells being at respective cross points of the selected bit lines and the one selected word line.

9. The access point variable resistance nonvolatile memory device according to claim 1,
wherein the cross point variable resistance nonvolatile memory device simultaneously writes to selected memory cells by changing the selected memory cells to the second resistance state, by the word line write circuit supplying the second voltage to the one selected word line, and the first bit line write circuit and the second bit line write circuit supplying the fourth voltage to the respective selected bit lines, the selected memory cells being at respective cross points of the selected bit lines and the one selected word line.

10. The access point variable resistance nonvolatile memory device according to claim 1,
wherein the cross point variable resistance nonvolatile memory device simultaneously writes to selected memory cells by changing the selected memory cells to the first resistance state, by the word line write circuit supplying the first voltage to the one selected word line, and the first bit line write circuit and the second bit line write circuit supplying the third current to the respective selected bit lines, the selected memory cells being at respective cross points of the selected bit lines and the one selected word line.

11. The access point variable resistance nonvolatile memory device according to claim 1,
wherein the cross point variable resistance nonvolatile memory device simultaneously writes to selected memory cells by changing the selected memory cells to the second resistance state, by the word line write circuit supplying the second voltage to the one selected word line, and the first bit line write circuit and the second bit line write circuit supplying the fourth current to the respective selected bit lines, the selected memory cells being at respective cross points of the selected bit lines and the one selected word line.

12. The cross point variable resistance nonvolatile memory device according to claim 1,
wherein the memory cell array is a multilayer cross point memory cell array including layers stacked in a Z direction orthogonal to the X direction and the Y direction, the layers each including memory cells placed at respective cross points of bit lines and word lines, and
the first bit line selection circuit and the second bit line selection circuit select bit lines belonging to a same layer as selected bit lines, and the word line selection circuit selects, as a selected word line, one word line belonging to a layer adjacent in the Z direction to the layer to which the selected bit lines belong.

13. The cross point variable resistance nonvolatile memory device according to claim 1,
wherein the word line selection circuit puts, among the N word lines, unselected word lines into a high impedance state, and
the first bit line selection circuit and the second bit line selection circuit put unselected bit lines into the high impedance state.

14. A cross point variable resistance nonvolatile memory device comprising
a cross point memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics, the memory cells being placed at respective cross points of M (M is an integer) bit lines extending in a Y direction and N (N is an integer where M >N) word lines extending in an X direction three-dimensionally crossing the Y direction,
wherein the memory cell array includes first memory cells for data storage, and second memory cells that are connected to one of the N word lines that is connected to the first memory cells,
the cross point variable resistance nonvolatile memory device further comprises:
a word line selection circuit that selects, for the memory cell array, one of the N word lines as a selected word line;
a first bit line selection circuit that selects one of the M bit lines of the first memory cells as a first selected bit line;
a second bit line selection circuit that selects, among the M bit lines, A (A is an integer larger than or equal to 1) bit line or lines connected to the second memory cells connected to the selected word line, as at least one second selected bit line;
a word line read voltage generation circuit that supplies a fifth voltage to a memory cell selected from among the first memory cells and the second memory cells through the selected word line, to read stored data from the memory cell;
a first read circuit that supplies a sixth voltage or a sixth current to a memory cell selected from among the first memory cells through the first selected bit line selected by the first bit line selection circuit, to read stored data from the memory cell; and
a second read circuit that supplies the sixth voltage or the sixth current to a memory cell selected from among the second memory cells through the A second selected bit line or lines selected by the second bit line selection circuit, to read stored data from the memory cell, when the memory cell selected from among the first memory cells and the second memory cells is read, the word line read voltage generation circuit supplies the fifth voltage to the selected word line, the first read circuit supplies the sixth voltage or the sixth current to the first selected bit line of the first memory cells, and the second read circuit supplies the sixth voltage or the sixth current to the A second selected bit line or lines of the second memory cells, and when reading from the memory cell array, the cross point variable resistance nonvolatile memory device always simultaneously reads from (1+A) memory cells connected to the same word line.

15. The access point variable resistance nonvolatile memory device according to claim 14,
wherein the first read circuit and the second read circuit simultaneously read from selected memory cells at respective cross points of the one selected word line and the first selected bit line and the at least one second selected bit line, by supplying the sixth voltage to the first selected bit line and the at least one second selected bit line.

16. The access point variable resistance nonvolatile memory device according to claim 14,
wherein the first read circuit and the second read circuit simultaneously read from selected memory cells at respective cross points of the one selected word line and the first selected bit line and the at least one second selected bit line, by supplying the sixth current to the first selected bit line and the at least one second selected bit line.

17. The cross point variable resistance nonvolatile memory device according to claim 14,
wherein the word line selection circuit puts, among the N word lines, unselected word lines into a high impedance state, and
the first bit line selection circuit and the second bit line selection circuit put unselected bit lines into the high impedance state.

18. A method of writing for the cross point variable resistance nonvolatile memory device according to claim 1, the method comprising:
supplying, by the word line write circuit, the first voltage or the first current to the selected word line, supplying, by the first bit line write circuit, the third voltage or the third current to the one bit line of the first memory cells, and supplying, by the second bit line write circuit, the third voltage or the third current to the A bit line or lines of the second memory cells, when a predetermined memory cell among the first memory cells is written to by changing the predetermined memory cell to the first resistance state; and
supplying, by the word line write circuit, the second voltage or the second current to the selected word line, supplying, by the first bit line write circuit, the fourth voltage or the fourth current to the one bit line of the first memory cells, and supplying, by the second bit line write circuit, the fourth voltage or the fourth current to the A bit line or lines of the second memory cells, when a predetermined memory cell among the first memory cells is written to by changing the predetermined memory cell to the second resistance state,
wherein when writing to the memory cell array, the cross point variable resistance nonvolatile memory device always simultaneously writes to (1+A) memory cells connected to the same word line.

19. A method of reading for the cross point variable resistance nonvolatile memory device according to claim 14, the method comprising
supplying, by the word line read voltage generation circuit, the fifth voltage to the selected word line, supplying, by the first read circuit, the sixth voltage or the sixth current to the one bit line of the first memory cells, and supplying, by the second read circuit, the sixth voltage or the sixth current to the A bit line or lines of the second memory cells, when a predetermined memory cell among the first memory cells and the second memory cells is read,
wherein when reading from the memory cell array, the cross point variable resistance nonvolatile memory device always simultaneously reads from (1+A) memory cells connected to the same word line.

20. A cross point variable resistance nonvolatile memory device comprising:
a plurality of divided memory cell arrays each including: a data memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics; and a compensation memory cell array including dummy cells each at least including the bidirectional current steering element having the nonlinear current-voltage characteristics, the memory cells being placed at respective cross points of M (M is an integer) bit lines extending in a Y direction and N (N is an integer) word lines extending in an X direction three-dimensionally crossing the Y direction, and the dummy cells being placed at respective cross points of the N (N is an integer) word lines and at least one bit line extending in the Y direction;
a first bit line selection circuit that selects one of the M bit lines of the data memory cell array included in each of the divided memory cell arrays;
a second bit line selection circuit that selects one of the at least one bit line of the compensation memory cell array included in each of the divided memory cell arrays; and
a write circuit that performs writing on the data memory cell array included in each of the divided memory cell arrays, by changing the data memory cell array to the first resistance state or the second resistance, according to write data of a plurality of bits inputted from the outside,
wherein the write circuit includes:
a write register that outputs a data input signal instructing writing by changing to the first resistance state or writing by changing to the second resistance state, to each of the divided memory cell arrays, according to the write data;
a write data flag generating circuit that generates a write data flag instructing which of the writing by changing to the first resistance state and the writing by changing to the second resistance state is to be simultaneously performed on the divided memory cell arrays; and
a data/compensation selection circuit that performs writing on each of the divided memory cell arrays based on the data input signal and the write data flag, by selecting the first bit line selection circuit or the second bit line selection circuit to operate, the data/compensation selection circuit performs, for each of the divided memory cell arrays:

writing on the data memory cell array of the divided memory cell array by selecting the first bit line selection circuit to operate, when the data input signal for the divided memory cell array instructs the writing by changing to the first resistance state and the write data flag instructs the writing by changing to the first resistance state;

writing on the data memory cell array of the divided memory cell array by selecting the first bit line selection circuit to operate, when the data input signal for the divided memory cell array instructs the writing by changing to the second resistance state and the write data flag instructs the writing by changing to the second resistance state;

writing on the compensation memory cell array of the divided memory cell array by selecting the second bit line selection circuit to operate, when the data input signal for the divided memory cell array instructs the writing by changing to the first resistance state and the write data flag instructs the writing by changing to the second resistance state; and writing on the compensation memory cell array of the divided memory cell array by selecting the second bit line selection circuit to operate, when the data input signal for the divided memory cell array instructs the writing by changing to the second resistance state and the write data flag instructs the writing by changing to the first resistance state, and when writing the write data of the bits, the write circuit always performs simultaneous writing on the divided memory cell arrays.

21. The access point variable resistance nonvolatile memory device according to claim 20, wherein the dummy cells each include the memory cell including (i) the variable resistance element that reversibly changes at least between the first resistance state and the second resistance state when the voltages having the different polarities are applied to the variable resistance element and (ii) the bidirectional current steering element that is connected in series with the variable resistance element and has the nonlinear current-voltage characteristics.

22. The access point variable resistance nonvolatile memory device according to claim 20, wherein the dummy cells each include a fixed resistance element and the current steering element connected in series with the fixed resistance element.

23. The cross point variable resistance nonvolatile memory device according to claim 20, wherein in the data memory cell array included in each of the divided memory cell arrays, M is equal to N.

24. The cross point variable resistance nonvolatile memory device according to claim 20, wherein the write data flag generating circuit generates the write data flag by dividing a basic clock that is inputted from the outside and controls writing.

25. The cross point variable resistance nonvolatile memory device according to claim 20, further comprising a write/read selection circuit that outputs a write signal instructing a write mode or a read mode for the divided memory cell arrays, wherein the write data flag generating circuit starts to generate the write data flag when the write signal instructs the write mode.

26. The access point variable resistance nonvolatile memory device according to claim 25, wherein the write data flag generating circuit stops generating the write data flag when an instruction of the write signal changes from the write mode to the read mode.

27. The cross point variable resistance nonvolatile memory device according to claim 20, wherein when not performing writing on, among the divided memory cell arrays, a predetermined divided memory cell array by changing the predetermined divided memory cell array to the first resistance state and the second resistance state, the write circuit performs writing on the compensation memory cell array included in the predetermined divided memory cell array, by changing the compensation memory cell array to the first resistance state and the second resistance state.

28. The cross point variable resistance nonvolatile memory device according to claim 20, wherein when performing writing on, among the divided memory cell arrays, a predetermined divided memory cell array by changing the predetermined divided memory cell array to the first resistance state and the second resistance state, the write circuit performs writing on the data memory cell array included in the predetermined divided memory cell array, by changing the data memory cell array to the first resistance state and the second resistance state.

29. The cross point variable resistance nonvolatile memory device according to claim 20, wherein the second bit line selection circuit always selects the at least one bit line of the compensation memory cell array.

30. The cross point variable resistance nonvolatile memory device according to claim 20, wherein the write circuit further includes a data/compensation selection control circuit that outputs, to the data/compensation selection circuit, a data memory cell array selection signal instructing to select a data memory cell array, and the data/compensation selection control circuit selects the data memory cell array while the data/compensation selection control circuit is outputting the data memory cell array selection signal.

31. The cross point variable resistance nonvolatile memory device according to claim 20, wherein the write circuit further includes a data/compensation selection control circuit that outputs, to the data/compensation selection circuit, a compensation memory cell array selection signal instructing to select a compensation memory cell array, and the data/compensation selection control circuit selects the compensation memory cell array while the data/compensation selection control circuit is outputting the compensation memory cell array selection signal.

32. The cross point variable resistance nonvolatile memory device according to claim 20, further comprising:

a word line selection circuit that selects, for the divided memory cell arrays, one of the N word lines; and a write voltage generation circuit that supplies, to the divided memory cell arrays through the word line selected by the word line selection circuit, (i) a first voltage or a first current when writing is performed on the divided memory cell arrays by changing the divided memory cell arrays to the first resistance state, and (ii) a second voltage or a second current when writing is performed on the divided memory cell arrays by changing the divided memory cell arrays to the second resistance state is performed, wherein the write voltage generation circuit supplies: the first voltage or the first current to the selected word line through the word line selection circuit when the write data flag instructs the writing by changing to the first resistance state; and the second voltage or the second current to the selected word line through the word line selection circuit when the write data flag instructs the writing by changing to the second resistance state.

33. The cross point variable resistance nonvolatile memory device according to claim 20, further comprising a write voltage generation circuit that supplies a voltage or a current for writing, to the divided memory cell arrays through the first bit line selection circuit and the second bit line selection circuit, wherein the write voltage generation circuit supplies: a third voltage or a third current to the one selected bit line through the first bit line selection circuit and the second bit line selection circuit when the write data flag instructs the writing by changing to the first resistance state; and a fourth voltage or a fourth current to the one selected bit line through the first bit line selection circuit and the second bit line selection circuit when the write data flag instructs the writing by changing to the second resistance state.

34. The cross point variable resistance nonvolatile memory device according to claim 20, wherein the cross point variable resistance nonvolatile memory device writes to all the memory cells of the data memory cell array through a two-staged write operation in which:

to write to all the memory cells of the data memory cell array by changing the memory cells to the first resistance state, the write register sets and outputs a signal instructing the writing by changing to the first resistance state as the data input signal, the write data flag generating circuit sets and outputs a signal instructing the writing by changing to the first resistance state as the write data flag, the data/compensation selection circuit selects the data memory cell array based on the data input signal and the write data flag, and sequentially writes to all the memory cells of the data memory cell array by changing the memory cells to the first resistance state; and subsequently, to write to a predetermined memory cell of the data memory cell array by changing the predetermined memory cell to the second resistance state, the write register sets and outputs, for the predetermined memory cell, a signal instructing the writing by changing to the second resistance state as the data input signal, the write data flag generating circuit sets and outputs a signal instructing the writing by changing to the second resistance state as the data write flag, and the data/compensation selection circuit selects the data memory cell array for the predetermined memory cell, based on the data input signal and the write data flag, and sequentially writes to only the predetermined memory cell of the data memory cell array by changing the predetermined memory cell to change to the second resistance state.

35. The cross point variable resistance nonvolatile memory device according to claim 20, wherein the first bit line selection circuit puts, among the M bit lines, unselected bit lines into a high impedance state, and the second bit line selection circuit puts, among the at least one bit line, unselected bit lines into the high impedance state.

36. A method of writing for a cross point variable resistance nonvolatile memory device, wherein the cross point variable resistance nonvolatile memory device includes:

a plurality of divided memory cell arrays each including: a data memory cell array including memory cells each including (i) a variable resistance element that reversibly changes at least between a first resistance state and a second resistance state when voltages having different polarities are applied to the variable resistance element and (ii) a bidirectional current steering element that is connected in series with the variable resistance element and has nonlinear current-voltage characteristics; and a compensation memory cell array including dummy cells each at least including the bidirectional current steering element having the nonlinear current-voltage characteristics, the memory cells being placed at respective cross points of M (M is an integer) bit lines extending in a Y direction and N (N is an integer) word lines extending in an X direction three-dimensionally crossing the Y direction, and the dummy cells being placed at respective cross points of the N (N is an integer) word lines and at least one bit line extending in the Y direction;

a first bit line selection circuit that selects one of the M bit lines of the data memory cell array included in each of the divided memory cell arrays;

a second bit line selection circuit that selects one of the at least one bit line of the compensation memory cell array included in each of the divided memory cell arrays; and a write circuit that performs writing on the data memory cell array included in each divided memory cell array, by changing the data memory cell array to the first resistance state or the second resistance, according to write data of a plurality of bits inputted from the outside and a data flag instructing which of writing by changing to the first resistance state and writing by changing to the second resistance state is to be simultaneously performed on the divided memory cell arrays, the method comprises:

performing, by the write circuit for the divided memory cell, writing on the data memory cell array of the divided memory cell array by selecting the first bit line selection circuit to operate, when the data input signal for the divided memory cell array instructs the writing by changing to the second resistance state and the write data flag instructs the writing by changing to the first resistance state;

performing, by the write circuit for the divided memory cell, writing on the data memory cell array of the divided memory cell array by selecting the first bit line selection circuit to operate, when the data input signal for the divided memory cell array instructs the writing by changing to the second resistance state and the write data flag instructs the writing by changing to the second resistance state;

performing, by the write circuit for the divided memory cell, writing on the compensation memory cell array of the divided memory cell array by selecting the second bit line selection circuit to operate, when the data input signal for the divided memory cell array instructs the writing by changing to the first resistance state and the write data flag instructs the writing by changing to the second resistance state; and performing, by the write circuit for the divided memory cell, writing on the compensation memory cell array of the divided memory cell array by selecting the second bit line selection circuit to operate, when the data input signal for the divided memory cell array instructs the writing by changing to the second resistance state and the write data flag instructs the writing by changing to the first resistance state, and when writing the write data of the bits, the write circuit always performs simultaneous writing on the divided memory cell arrays.

* * * * *